US 9,384,853 B2

(12) United States Patent
Jang

(10) Patent No.: US 9,384,853 B2
(45) Date of Patent: *Jul. 5, 2016

(54) SHIFT REGISTER

(71) Applicant: LG DISPLAY CO., LTD., Seoul (KR)

(72) Inventor: Yong-Ho Jang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 194 days.

This patent is subject to a terminal disclaimer.

(21) Appl. No.: 14/140,776

(22) Filed: Dec. 26, 2013

(65) Prior Publication Data
US 2014/0241488 A1  Aug. 28, 2014

(30) Foreign Application Priority Data
Feb. 28, 2013  (KR) .................. 10-2013-0022287

(51) Int. Cl.
*G11C 19/00* (2006.01)
*G11C 19/28* (2006.01)
*G09G 3/32* (2016.01)

(52) U.S. Cl.
CPC .............. *G11C 19/28* (2013.01); *G09G 3/3266* (2013.01); *G09G 2310/0286* (2013.01)

(58) Field of Classification Search
None
See application file for complete search history.

(56) References Cited

U.S. PATENT DOCUMENTS

| 6,215,466 B1 | 4/2001 | Yamazaki et al. | |
| 9,159,449 B2 * | 10/2015 | Jang | G11C 19/28 |
| 2006/0210012 A1 * | 9/2006 | Yamaguchi | G11C 19/00 377/64 |
| 2012/0105338 A1 * | 5/2012 | Lin | G11C 19/28 345/173 |
| 2013/0249884 A1 * | 9/2013 | Kim | G09G 3/3677 345/212 |

FOREIGN PATENT DOCUMENTS

| CN | 1072271 A | 5/1993 |
| CN | 1397956 A | 2/2003 |
| CN | 102456330 A | 5/2012 |
| CN | 103915058 A | 7/2014 |
| EP | 1280162 A2 | 1/2003 |
| KR | 10-2012-0044084 A | 5/2012 |

* cited by examiner

*Primary Examiner* — Tuan T Lam
(74) *Attorney, Agent, or Firm* — Dentons US LLP

(57) ABSTRACT

A shift register includes a plurality of stages each outputting k composite pulses each including an A-scan pulse and a B-scan pulse. At least one stage includes an A-sub-stage for controlling a voltage at an A-set node and a voltage at at least one A-reset node in response to an external A-control signal and generating an A-carry pulse based on the voltage at the A-set node. The voltage at the at least one A-reset node and any one A-clock pulse, at least one B-sub-stage for controlling a voltage at a B-set node and a voltage at at least one B-reset node in response to an external B-control signal and generating a B-carry pulse, and a scan output controller for generating k A-scan pulses and k B-scan pulses and outputting one of the A-scan pulses and one of the B-scan pulses corresponding to each other as one composite pulse.

38 Claims, 44 Drawing Sheets

FIG. 31
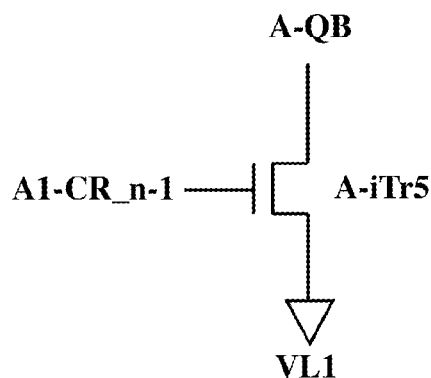
(a)
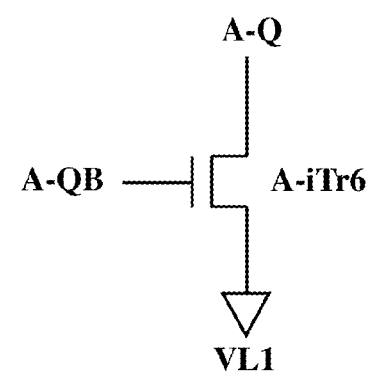
(b)
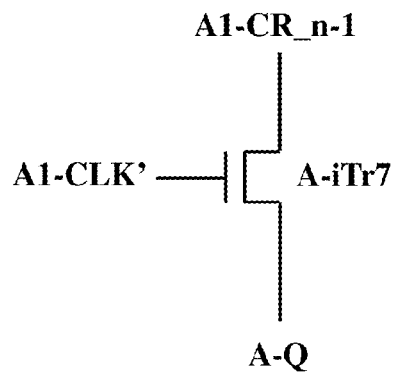
(c)
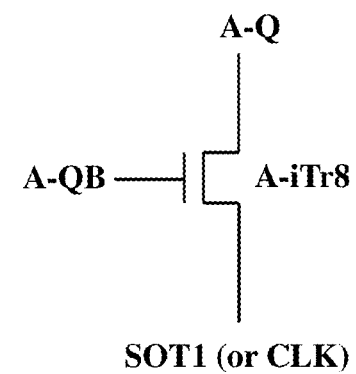
(d)

SHIFT REGISTER

This application claims the benefit of Korean Patent Application No. 10-2013-0022287 filed on Feb. 28, 2013 which is hereby incorporated by reference for all purposes as if fully set forth herein.

BACKGROUND OF THE INVENTION

1. Field of the Invention

The present invention relates to a shift register. More particularly, the present invention relates to a shift register which is capable of stably outputting a scan pulse of a composite waveform in an organic light emitting diode display (OLED) device.

2. Discussion of the Related Art

In an organic light emitting diode display device, there may be deviations among driving currents applied to respective pixels, and a number of transistors are integrated inside of each pixel to prevent such deviations.

This display device includes a shift register for sequentially generating a number of control signals to drive the transistors.

Such a conventional shift register employs a multiplexer structure to output a scan pulse of a composite waveform which consists of two waveforms having different widths and timings.

This structure generates the scan pulse of the composite waveform by switching a fixed, constant voltage externally provided. In this regard, stably outputting the scan pulse may involve increasing the sizes of output transistors which switch the scan pulse, resulting in an increase in the size of the display device.

SUMMARY OF THE INVENTION

Accordingly, the present invention is directed to a shift register that substantially obviates one or more problems due to limitations and disadvantages of the related art.

An object of the present invention is to provide a shift register in which a set node is bootstrapped using clock pulses and a floating structure, so that scan pulses of a plurality of composite waveforms (each including an A-scan pulse and a B-scan pulse) can be stably output even if the clock pulses have relatively low voltages, thereby making it possible to make the sizes of scan output switching devices relatively small.

To achieve these objects and other advantages and in accordance with the purpose of the invention, as embodied and broadly described herein, a shift register includes a plurality of stages, each of the stages outputting k composite pulses (where k is a natural number greater than 1), each of the composite pulses including an A-scan pulse and a B-scan pulse, wherein at least one of the stages includes an A-sub-stage for controlling a voltage at an A-set node and a voltage at at least one A-reset node in response to an external A-control signal and generating an A-carry pulse based on the voltage at the A-set node, the voltage at the at least one A-reset node and any one A-clock pulse, at least one B-sub-stage for controlling a voltage at a B-set node and a voltage at at least one B-reset node in response to an external B-control signal and generating a B-carry pulse based on the voltage at the B-set node, the voltage at the at least one B-reset node and any one BB-clock pulse, and a scan output controller for generating k A-scan pulses based on at least one of the voltage at the A-set node and the A-carry pulse and k A-clock pulses, generating k B-scan pulses based on the B-carry pulse and k B-clock pulses, and outputting one of the A-scan pulses and one of the B-scan pulses corresponding to each other as a corresponding one of the composite pulses.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 31(a)-31(d) illustrate inverting switching devices which may be additionally provided in the A-inverter;

DETAILED DESCRIPTION OF THE ILLUSTRATED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
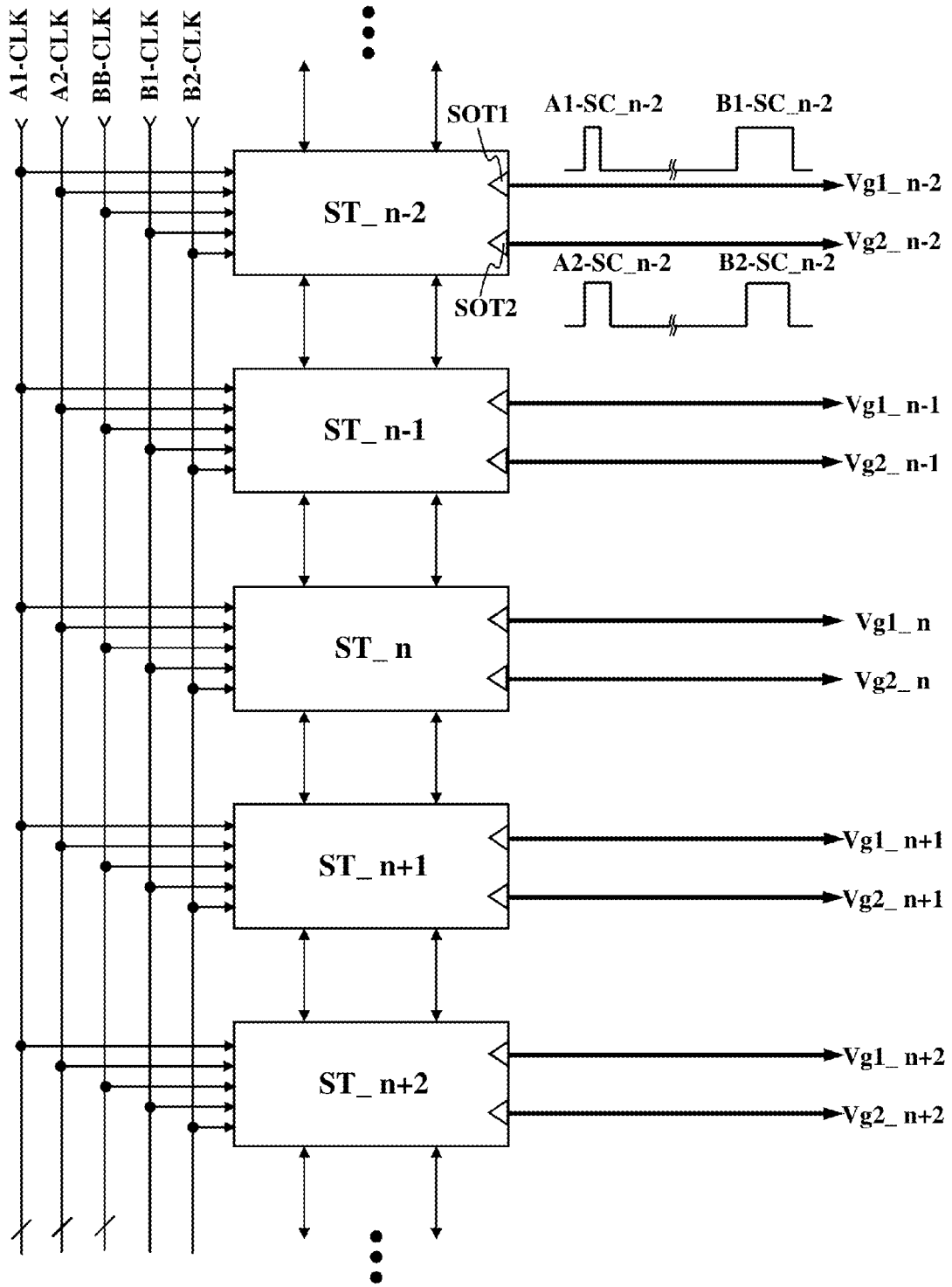
FIG. 1 is a block diagram showing the configuration of a shift register according to an embodiment of the present invention.

FIG. 1 is a block diagram showing the configuration of a shift register according to an embodiment of the present invention.

The shift register according to the present embodiment includes a plurality of stages ST_n-2 to ST_n+2, as shown in FIG. 1.

Each stage ST_n-2 to ST_n+2 outputs first and second composite pulses Vg1_n-2 to Vg1_n+2 and Vg2_n-2 to Vg2_n+2, respectively, through first and second scan output terminals SOT1 and SOT2 thereof. That is, a pair of two composite pulses are output from each stage. On the other hand, although not shown, three or more composite pulses may be output from each stage. In this case, each stage may have three or more scan output terminals.

The first composite pulse and the second composite pulse output from one stage may have the same output timings and the same pulse widths or have different output timings and different pulse widths. As an example, as shown in FIG. 1, an A1-scan pulse included in the first composite pulse output from the (n-2)th stage ST_n-2 and an A2-scan pulse included in the second composite pulse output therefrom have the same output timings, but different pulse widths. Also, a B1-scan pulse included in the first composite pulse output from the (n-2)th stage ST_n-2 and a B2-scan pulse included in the second composite pulse output therefrom have the same output timings, but different pulse widths.

A composite pulse output through a first scan output terminal SOT1 of any one stage is divided into an A1-scan pulse and a B1-scan pulse, which are output at different periods. For example, seeing an A1-scan pulse A1-SC_n-2 and a B1-scan pulse B1-SC_n-2 output through the first scan output terminal SOT1 of the (n-2)th stage ST_n-2, the A1-scan pulse A1-SC_n-2 may be generated once in every frame, and the B1-scan pulse B1-SC_n-2 may be generated once in several frames.

As a detailed example, assume that a total number of gate lines of a panel to be driven is twenty, a shift register for driving of the twenty gate lines includes a total of ten stages, the (n-2)th stage ST_n-2 is a first one of the ten stages which drives first and second ones of the twenty gate lines, a time for which one gate line is driven is one horizontal period, and a time for which ten odd-numbered ones of the twenty gate lines are all driven once is one frame period.

On this assumption, the first stage outputs an A1-scan pulse in a first horizontal period of each of first to tenth frame periods to drive the first gate line in the first horizontal period of each frame period. Further, the first stage outputs a B1-scan pulse immediately after a tenth horizontal period of the first frame period. That is, the B1-scan pulse may be generated at any time in a period between the end of generation of a last A1-scan pulse in the current frame period and the start of the next frame period.

Here, the B1-scan pulse is again output through the first stage in an eleventh frame period. That is, under the above condition, the first stage outputs an A1-scan pulse once in every frame period and a B1-scan pulse once in ten frame periods. In the same manner, each of the other stages outputs an A1-scan pulse in a corresponding horizontal period of every frame period and a B1-scan pulse in an end period of a corresponding frame period (a period subsequent to a last horizontal period in each frame period). As stated above, the "period subsequent to the last horizontal period" signifies any specific period belonging to the period between the end of the generation of the last A1-scan pulse in the current frame period and the start of the next frame period.

Also, a composite pulse output through a second scan output terminal SOT2 of any one stage is divided into an A2-scan pulse and a B2-scan pulse, which are output at different periods. For example, seeing an A2-scan pulse A2-SC_n-2 and a B2-scan pulse B2-SC_n-2 output through the second scan output terminal SOT2 of the (n-2)th stage ST_n-2, the A2-scan pulse A2-SC_n-2 may be generated once in every frame, and the B2-scan pulse B2-SC_n−2 may be generated once in several frames.

As a detailed example, assume that a total number of gate lines of a panel to be driven is twenty, a shift register for driving of the twenty gate lines includes a total of ten stages, the (n−2)th stage ST_n−2 is a first one of the ten stages which drives first and second ones of the twenty gate lines, a time for which one gate line is driven is one horizontal period, and a time for which ten even-numbered ones of the twenty gate lines are all driven once is one frame period.

On this assumption, the first stage outputs an A2-scan pulse in a first horizontal period of each of first to tenth frame periods to drive the second gate line in the first horizontal period of each frame period. Further, the first stage outputs a B2-scan pulse immediately after a tenth horizontal period of the first frame period. That is, the B2-scan pulse may be generated at any time in a period between the end of generation of a last A2-scan pulse in the current frame period and the start of the next frame period.

Here, the B2-scan pulse is again output through the first stage in an eleventh frame period. That is, under the above condition, the first stage outputs an A2-scan pulse once in every frame period and a B2-scan pulse once in ten frame periods. In the same manner, each of the other stages outputs an A2-scan pulse in a corresponding horizontal period of every frame period and a B2-scan pulse in an end period of a corresponding frame period (a period subsequent to a last horizontal period in each frame period). As stated above, the "period subsequent to the last horizontal period" signifies any specific period belonging to the period between the end of the generation of the last A2-scan pulse in the current frame period and the start of the next frame period.

In order to generate the above A#-scan pulse and B#-scan pulse (where # is 1 or 2), each stage ST_n−2 to ST_n+2 is supplied with any one of a plurality of A1-clock pulses A1-CLK having different phases, any one of a plurality of A2-clock pulses A2-CLK having different phases, any one of a plurality of BB-clock pulses BB-CLK having different phases, and a B1-clock pulse B1-CLK and a B2-clock pulse B2-CLK having different phases.

That is, each stage ST_n−2 to ST_n+2 generates an A1-scan pulse A1-SC_i (where i is a natural number) based on an A1-clock pulse A1-CLK supplied thereto, an A2-scan pulse A2-SC_i based on an A2-clock pulse A2-CLK supplied thereto, a B1-scan pulse B1-SC_i based on a BB-clock pulse BB-CLK and a B1-clock pulse B1-CLK supplied thereto, and a B2-scan pulse B2-SC_i based on a BB-clock pulse BB-CLK and a B2-clock pulse B2-CLK supplied thereto.

On the other hand, the BB-clock pulses BB-CLK may be one in number, not plural in number. That is, only a BB-clock pulse BB-CLK of one phase may be used. Similarly, each of the B1-clock pulse B1-CLK and B2-clock pulse B2-CLK may be of one phase.

In this manner, each stage ST_n−2 to ST_n+2 drives an odd-numbered gate line connected thereto using a first composite pulse Vg1_n−2 to Vg1_n+2 including an A1-scan pulse and a B1-scan pulse and drives an even-numbered gate line connected thereto using a second composite pulse Vg2_n−2 to Vg2_n+2 including an A2-scan pulse and a B2-scan pulse.

Hereinafter, the configuration of each stage will be described in detail with reference to FIG. 2.

Figure 2:
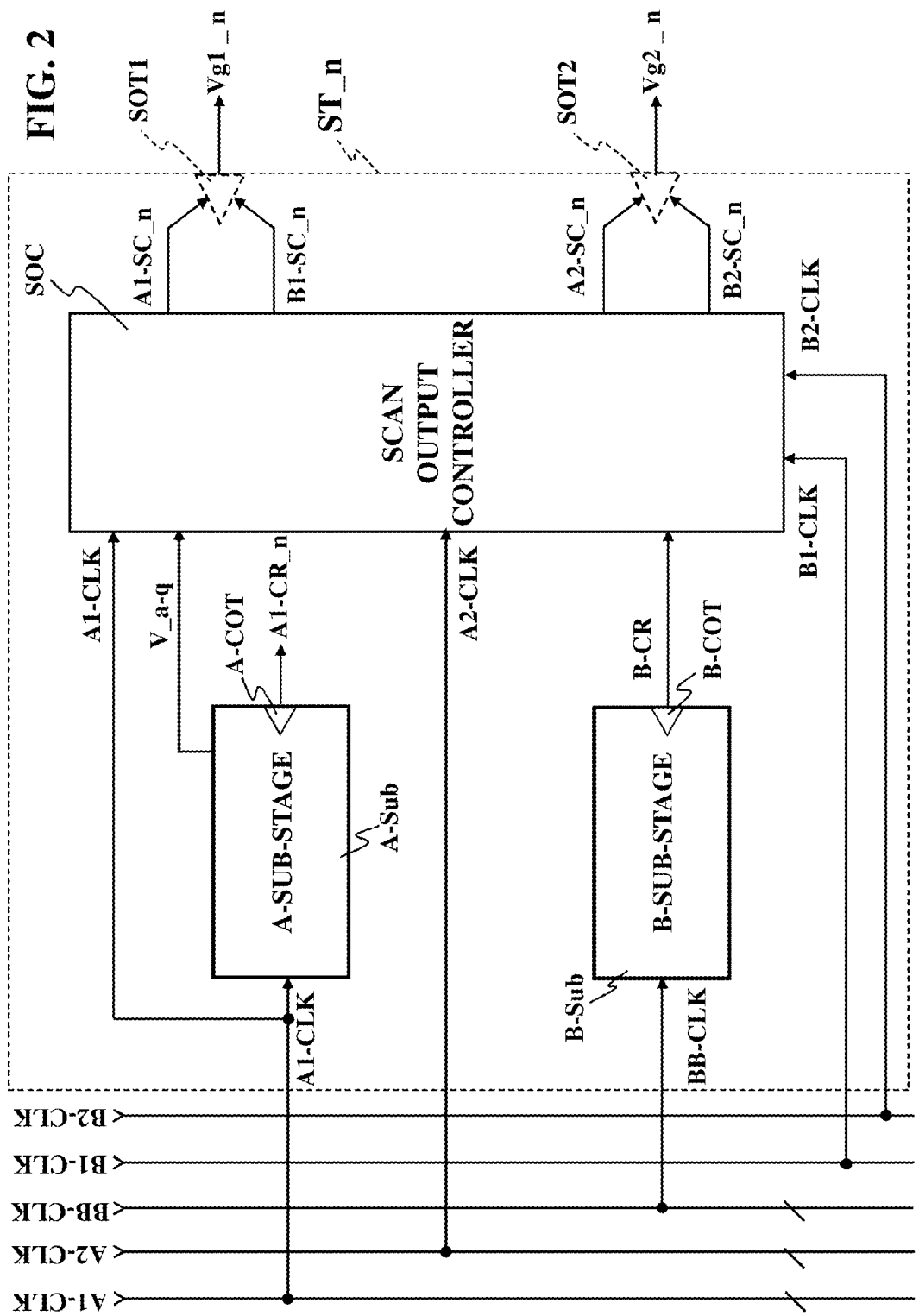
FIG. 2 is a detailed block diagram of any one stage in FIG. 1.

FIG. 2 is a detailed block diagram of any one stage in FIG. 1.

The stage (for example, the nth stage ST_n) includes an A-sub-stage A-Sub, a B-sub-stage B-Sub, and a scan output controller SOC, as shown in FIG. 2.

The A-sub-stage A-Sub controls a voltage V_a-q at an A-set node and a voltage at at least one A-reset node in response to an external A-control signal. The A-sub-stage A-Sub also generates an A1-carry pulse A1-CR_n based on the voltage V_a-q at the A-set node, the voltage at the at least one A-reset node and any one A1-clock pulse A1-CLK.

The B-sub-stage B-Sub controls a voltage at a B-set node and a voltage at at least one B-reset node in response to an external B-control signal. The B-sub-stage B-Sub also generates a B-carry pulse B-CR based on the voltage at the B-set node, the voltage at the at least one B-reset node and any one BB-clock pulse BB-CLK.

The scan output controller SOC generates k A-scan pulses based on at least one of the voltage V_a-q at the A-set node and an A-carry pulse and k A-clock pulses, generates k B-scan pulses based on a B-carry pulse and k B-clock pulses, and outputs one of the A-scan pulses and one of the B-scan pulses corresponding to each other as one composite pulse. For example, the scan output controller SOC may generate two A-scan pulses A1-SC_n and A2-SC_n based on the voltage V_a-q at the A-set node, the A1-carry pulse A1-CR_n, the A1-clock pulse A1-CLK and the A2-clock pulse A2-CLK, and two B-scan pulses B1-SC_n and B2-SC_n based on the B-carry pulse B-CR, the B1-clock pulse B1-CLK and the B2-clock pulse B2-CLK, as shown in FIG. 2.

Here, the A-control signal and B-control signal supplied to each stage ST_n−2 to ST_n+2 may be signals as will hereinafter be described in detail with reference to FIG. 3.

Figure 3:
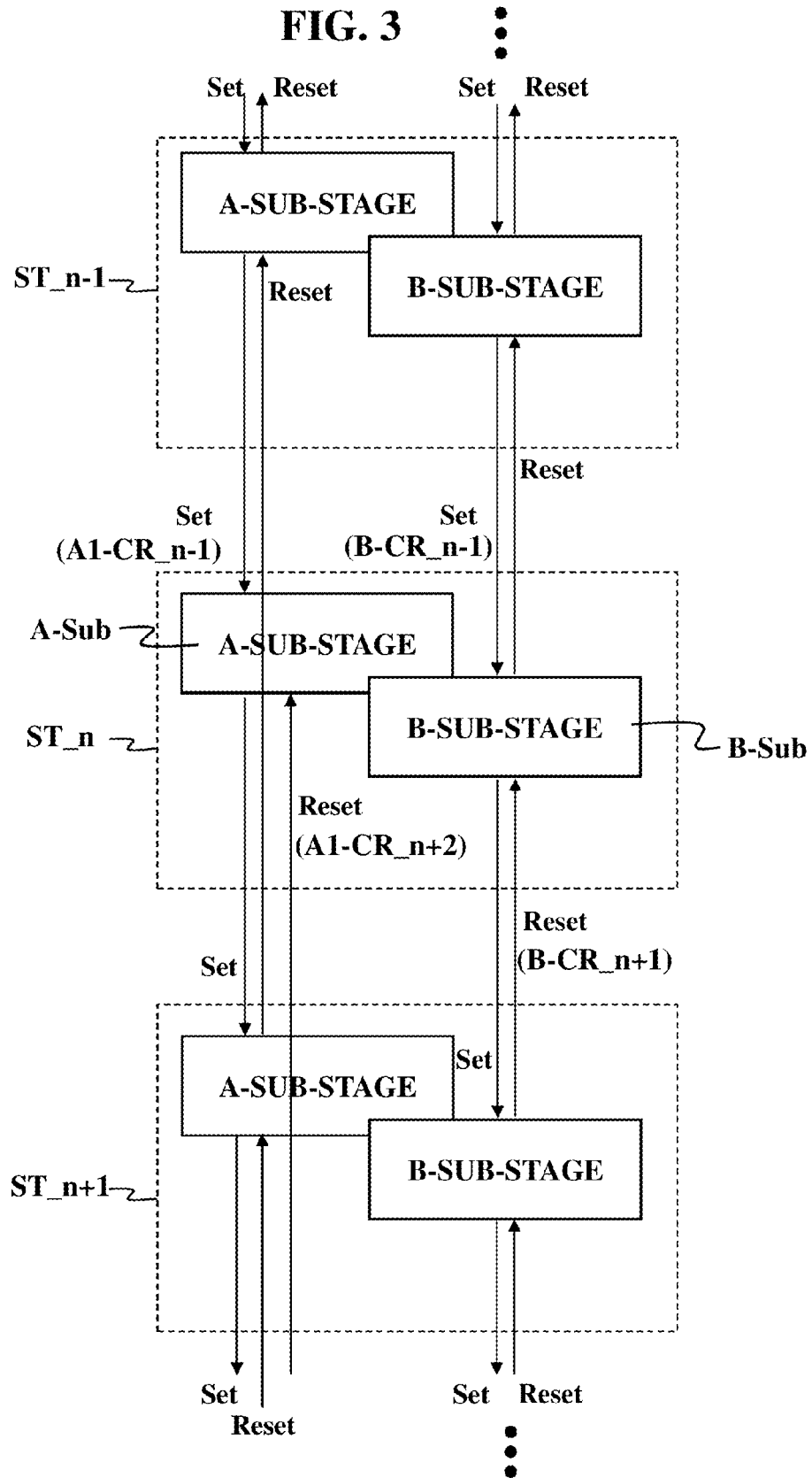
FIG. 3 is a block diagram illustrating an example of use of outputs from each stage in FIG. 1 as an A-control signal and a B-control signal.

FIG. 3 is a block diagram illustrating an example of use of outputs from each stage in FIG. 1 as an A-control signal and a B-control signal. Although not shown in FIG. 3, each stage of FIG. 3 includes the above scan output controller SOC therein.

The A-control signal may be divided into an A-set control signal and an A-reset control signal. The A-set control signal is required to set the A-sub-stage A-Sub of a corresponding stage supplied with the A-set control signal, and the A-reset control signal is required to reset the A-sub-stage A-Sub of a corresponding stage supplied with the A-reset control signal.

The A-set control signal may be an output from any one of stages upstream of the current stage supplied with the A-set control signal. That is, the A-sub-stage A-Sub of the nth stage ST_n (where n is a natural number) may receive, as the above A-set control signal, an A1-carry pulse output from the A-sub-stage A-Sub of an (n−p)th stage (where p is a natural number less than n). For example, the A-sub-stage A-Sub of the nth stage ST_n may receive, as the above A-set control signal, an A1-carry pulse A1-CR_n−1 output from the A-sub-stage A-Sub of the (n−1)th stage ST_n−1, as shown in FIG. 3. Here, the upstream stages signify stages that operate earlier than the current stage.

In contrast, the A-reset control signal may be an output from any one of stages downstream of the current stage supplied with the A-reset control signal. That is, the A-sub-stage A-Sub of the nth stage ST_n may receive, as the above A-reset control signal, an A1-carry pulse output from the A-sub-stage A-Sub of an (n+q)th stage (where q is an arbitrary natural number or a natural number equal to p). For example, the A-sub-stage A-Sub of the nth stage ST_n may receive, as the above A-reset control signal, an A1-carry pulse A1-CR_n+2 output from the A-sub-stage A-Sub of the (n+2)th stage ST_n+2, as shown in FIG. 3. Here, the downstream stages signify stages that operate later than the current stage.

Similarly, the B-control signal may be divided into a B-set control signal and a B-reset control signal. The B-set control signal is required to set the B-sub-stage B-Sub of a corresponding stage supplied with the B-set control signal, and the B-reset control signal is required to reset the B-sub-stage B-Sub of a corresponding stage supplied with the B-reset control signal.

The B-set control signal may be an output from any one of stages upstream of the current stage supplied with the B-set control signal. That is, the B-sub-stage B-Sub of the nth stage ST_n (where n is a natural number) may receive, as the above B-set control signal, a B-carry pulse output from the B-sub-stage B-Sub of an (n−r)th stage (where r is a natural number less than n or equal to p). For example, the B-sub-stage B-Sub of the nth stage ST_n may receive, as the above B-set control signal, a B-carry pulse B-CR_n−1 output from the B-sub-stage B-Sub of the (n−1)th stage ST_n−1, as shown in FIG. 3.

In contrast, the B-reset control signal may be an output from any one of stages downstream of the current stage supplied with the B-reset control signal. That is, the B-sub-stage B-Sub of the nth stage ST_n may receive, as the above B-reset control signal, a B-carry pulse output from the B-sub-stage B-Sub of an (n+s)th stage (where s is an arbitrary natural number or a natural number equal to r). For example, the B-sub-stage B-Sub of the nth stage ST_n may receive, as the above B-reset control signal, a B-carry pulse B-CR_n+1 output from the B-sub-stage B-Sub of the (n+1)th stage ST_n+1, as shown in FIG. 3.

In this manner, the A-sub-stages A-Sub are interconnected to constitute one shift register that sequentially outputs A1-carry pulses A1-CR_i, and the B-sub-stages B-Sub are interconnected to constitute another shift register that sequentially outputs B-carry pulses B-CR_i. On the other hand, the above A1-carry pulse is generated by the A1-clock pulse A1-CLK. In the case where each A-sub-stage is supplied with the A2-clock pulse A2-CLK instead of the A1-clock pulse A1-CLK, it outputs an A2-carry pulse instead of the A1-carry pulse. In this case, each of the above A-set control signal and A-reset control signal is the A2-carry pulse.

Figure 4:
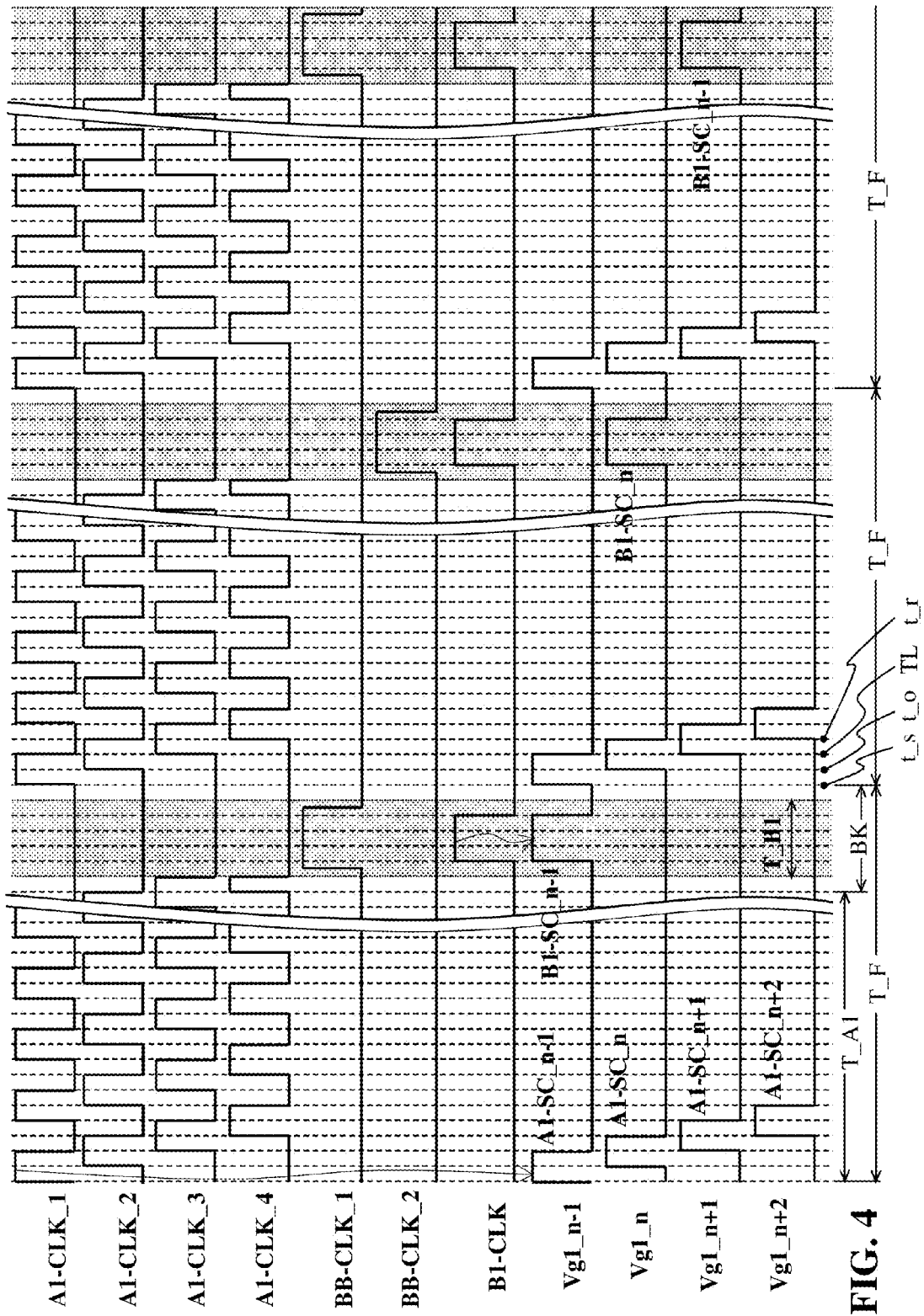
FIG. 4 is a timing diagram illustrating an example of an A1-clock pulse, a BB-clock pulse and a B1-clock pulse, and A1-scan pulses generated thereby.

FIG. 4 is a timing diagram illustrating an example of an A1-clock pulse A1-CLK, a BB-clock pulse BB-CLK and a B1-clock pulse B1-CLK, and A1-scan pulses generated thereby.

As shown in FIG. 4, the A1-clock pulse A1-CLK may be composed of clock pulses A1-CLK_1 to A1-CLK_4 of four phases, the BB-clock pulse BB-CLK may be composed of clock pulses BB-CLK_1 and BB-CLK_2 of two phases, and the B1-clock pulse B1-CLK may be composed of a clock pulse B1-CLK of one phase.

The A1-clock pulse A1-CLK may include first to fourth A1-clock pulses A1-CLK_1 to A1-CLK_4 having different phases and the same pulse widths. Here, the pulse widths of adjacent ones of the first to fourth A1-clock pulses A1-CLK_1 to A1-CLK_4 may partially overlap each other. FIG. 4 shows an example in which the respective pulse widths of the adjacent A1-clock pulses A1-CLK overlap each other by ½. It should be noted that this is but one example and the overlap size is changeable to any value. Alternatively, the A1-clock pulses A1-CLK may be output without overlap in their pulse widths.

When the A1-clock pulses A1-CLK_1 to A1-CLK_4 are output without overlap in their pulse widths, an A1-carry pulse from the A-sub-stage A-Sub of the (n+1)th stage ST_n+1, not the above (n+2)th stage ST_n+2, may be used to reset the A-sub-stage A-Sub of the nth stage ST_n.

The A1-clock pulse A1-CLK is used as an A1-scan pulse A1-SC and an A1-carry pulse A1-CR. For example, when the A1-clock pulses A1-CLK_1 to A1-CLK_4 of four phases are used as shown in FIG. 4, a (4x+1)th stage (where x is a natural number including 0) may receive the first A1-clock pulse A1-CLK_1 and output a (4x+1)th A1-scan pulse and a (4x+1)th A1-carry pulse, a (4x+2)th stage may receive the second A1-clock pulse A1-CLK_2 and output a (4x+2)th A1-scan pulse and a (4x+2)th A1-carry pulse, a (4x+3)th stage may receive the third A1-clock pulse A1-CLK_3 and output a (4x+3)th A1-scan pulse and a (4x+3)th A1-carry pulse, and a (4x+4)th stage may receive the fourth A1-clock pulse A1-CLK_4 and output a (4x+4)th A1-scan pulse and a (4x+4)th A1-carry pulse.

The BB-clock pulse BB-CLK may include first and second BB-clock pulses BB-CLK_1 and BB-CLK_2 having different phases.

Each of the first and second BB-clock pulses BB-CLK_1 and BB-CLK_2 controls output timing of a B-scan pulse B-SC and is used as a B-carry pulse B-CR. For example, when the BB-clock pulses BB-CLK_1 and BB-CLK_2 of two phases are used as shown in FIG. 4, the B-sub-stage B-Sub of an odd-numbered stage may receive the first BB-clock pulse BB-CLK_1 and determine output timings of a B-carry pulse B-CR and a B-scan pulse B-SC based on the first BB-clock pulse BB-CLK_1, and the B-sub-stage B-Sub of an even-numbered stage may receive the second BB-clock pulse BB-CLK_2 and determine output timings of a B-carry pulse B-CR and a B-scan pulse B-SC based on the second BB-clock pulse BB-CLK_2.

In addition, the B-sub-stage B-Sub of the odd-numbered stage may receive the first BB-clock pulse BB-CLK_1 and output an odd-numbered B-carry pulse B-CR, and the B-sub-stage B-Sub of the even-numbered stage may receive the second BB-clock pulse BB-CLK_2 and output an even-numbered B-carry pulse B-CR.

Each of the first and second BB-clock pulses BB-CLK_1 and BB-CLK_2 is output in an end period of a corresponding frame period (a period subsequent to a last horizontal period in each frame period, which will hereinafter be referred to as a B1-output period T_B1), as stated previously. In this regard, the B-carry pulse B-CR and the B-scan pulse B-SC are also output in every B1-output period T_B1. Here, the first BB-clock pulse BB-CLK_1 may be output in every odd-numbered frame period, and the second BB-clock pulse BB-CLK_2 may be output in every even-numbered frame period.

On the other hand, FIG. 4 shows three frame periods, each of which includes, at the end thereof, a blank period BK in which various signals necessary for the next frame period are set. Exceptionally, a data signal required for display of an image is not included in the various signals. That is, this data signal is not generated in the blank period BK.

The above B1-output period T_B1 is included in the blank period BK. That is, the BB-clock pulses BB-CLK_1 and BB-CLK_2, the B-carry pulse B-CR and the B-scan pulse B-SC are generated in the blank period BK.

The B1-clock pulse B1-CLK is used as a B1-scan pulse B1-SC. This B1-clock pulse B1-CLK is output synchronously with the first and second BB-clock pulses BB-CLK_1 and BB-CLK_2. In other words, the B1-clock pulse B1-CLK is output in the B1-output period T_B1 of every frame period, too. Exceptionally, the B1-clock pulse B1-CLK has a narrower pulse width than that of the BB-clock pulse BB-CLK such that it is completely surrounded by the BB-clock pulse BB-CLK. That is, as shown in FIG. 4, the BB-clock pulse BB-CLK_1 or BB-CLK_2 has a rising edge which is ahead of that of the B1-clock pulse B1-CLK and a falling edge which is behind that of the B1-clock pulse B1-CLK. As a result, the B1-clock pulse B1-CLK can be securely kept high while the BB-clock pulse BB-CLK_1 or BB-CLK_2 is kept high.

On the other hand, the pulse width of the B1-clock pulse B1-CLK may be equal to that of the BB-clock pulse BB-CLK. In this case, the rising edges of the respective clock pulses may coincide with each other and the falling edges thereof may coincide with each other.

Alternatively, the B1-clock pulse B1-CLK may be of two or more phases, not the single phase. For example, the B1-clock pulse B1-CLK may also be of two phases like the BB-clock pulse BB-CLK. As a detailed example, the first B1-clock pulse may be set to be synchronized with the first BB-clock pulse BB-CLK_1, and the second B1-clock pulse may be set to be synchronized with the second BB-clock pulse BB-CLK_2. In this case, the pulse width of the B1-clock pulse B1-CLK must be smaller than or equal to that of the BB-clock pulse BB-CLK_1 or BB-CLK_2. Also, the timing between the B1-clock pulse B1-CLK and the BB-clock pulse BB-CLK conforms to the above conditions.

On the other hand, each of the A1-clock pulses A1-CLK_1 to A1-CLK_4 has a pulse width smaller than that of each of the BB-clock pulses BB-CLK_1 and BB-CLK_2 and B1-clock pulse B1-CLK.

A1-scan pulses A1-SC_n−1 to A1-SC_n+2 are generated based on the A1-clock pulses A1-CLK_1 to A1-CLK_4. Accordingly, the pulse widths of adjacent ones of the A1-scan pulses A1-SC_n−1 to A1-SC_n+2 partially overlap each other, as shown in FIG. 4. The A1-scan pulses A1-SC_n−1 to A1-SC_n+2 are sequentially output once for one frame period.

B1-scan pulses B1-SC_n−1 to B1-SC_n+1 are generated based on the B1-clock pulse B1-CLK. Accordingly, each of the B1-scan pulses B1-SC_n−1 to B1-SC_n+1 has the same shape as that of the B1-clock pulse B1-CLK and is output with the same timing as that of the B1-clock pulse B1-CLK, as shown in FIG. 4. Each of the B1-scan pulses B1-SC_n−1 to B1-SC_n+1 is output once in one frame period. In this regard, the B1-scan pulses B1-SC_n−1 to B1-SC_n+1 are changed in output position on a frame period basis. For example, as shown in FIG. 4, the B1-scan pulse B1-SC_n−1 may be output from the (n−1)th stage in the leftmost, first frame period, the B1-scan pulse B1-SC_n may be output from the nth stage in the second frame period positioned at the right-hand side of the first frame period, and the B1-scan pulse B1-SC_n+1 may be output from the (n+1)th stage in the third frame period positioned at the right-hand side of the second frame period.

Because the B1-scan pulses B1-SC_n−1 to B1-SC_n+1 are changed in output position on a frame period basis in this manner, the distance between an A1-scan pulse A1-SC and a B1-scan pulse B1-SC output as one composite pulse (first composite pulse) to the same gate line in one frame period is gradually reduced as shown in FIG. 4.

On the other hand, when a period of one frame period T_F in which the first to fourth A1-clock pulses A1-CLK_1 to A1-CLK_4 are output is defined as an A1-output period T_A1 and the remaining period of the one frame period T_F is defined as the B1-output period T_B1 as stated previously, all of the first to fourth A1-clock pulses A1-CLK_1 to A1-CLK_4 may be kept low in the B1-output period T_B1 of the one frame period T_F, as shown in FIG. 4. Alternatively, in this B1-output period T_B1, the first to fourth A1-clock pulses A1-CLK_1 to A1-CLK_4 may be output in the same manner as in the A1-output period T_A1.

Figure 5:
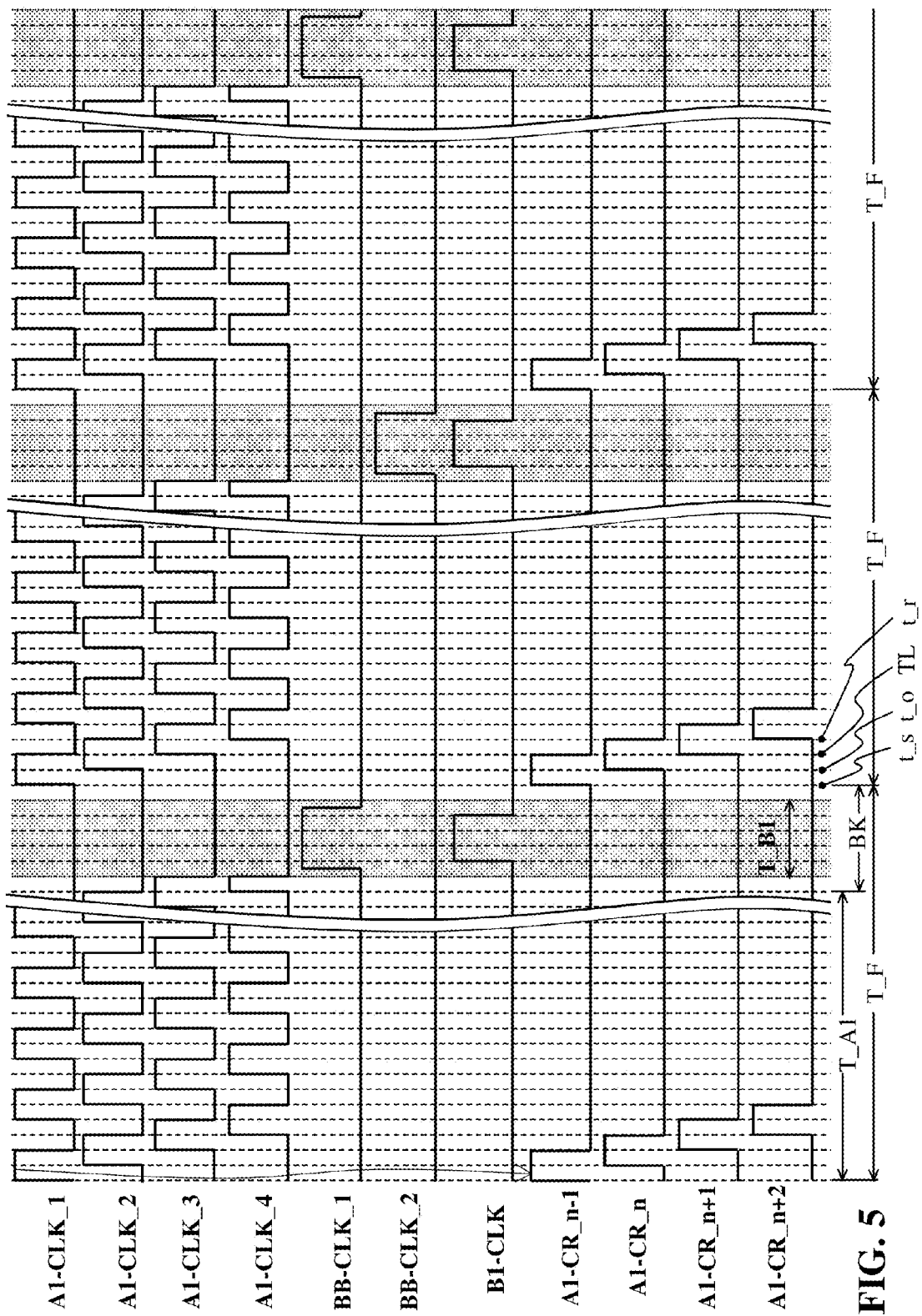
FIG. 5 is a timing diagram illustrating an example of the A1-clock pulse, BB-clock pulse and B1-clock pulse, and A1-carry pulses generated thereby.

FIG. 5 is a timing diagram illustrating an example of the A1-clock pulse A1-CLK, BB-clock pulse BB-CLK and B1-clock pulse B1-CLK, and A1-carry pulses generated thereby.

A1-carry pulses A1-CR_n−1 to A1-CR_n+2 are generated based on the A1-clock pulses A1-CLK_1 to A1-CLK_4. Accordingly, the pulse widths of adjacent ones of the A1-carry pulses A1-CR_n−1 to A1-CR_n+2 partially overlap each other, as shown in FIG. 5. The A1-carry pulses A1-CR_n−1 to A1-CR_n+2 are sequentially output once for one frame period. Here, the A1-carry pulses A1-CR_n−1 to A1-CR_n+2 are substantially the same as the A1-scan pulses A1-SC_n−1 to A1-SC_n+2.

Figure 6:
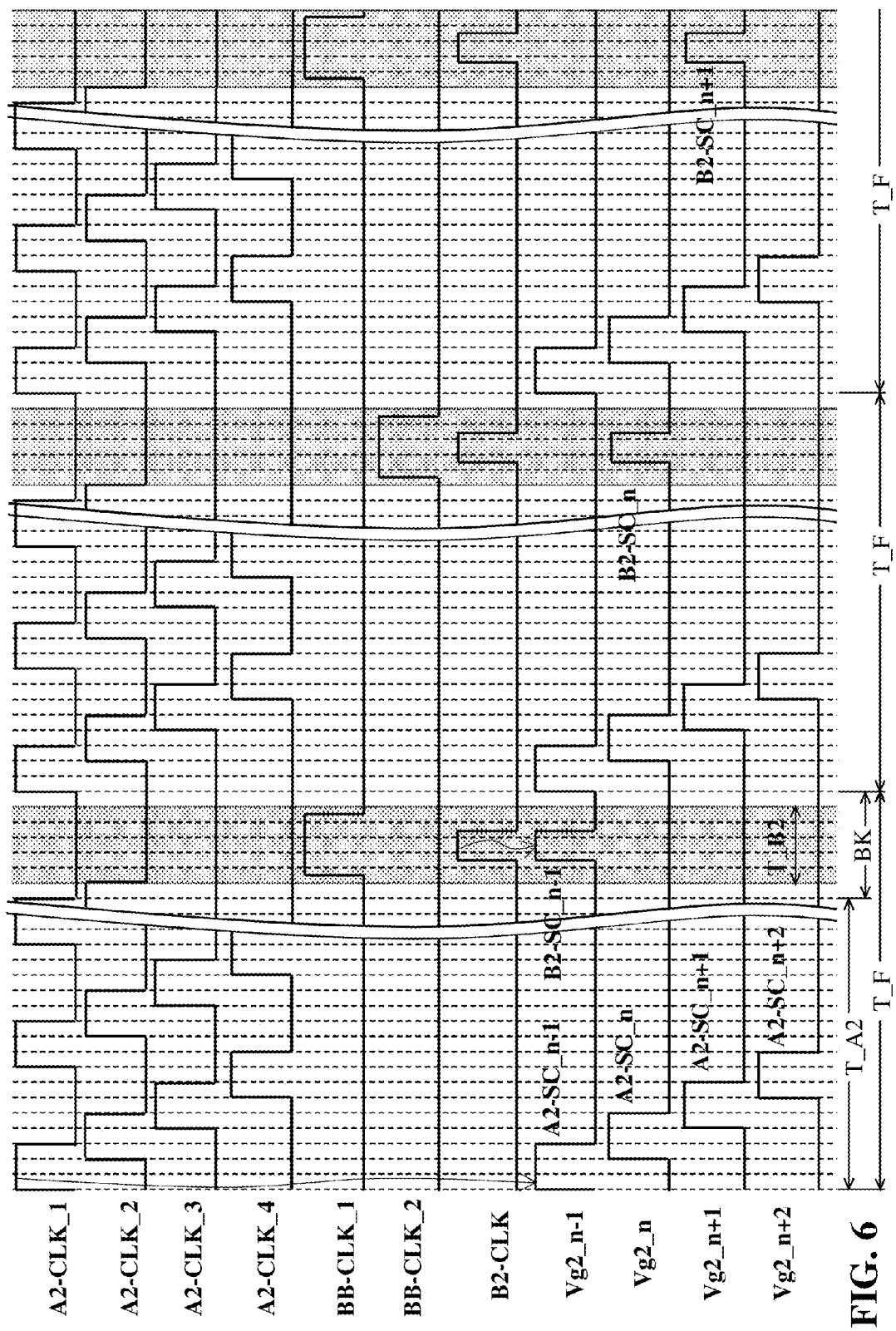
FIG. 6 is a timing diagram illustrating an example of an A2-clock pulse, a BB-clock pulse and a B2-clock pulse, and A2-scan pulses generated thereby.

FIG. 6 is a timing diagram illustrating an example of an A2-clock pulse A2-CLK, a BB-clock pulse BB-CLK and a B2-clock pulse B2-CLK, and A2-scan pulses generated thereby.

As shown in FIG. 6, the A2-clock pulse A2-CLK may be composed of clock pulses A2-CLK_1 to A2-CLK_4 of four phases, the BB-clock pulse BB-CLK may be composed of clock pulses BB-CLK_1 and BB-CLK_2 of two phases, and the B2-clock pulse B2-CLK may be composed of a clock pulse B2-CLK of one phase.

The A2-clock pulse A2-CLK may include first to fourth A2-clock pulses A2-CLK_1 to A2-CLK_4 having different phases and the same pulse widths. Here, the pulse widths of adjacent ones of the first to fourth A2-clock pulses A2-CLK_1 to A2-CLK_4 may partially overlap each other. FIG. 6 shows an example in which the respective pulse widths of the adjacent A2-clock pulses A2-CLK overlap each other by ½. It should be noted that this is but one example and the overlap size is changeable to any value. Alternatively, the A2-clock pulses A2-CLK may be output without overlap in their pulse widths.

When the A2-clock pulses A2-CLK_1 to A2-CLK_4 are output without overlap in their pulse widths, an A2-carry pulse from the A-sub-stage A-Sub of the (n+1)th stage ST_n+1, not the above (n+2)th stage ST_n+2, may be used to reset the A-sub-stage A-Sub of the nth stage ST_n.

The A2-clock pulse A2-CLK is used as an A2-scan pulse A2-SC and an A2-carry pulse A2-CR. For example, when the A2-clock pulses A2-CLK_1 to A2-CLK_4 of four phases are used as shown in FIG. 6, a (4x+1)th stage may receive the first A2-clock pulse A2-CLK_1 and output a (4x+1)th A2-scan pulse and a (4x+1)th A2-carry pulse, a (4x+2)th stage may receive the second A2-clock pulse A2-CLK_2 and output a (4x+2)th A2-scan pulse and a (4x+2)th A2-carry pulse, a (4x+3)th stage may receive the third A2-clock pulse A2-CLK_3 and output a (4x+3)th A2-scan pulse and a (4x+3)th A2-carry pulse, and a (4x+4)th stage may receive the fourth A2-clock pulse A2-CLK_4 and output a (4x+4)th A2-scan pulse and a (4x+4)th A2-carry pulse.

The BB-clock pulse BB-CLK is the same as that in FIG. 4, stated above, and a description thereof will thus be omitted.

The B2-clock pulse B2-CLK is used as a B2-scan pulse B2-SC. This B2-clock pulse B2-CLK is output synchronously with the first and second BB-clock pulses BB-CLK_1 and BB-CLK_2. In other words, the B2-clock pulse B2-CLK is output in a B2-output period T_B2 of every frame period, too. Exceptionally, the B2-clock pulse B2-CLK has a narrower pulse width than that of the BB-clock pulse BB-CLK such that it is completely surrounded by the BB-clock pulse BB-CLK. On the other hand, the pulse width of the B2-clock pulse B2-CLK may be equal to that of the BB-clock pulse BB-CLK.

Alternatively, the B2-clock pulse B2-CLK may be of two or more phases, not the single phase. For example, the B2-clock pulse B2-CLK may also be of two phases like the BB-clock pulse BB-CLK. As a detailed example, the first B2-clock pulse may be set to be synchronized with the first BB-clock pulse BB-CLK_1, and the second B2-clock pulse may be set to be synchronized with the second BB-clock pulse BB-CLK_2. In this case, the pulse width of the B2-clock pulse B2-CLK must be smaller than or equal to that of the BB-clock pulse BB-CLK_1 or BB-CLK_2. Also, the timing between the B2-clock pulse B2-CLK and the BB-clock pulse BB-CLK conforms to the above conditions.

On the other hand, each of the A2-clock pulses A2-CLK_1 to A2-CLK_4 has a pulse width smaller than that of each of the BB-clock pulses BB-CLK_1 and BB-CLK_2 and larger than that of the B2-clock pulse B2-CLK. It should be noted that this is but one example and the relative sizes of the pulse widths of the A1-clock pulse, A2-clock pulse, BB-clock pulse and B-clock pulse to one another are freely settable to any values. Exceptionally, the pulse width of the BB-clock pulse BB-CLK_1 or BB-CLK_2 must be larger than that of each of the B1-clock pulse B1-CLK and B2-clock pulse B2-CLK to contain both.

A2-scan pulses A2-SC_n−1 to A2-SC_n+2 are generated based on the A2-clock pulses A2-CLK_1 to A2-CLK_4. Accordingly, the pulse widths of adjacent ones of the A2-scan pulses A2-SC_n−1 to A2-SC_n+2 partially overlap each other, as shown in FIG. 6. The A2-scan pulses A2-SC_n−1 to A2-SC_n+2 are sequentially output once for one frame period.

B2-scan pulses B2-SC_n−1 to B2-SC_n+1 are generated based on the B2-clock pulse B2-CLK. Accordingly, each of the B2-scan pulses B2-SC_n−1 to B2-SC_n+1 has the same shape as that of the B2-clock pulse B2-CLK and is output with the same timing as that of the B2-clock pulse B2-CLK, as shown in FIG. 6. Each of the B2-scan pulses B2-SC_n−1 to B2-SC_n+1 is output once in one frame period. In this regard, the B2-scan pulses B2-SC_n−1 to B2-SC_n+1 are changed in output position on a frame period basis. For example, as shown in FIG. 6, the B2-scan pulse B2-SC_n−1 may be output from the (n−1)th stage in the leftmost, first frame period, the B2-scan pulse B2-SC_n may be output from the nth stage in the second frame period positioned at the right-hand side of the first frame period, and the B2-scan pulse B2-SC_n+1 may be output from the (n+1)th stage in the third frame period positioned at the right-hand side of the second frame period.

Because the B2-scan pulses B2-SC_n−1 to B2-SC_n+1 are changed in output position on a frame period basis in this manner, the distance between an A2-scan pulse A2-SC and a B2-scan pulse B2-SC output as one composite pulse (second composite pulse) to the same gate line in one frame period is gradually reduced as shown in FIG. 6.

On the other hand, when a period of one frame period T_F in which the first to fourth A2-clock pulses A2-CLK_1 to A2-CLK_4 are output is defined as an A2-output period T_A2 and the remaining period of the one frame period T_F is defined as the B2-output period T_B2 as stated previously, all of the first to fourth A2-clock pulses A2-CLK_1 to A2-CLK_4 may be kept low in the B2-output period T_B2 of the one frame period T_F, as shown in FIG. 6. Alternatively, in this B2-output period T_B2, the first to fourth A2-clock pulses A2-CLK_1 to A2-CLK_4 may be output in the same manner as in the A2-output period T_A2.

Figure 7:
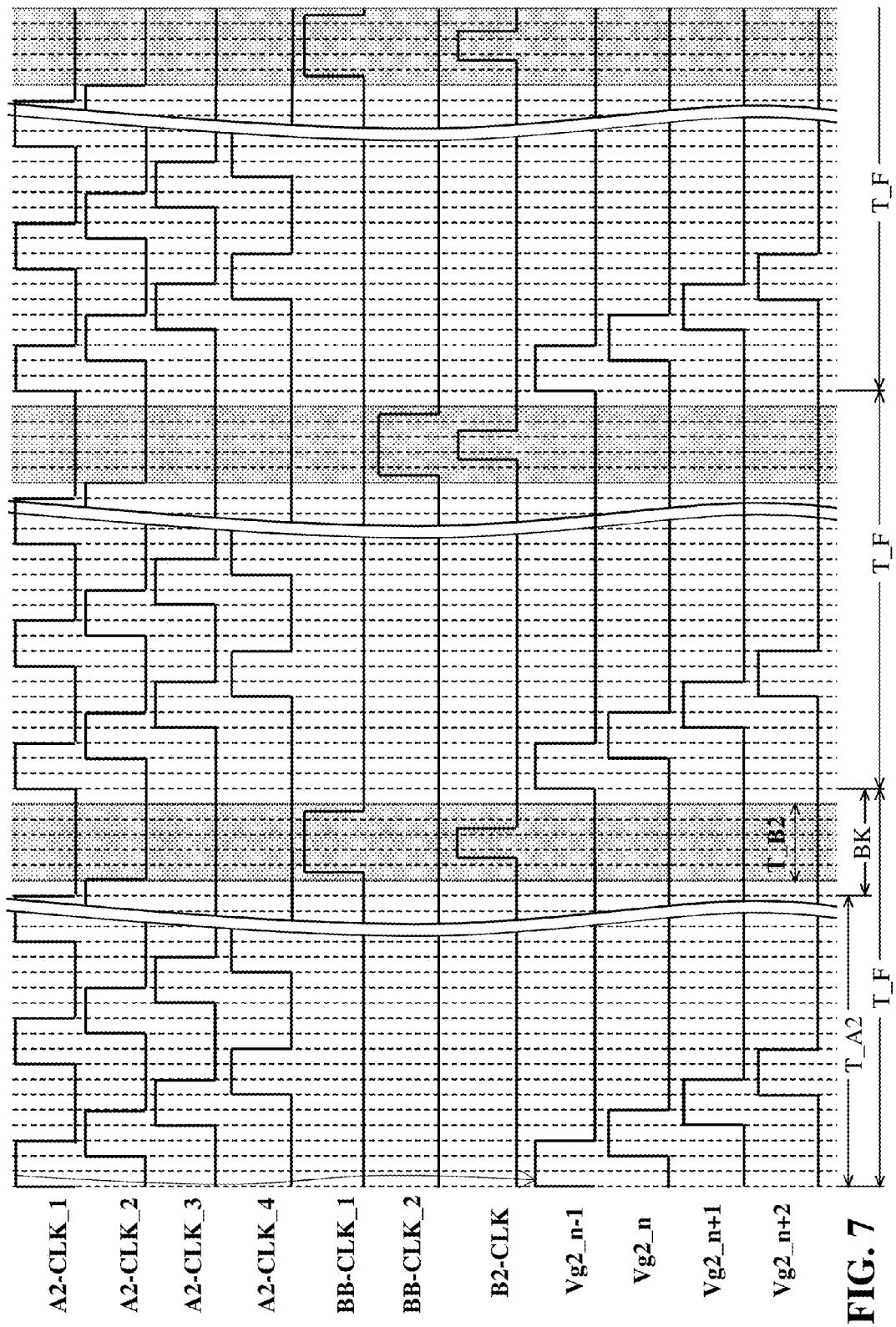
FIG. 7 is a timing diagram illustrating an example of the A2-clock pulse, BB-clock pulse and B2-clock pulse, and A2-carry pulses generated thereby.

FIG. 7 is a timing diagram illustrating an example of the A2-clock pulse A2-CLK, BB-clock pulse BB-CLK and B2-clock pulse B2-CLK, and A2-carry pulses generated thereby.

A2-carry pulses A2-CR_n−1 to A2-CR_n+2 are generated based on the A2-clock pulses A2-CLK_1 to A2-CLK_4. Accordingly, the pulse widths of adjacent ones of the A2-carry pulses A2-CR_n−1 to A2-CR_n+2 partially overlap each other, as shown in FIG. 7. The A2-carry pulses A2-CR_n−1 to A2-CR_n+2 are sequentially output once for one frame period. Here, the A2-carry pulses A2-CR_n−1 to A2-CR_n+2 are substantially the same as the A2-scan pulses A2-SC_n−1 to A2-SC_n+2.

Figure 8:
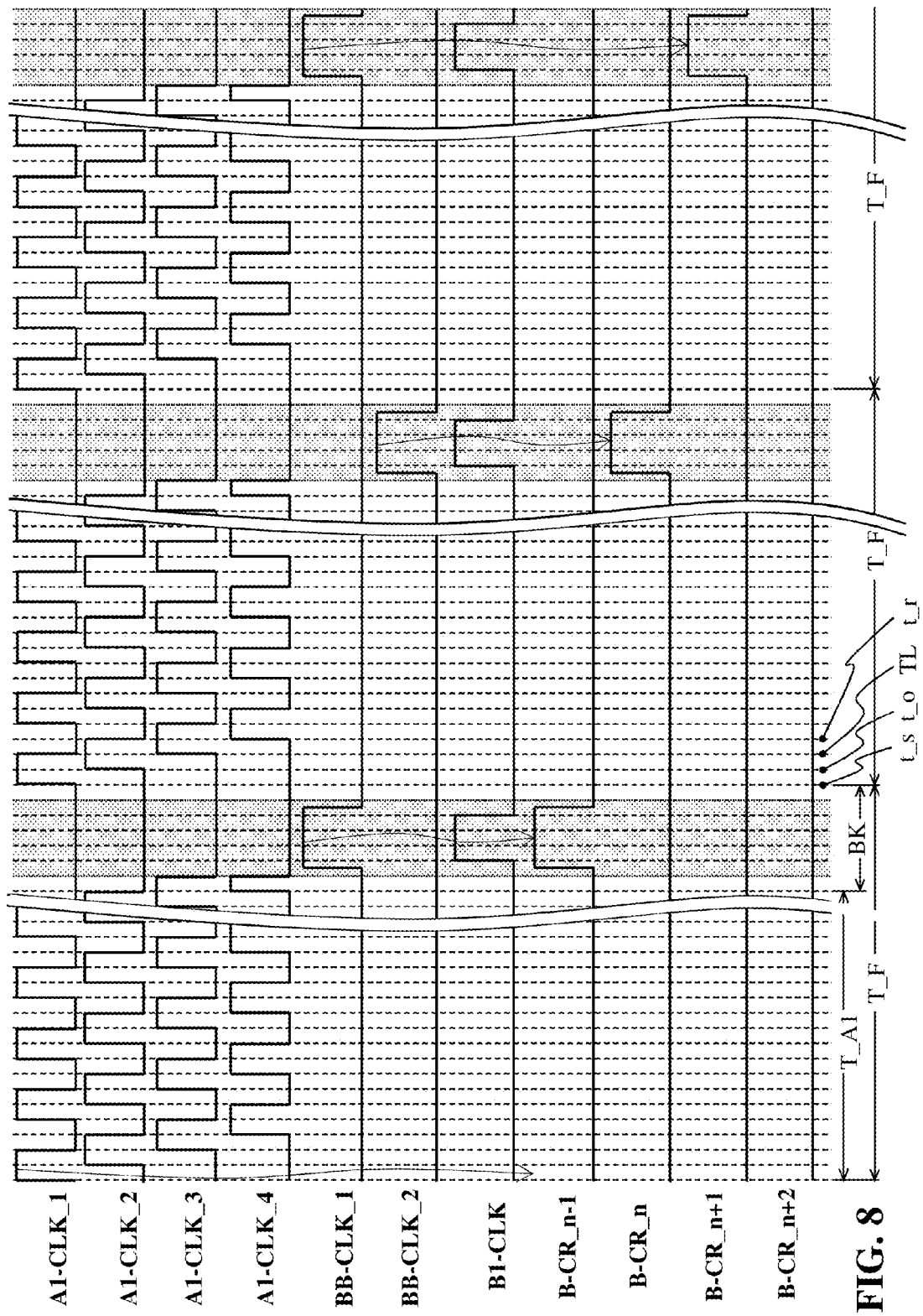
FIG. 8 is a timing diagram illustrating an example of the A1-clock pulse, BB-clock pulse and B1-clock pulse, and B-carry pulses generated thereby.

FIG. 8 is a timing diagram illustrating an example of the A1-clock pulse A1-CLK, BB-clock pulse BB-CLK and B1-clock pulse B1-CLK, and B-carry pulses generated thereby.

B-carry pulses B-CR_n−1 to B-CR_n+2 are generated based on the BB-clock pulses BB-CLK_1 and BB-CLK_2. Accordingly, each of the B-carry pulses B-CR_n−1 to B-CR_n+2 has the same shape as that of a corresponding one of the BB-clock pulses BB-CLK_1 and BB-CLK_2 and is output with the same timing as that of the corresponding BB-clock pulse, as shown in FIG. 8. Each of the B-carry pulses B-CR_n−1 to B-CR_n+2 is output once in one frame period. In this regard, the B-carry pulses B-CR_n−1 to B-CR_n+2 are changed in output position on a frame period basis. For example, as shown in FIG. 8, the B-carry pulse B-CR_n−1 may be output from the (n−1)th B-sub-stage B-Sub in the leftmost, first frame period T_F, the B-carry pulse B-CR_n may be output from the nth B-sub-stage B-Sub in the second frame period T_F positioned at the right-hand side of the first frame period, and the B-carry pulse B-CR_n+1 may be output from the (n+1)th B-sub-stage B-Sub in the third frame period T_F positioned at the right-hand side of the second frame period. Here, the B-carry pulses B-CR_n−1 to B-CR_n+2 are synchronized with the B1-scan pulses B1-SC_n−1 to B1-SC_n+2 and the B2-scan pulses B2-SC_n−1 to B2-SC_n+2.

On the other hand, in FIGS. 4 to 8, the A1-clock pulse A1-CLK may be of a phases, the BB-clock pulse BB-CLK may be of a*b phases, and the B1-clock pulse B1-CLK may be of a*c phases. Here, a is a natural number greater than 1, a*b is a natural number greater than 1, and a*c is a natural number equal to or greater than 1.

The period of the B1-clock pulse B1-CLK is a*c times the output generation period of the B-sub-stage B-Sub. For several examples, the respective clock pulses may be of:

1) A1-clock pulse A1-CLK: 4 phases, BB-clock pulse BB-CLK: 2 phases, and B1-clock pulse B1-CLK: 1 phase;

2) A1-clock pulse A1-CLK: 4 phases, BB-clock pulse BB-CLK: 2 phases, and B1-clock pulse B1-CLK: 2 phases (or 4 phases); or 3) A1-clock pulse A1-CLK: 6 phases, BB-clock pulse BB-CLK: 2 phases, and B1-clock pulse B1-CLK: 2 phases (or 4 phases).

On the other hand, the A2-clock pulse, BB-clock pulse and B2-clock pulse may be configured in the same manner as the above.

In this manner, the scan output controller SOC according to the present invention generates a desired scan pulse (including an A1-scan pulse A1-SC, a B1-scan pulse B1-SC, an A2-scan pulse A2-SC and a B2-scan pulse B2-SC) using an A1-clock pulse A1-CLK, an A2-clock pulse A2-CLK, a BB-clock pulse BB-CLK, a B1-clock pulse B1-CLK and a B2-clock pulse B2-CLK. Therefore, output switching devices formed in the scan output controller SOC do not need to be large in size, and the voltage of the scan pulse is also prevented from being attenuated.

Hereinafter, the configuration of the scan output controller SOC according to the present invention will be described in detail.

First Embodiment of Scan Output Controller SOC

Figure 9:
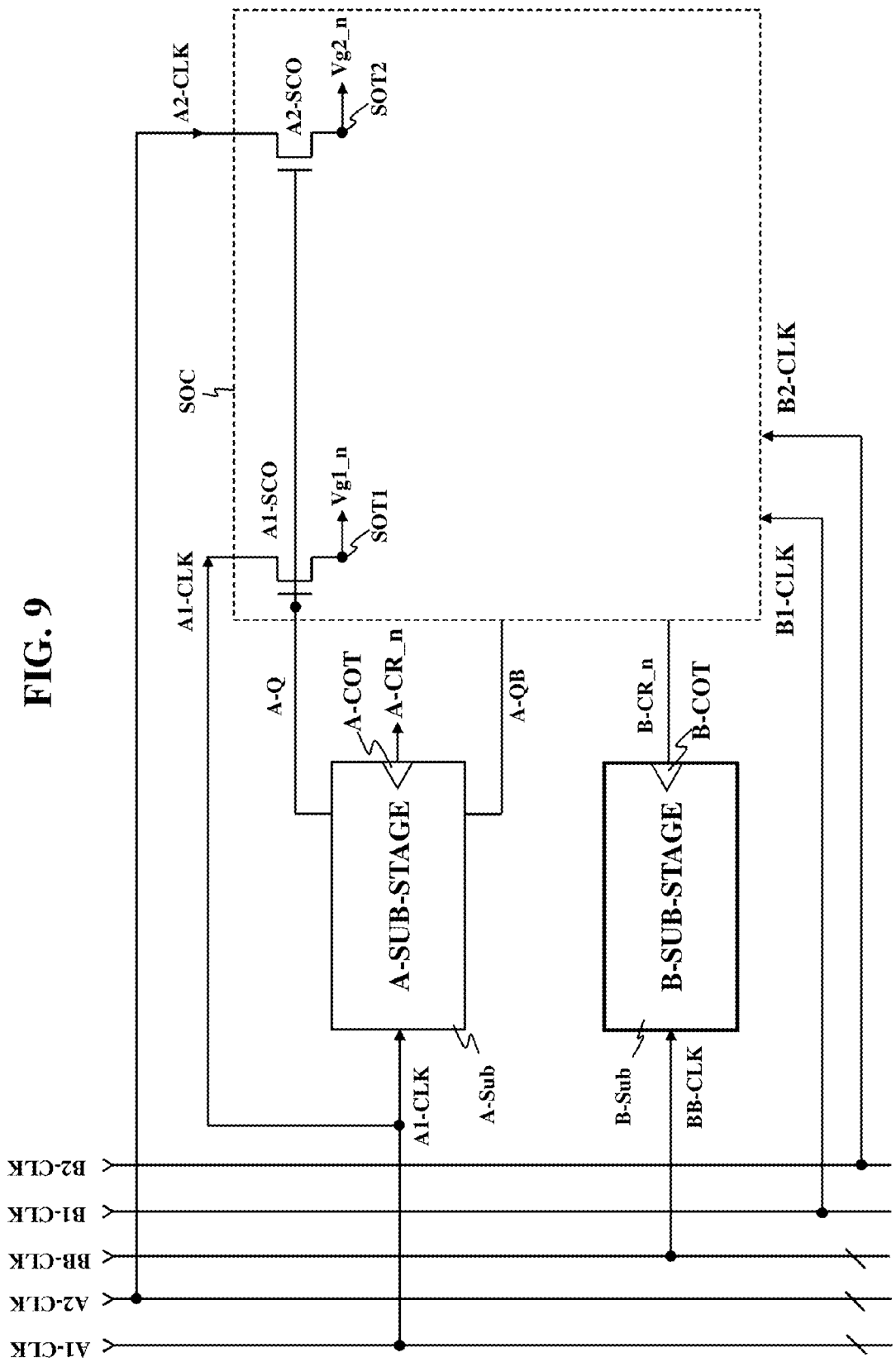
FIG. 9 is a circuit diagram of a first embodiment of a scan output controller according to the present invention.

FIG. 9 is a circuit diagram of a first embodiment of the scan output controller SOC according to the present invention.

Because all stages are the same in configuration, the configuration of the scan output controller SOC of the nth stage will be representatively described.

The scan output controller SOC according to the first embodiment includes an A1-scan output switching device A1-SCO and an A2-scan output switching device A2-SCO, as shown in FIG. 9.

The A1-scan output switching device A1-SCO is controlled by a voltage at an A-set node A-Q and is connected between an A1-clock transfer line which transfers an A1-clock pulse A1-CLK and a first scan output terminal SOT1. That is, the A1-scan output switching device A1-SCO is turned on or off in response to the voltage at the A-set node A-Q, and interconnects the A1-clock transfer line and the first scan output terminal SOT1 when turned on.

The A2-scan output switching device A2-SCO is controlled by the voltage at the A-set node A-Q and is connected between an A2-clock transfer line which transfers an A2-clock pulse A2-CLK and a second scan output terminal SOT2. That is, the A2-scan output switching device A2-SCO is turned on or off in response to the voltage at the A-set node A-Q, and interconnects the A2-clock transfer line and the second scan output terminal SOT2 when turned on.

Here, the same clock pulse or different clock pulses may be supplied to an A-sub-stage A-Sub and the above A1-scan output switching device A1-SCO. As one example, FIG. 9 shows a configuration in which the same A1-clock pulse A1-CLK is supplied to the A-sub-stage A-Sub and the A1-scan output switching device A1-SCO.

Second Embodiment of Scan Output Controller SOC

Figure 10:
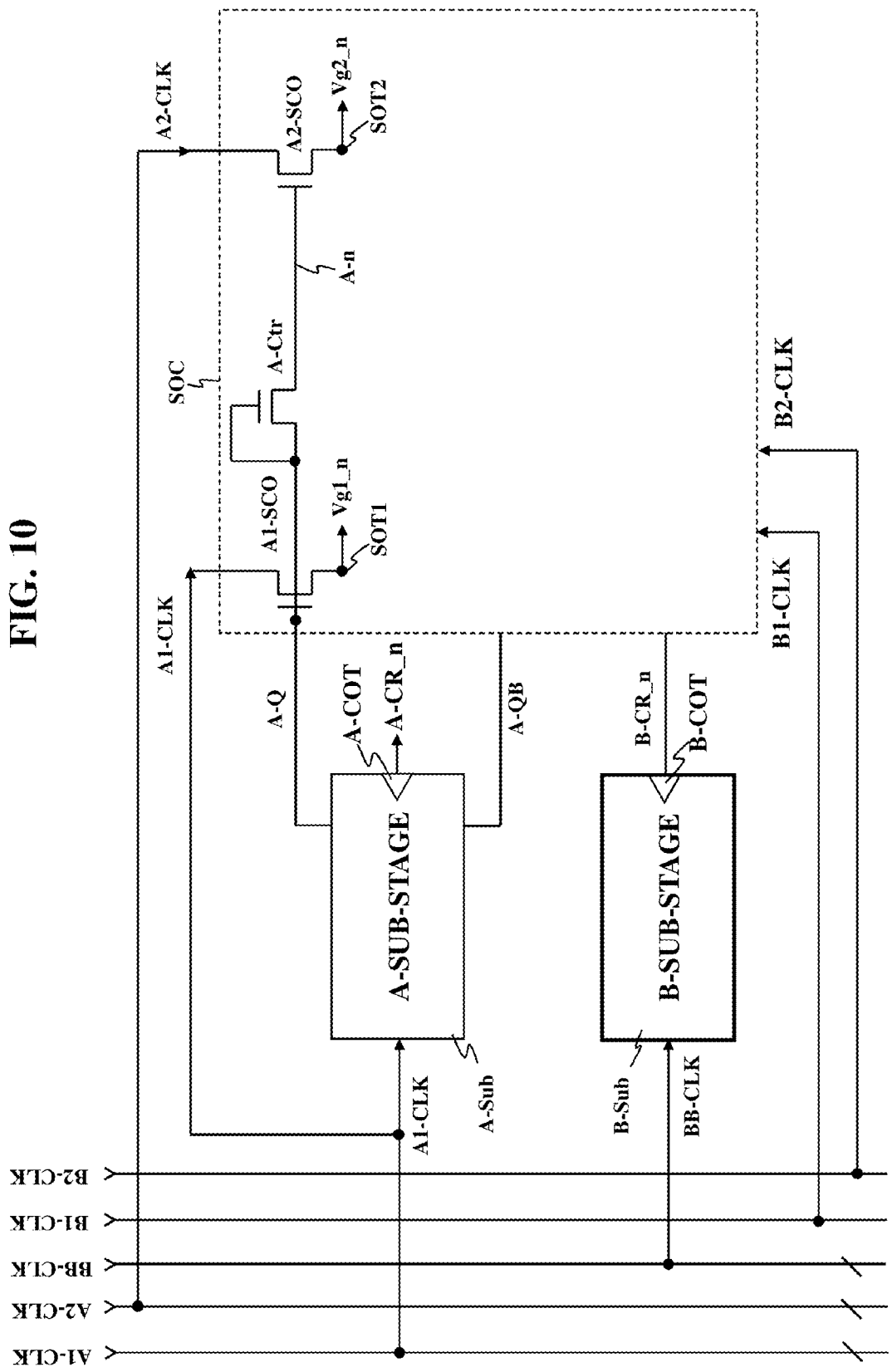
FIG. 10 is a circuit diagram of a second embodiment of the scan output controller according to the present invention.

FIG. 10 is a circuit diagram of a second embodiment of the scan output controller SOC according to the present invention.

The scan output controller SOC according to the second embodiment includes an A1-scan output switching device A1-SCO, an A-control switching device A-CTr, and an A2-scan output switching device A2-SCO, as shown in FIG. 10.

The A1-scan output switching device A1-SCO in the second embodiment is the same as that in the first embodiment, stated above, and a description thereof will thus be replaced by the above description of the first embodiment.

The A-control switching device A-CTr in the second embodiment is controlled by the voltage at the A-set node A-Q and is connected between the A-set node A-Q and an A-node A-n. That is, the A-control switching device A-CTr is turned on or off in response to the voltage at the A-set node A-Q, and interconnects the A-set node A-Q and the A-node A-n when turned on.

The A2-scan output switching device A2-SCO in the second embodiment is controlled by a voltage at the A-node A-n and is connected between an A2-clock transfer line which transfers an A2-clock pulse A2-CLK and a second scan output terminal SOT2. That is, the A2-scan output switching device A2-SCO is turned on or off in response to the voltage at the A-node A-n, and interconnects the A2-clock transfer line and the second scan output terminal SOT2 when turned on.

Here, the same clock pulse or different clock pulses may be supplied to an A-sub-stage A-Sub and the above A1-scan output switching device A1-SCO.

Third Embodiment of Scan Output Controller SOC

Figure 11:
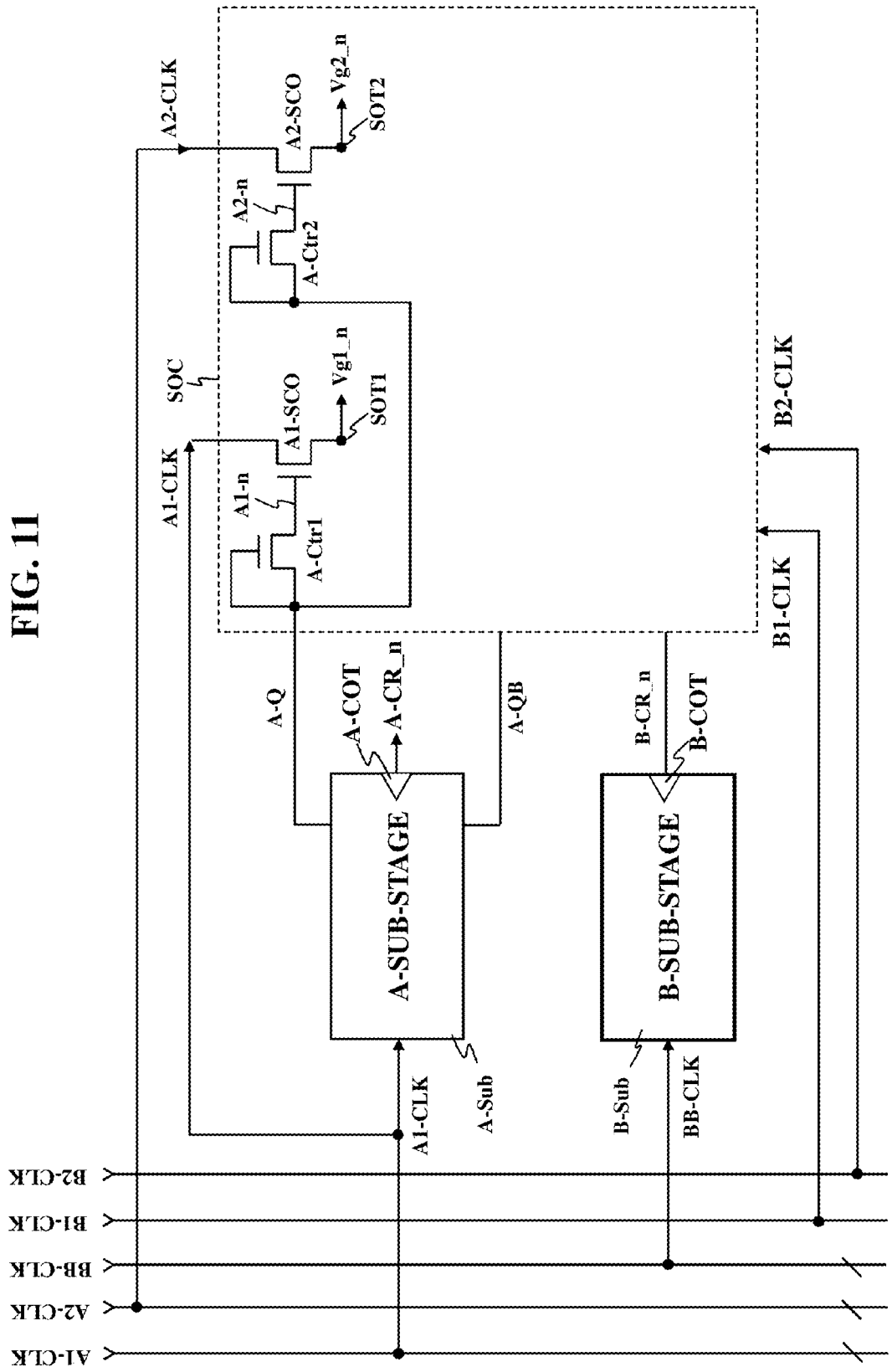
FIG. 11 is a circuit diagram of a third embodiment of the scan output controller according to the present invention.

FIG. 11 is a circuit diagram of a third embodiment of the scan output controller SOC according to the present invention.

The scan output controller SOC according to the third embodiment includes a first A-control switching device A-CTr1, an A1-scan output switching device A1-SCO, a second A-control switching device A-CTr2, and an A2-scan output switching device A2-SCO, as shown in FIG. 11.

The first A-control switching device A-CTr1 in the third embodiment is controlled by a voltage at an A-set node A-Q and is connected between the A-set node A-Q and an A1-node A1-$n$. That is, the first A-control switching device A-CTr1 is turned on or off in response to the voltage at the A-set node A-Q, and interconnects the A-set node A-Q and the A1-node A1-$n$ when turned on.

The A1-scan output switching device A1-SCO in the third embodiment is controlled by a voltage at the A1-node A1-$n$ and is connected between an A1-clock transfer line which transfers an A1-clock pulse A1-CLK and a first scan output terminal SOT1. That is, the A1-scan output switching device A1-SCO is turned on or off in response to the voltage at the A1-node A1-$n$, and interconnects the A1-clock transfer line and the first scan output terminal SOT1 when turned on.

The second A-control switching device A-CTr2 in the third embodiment is controlled by the voltage at the A-set node A-Q and is connected between the A-set node A-Q and an A2-node A2-$n$. That is, the second A-control switching device A-CTr2 is turned on or off in response to the voltage at the A-set node A-Q, and interconnects the A-set node A-Q and the A2-node A2-$n$ when turned on.

The A2-scan output switching device A2-SCO in the third embodiment is controlled by a voltage at the A2-node A2-$n$ and is connected between an A2-clock transfer line which transfers an A2-clock pulse A2-CLK and a second scan output terminal SOT2. That is, the A2-scan output switching device A2-SCO is turned on or off in response to the voltage at the A2-node A2-$n$, and interconnects the A2-clock transfer line and the second scan output terminal SOT2 when turned on.

Here, the same clock pulse or different clock pulses may be supplied to an A-sub-stage A-Sub and the above A1-scan output switching device A1-SCO.

Fourth Embodiment of Scan Output Controller SOC

Figure 12:
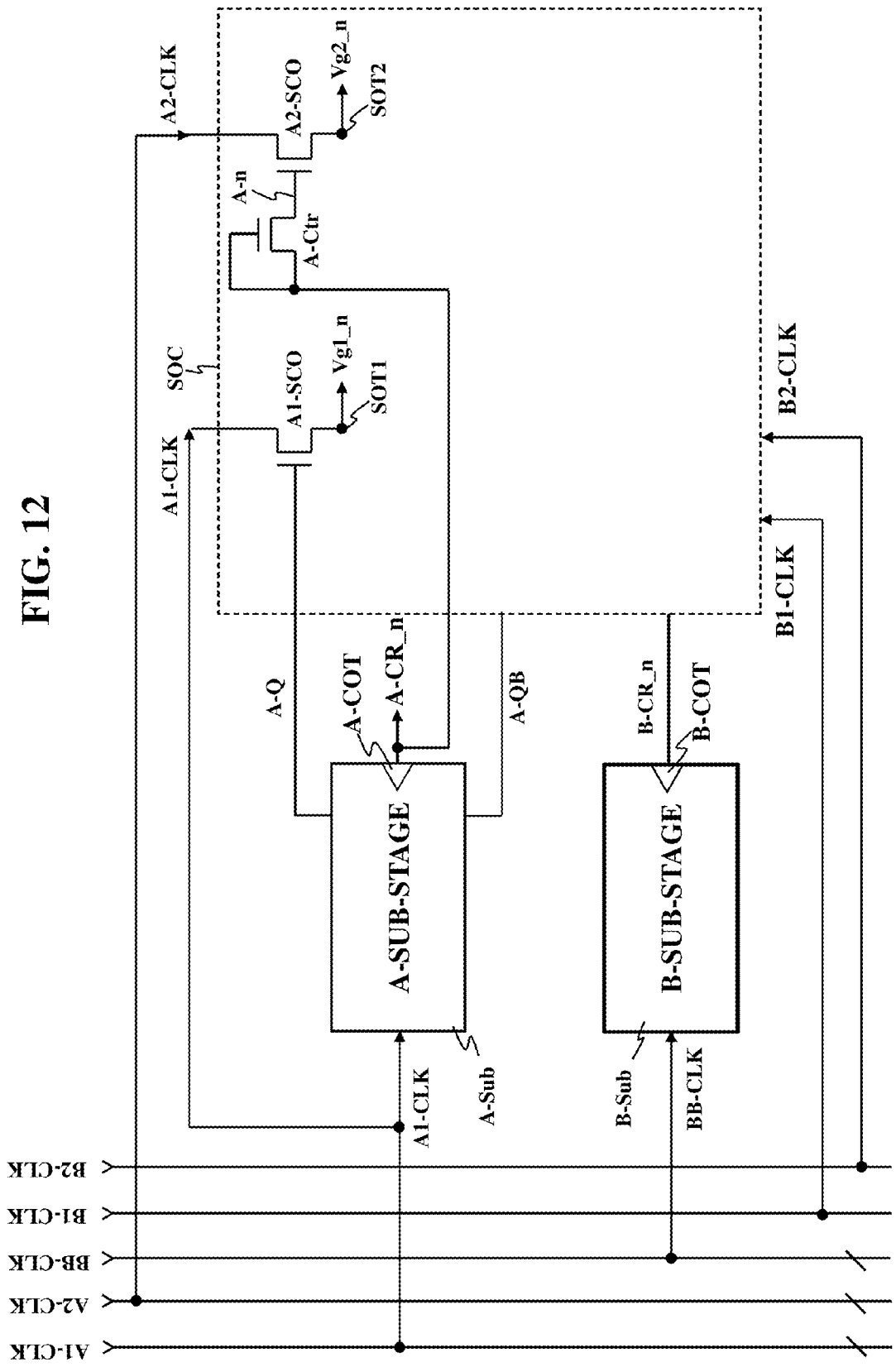
FIG. 12 is a circuit diagram of a fourth embodiment of the scan output controller according to the present invention.

FIG. 12 is a circuit diagram of a fourth embodiment of the scan output controller SOC according to the present invention.

The scan output controller SOC according to the fourth embodiment includes an A1-scan output switching device A1-SCO, an A-control switching device A-CTr, and an A2-scan output switching device A2-SCO, as shown in FIG. 12.

The A1-scan output switching device A1-SCO in the fourth embodiment is the same as that in the first embodiment, stated above, and a description thereof will thus be replaced by the above description of the first embodiment.

The A-control switching device A-CTr in the fourth embodiment is controlled by an A-carry pulse A-CR_n and is connected between an A-carry output terminal A-COT and an A-node A-n. That is, the A-control switching device A-CTr is turned on or off in response to the A-carry pulse A-CR_n, and interconnects the A-carry output terminal A-COT and the A-node A-n when turned on.

The A2-scan output switching device A2-SCO in the fourth embodiment is controlled by a voltage at the A-node A-n and is connected between an A2-clock transfer line which transfers an A2-clock pulse A2-CLK and a second scan output terminal SOT2. That is, the A2-scan output switching device A2-SCO is turned on or off in response to the voltage at the A-node A-n, and interconnects the A2-clock transfer line and the second scan output terminal SOT2 when turned on.

Here, the same clock pulse or different clock pulses may be supplied to an A-sub-stage A-Sub and the above A1-scan output switching device A1-SCO.

Fifth Embodiment of Scan Output Controller SOC

Figure 13:
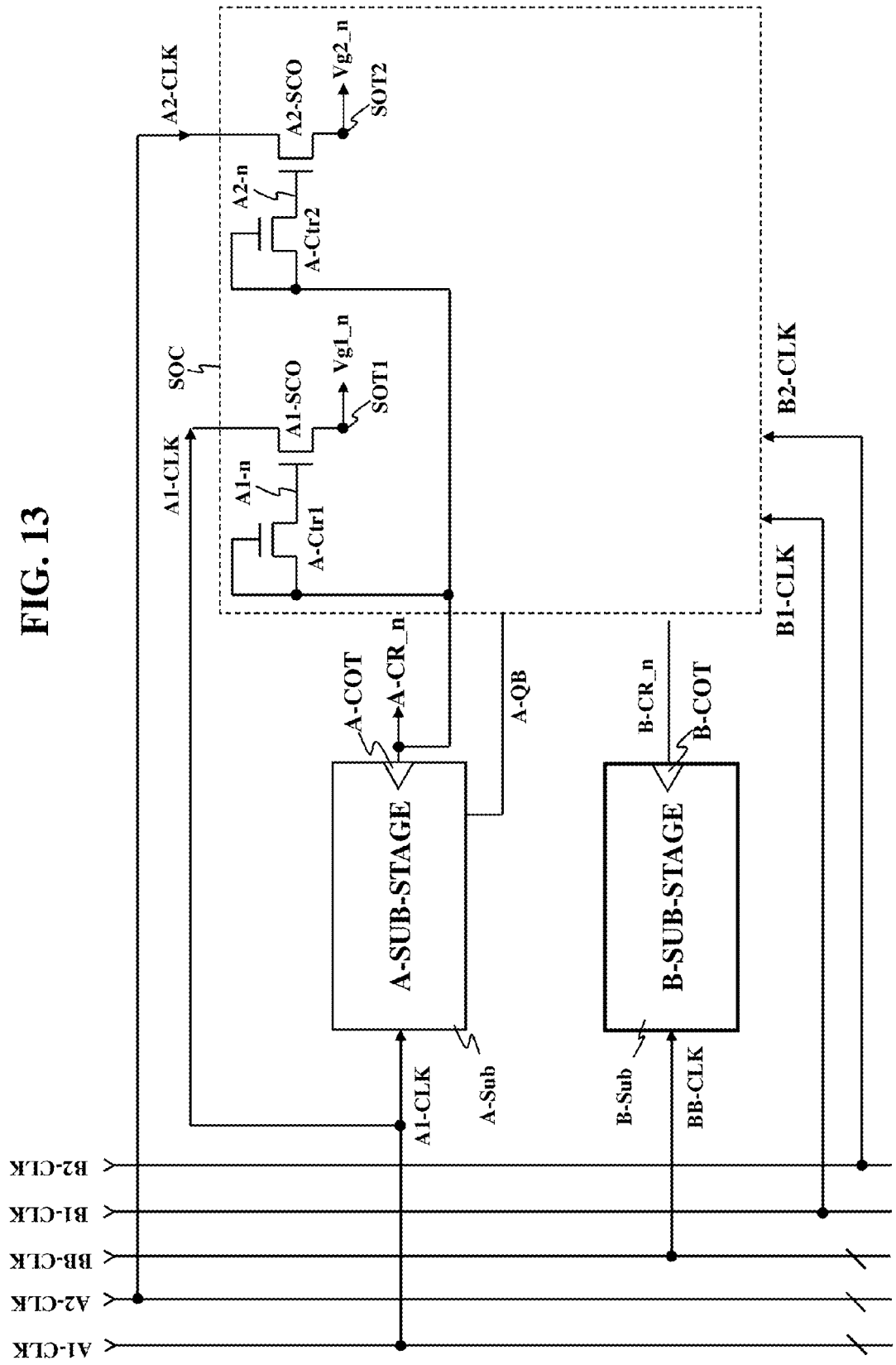
FIG. 13 is a circuit diagram of a fifth embodiment of the scan output controller according to the present invention.

FIG. 13 is a circuit diagram of a fifth embodiment of the scan output controller SOC according to the present invention.

The scan output controller SOC according to the fifth embodiment includes a first A-control switching device A-CTr1, an A1-scan output switching device A1-SCO, a second A-control switching device A-CTr2, and an A2-scan output switching device A2-SCO, as shown in FIG. 13.

The first A-control switching device A-CTr1 in the fifth embodiment is controlled by an A-carry pulse A-CR_n and is connected between an A-carry output terminal A-COT and an A1-node A1-*n*. That is, the first A-control switching device A-CTr1 is turned on or off in response to the A-carry pulse A-CR_n, and interconnects the A-carry output terminal A-COT and the A1-node A1-*n* when turned on.

The A1-scan output switching device A1-SCO in the fifth embodiment is controlled by a voltage at the A1-node A1-*n* and is connected between an A1-clock transfer line which transfers an A1-clock pulse A1-CLK and a first scan output terminal SOT1. That is, the A1-scan output switching device A1-SCO is turned on or off in response to the voltage at the A1-node A1-*n*, and interconnects the A1-clock transfer line and the first scan output terminal SOT1 when turned on.

The second A-control switching device A-CTr2 in the fifth embodiment is controlled by the A-carry pulse A-CR_n and is connected between the A-carry output terminal A-COT and an A2-node A2-*n*. That is, the second A-control switching device A-CTr2 is turned on or off in response to the A-carry pulse A-CR_n, and interconnects the A-carry output terminal A-COT and the A2-node A2-*n* when turned on.

The A2-scan output switching device A2-SCO in the fifth embodiment is controlled by a voltage at the A2-node A2-*n* and is connected between an A2-clock transfer line which transfers an A2-clock pulse A2-CLK and a second scan output terminal SOT2. That is, the A2-scan output switching device A2-SCO is turned on or off in response to the voltage at the A2-node A2-*n*, and interconnects the A2-clock transfer line and the second scan output terminal SOT2 when turned on.

Here, the same clock pulse or different clock pulses may be supplied to an A-sub-stage A-Sub and the above A1-scan output switching device A1-SCO.

Sixth Embodiment of Scan Output Controller SOC

Figure 14:
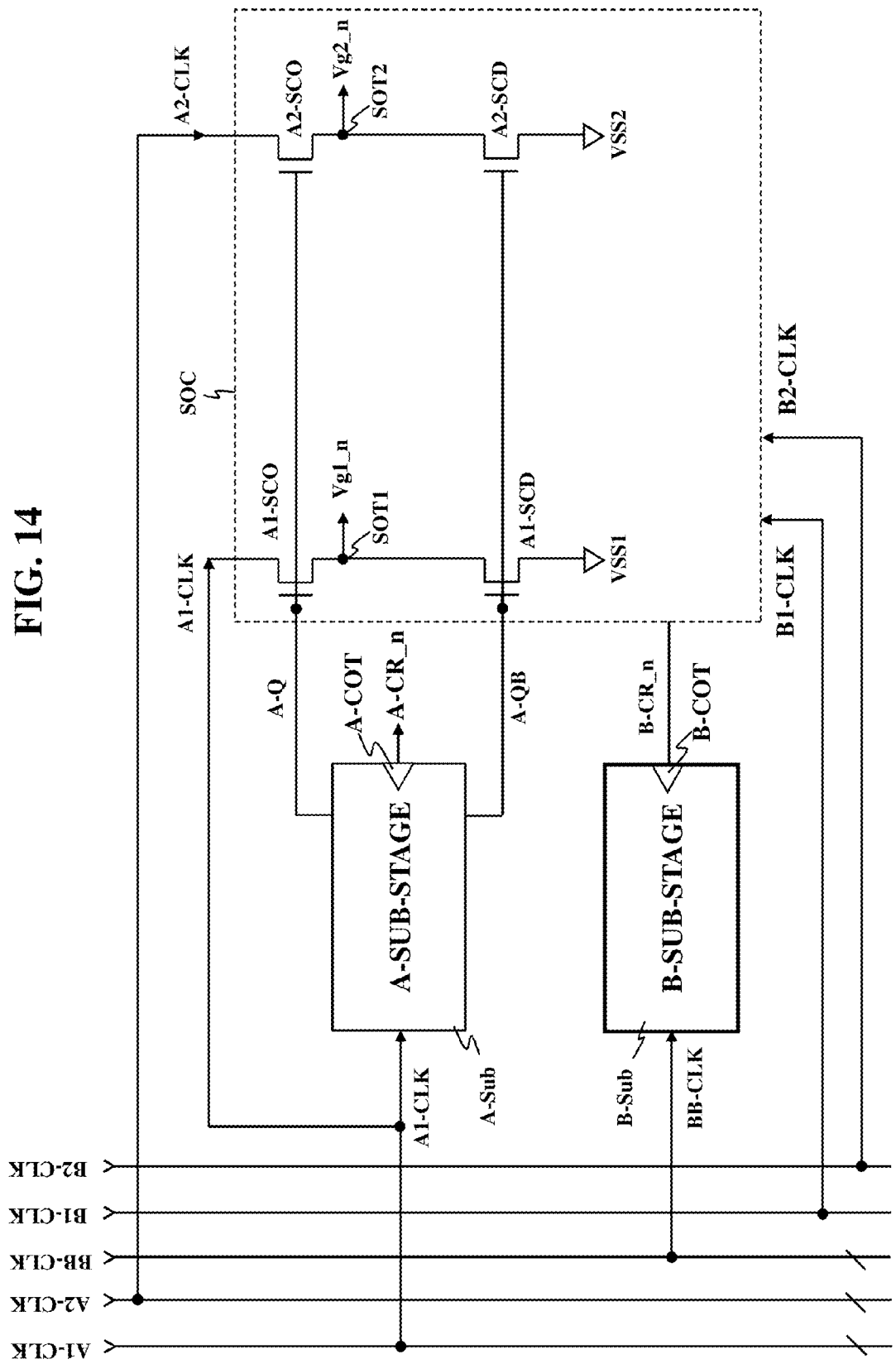
FIG. 14 is a circuit diagram of a sixth embodiment of the scan output controller according to the present invention.

FIG. 14 is a circuit diagram of a sixth embodiment of the scan output controller SOC according to the present invention.

The scan output controller SOC according to the sixth embodiment includes an A1-scan output switching device A1-SCO, an A2-scan output switching device A2-SCO, an A1-scan discharge switching device A1-SCD, and an A2-scan discharge switching device A2-SCD, as shown in FIG. 14.

The A1-scan output switching device A1-SCO and A2-scan output switching device A2-SCO in the sixth embodiment are the same as those in the first embodiment, stated above, respectively, and a description thereof will thus be replaced by the above description of the first embodiment.

The A1-scan discharge switching device A1-SCD in the sixth embodiment is controlled by a voltage at an A-reset node A-QB and is connected between the first scan output terminal SOT1 and a first discharging voltage line which transfers a first discharging voltage VSS1. That is, the A1-scan discharge switching device A1-SCD is turned on or off in response to the voltage at the A-reset node A-QB, and interconnects the first scan output terminal SOT1 and the first discharging voltage line when turned on.

The A2-scan discharge switching device A2-SCD in the sixth embodiment is controlled by the voltage at the A-reset node A-QB and is connected between the second scan output terminal SOT2 and a second discharging voltage line which transfers a second discharging voltage VSS2. That is, the A2-scan discharge switching device A2-SCD is turned on or off in response to the voltage at the A-reset node A-QB, and interconnects the second scan output terminal SOT2 and the second discharging voltage line when turned on.

Here, the same clock pulse or different clock pulses may be supplied to an A-sub-stage A-Sub and the above A1-scan output switching device A1-SCO.

On the other hand, at least one of the A1-scan discharge switching device A1-SCD and the A2-scan discharge switching device A2-SCD may also be applied to the above-stated first to fifth embodiments.

Seventh Embodiment of Scan Output Controller SOC

Figure 15:
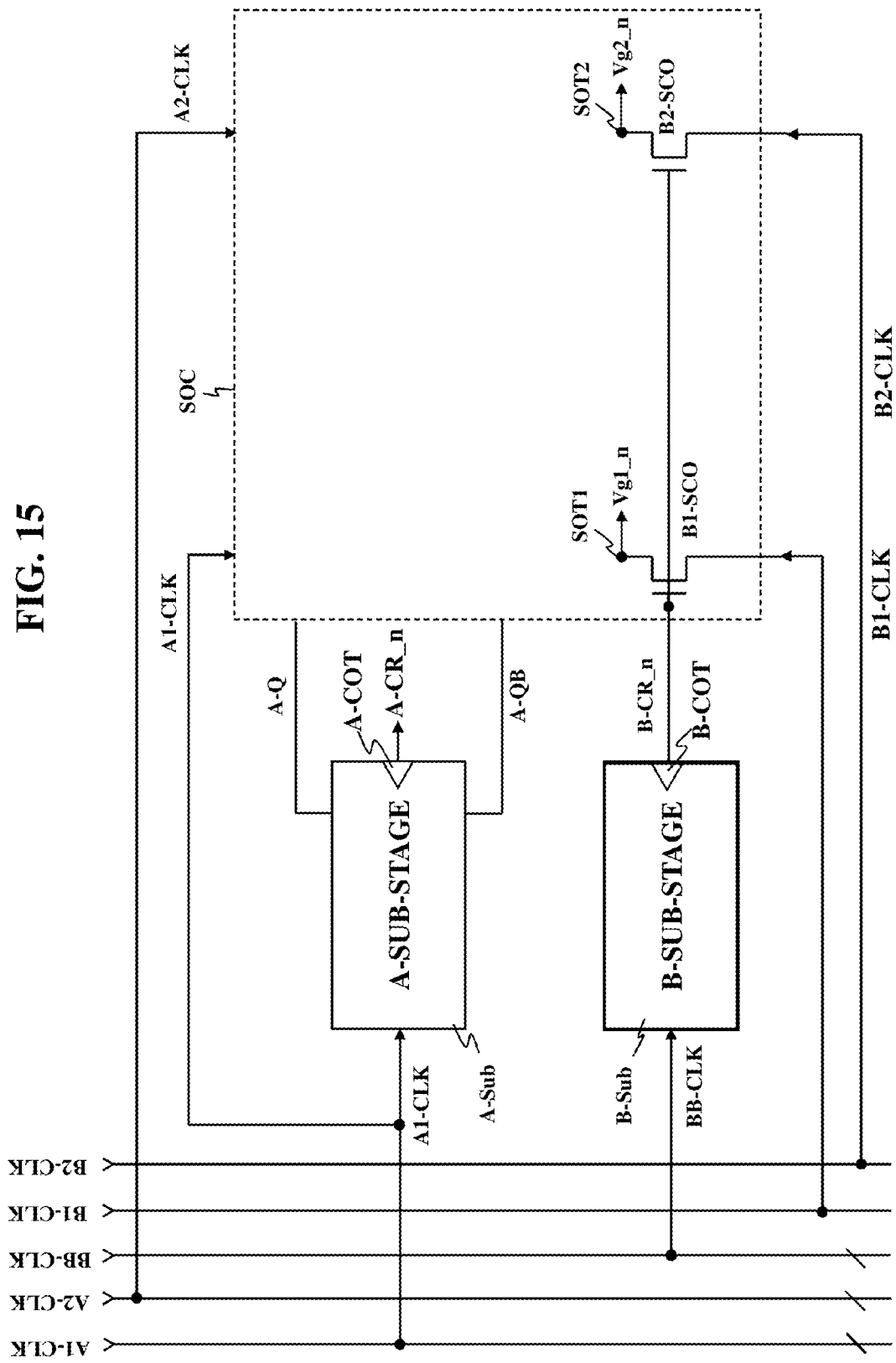
FIG. 15 is a circuit diagram of a seventh embodiment of the scan output controller according to the present invention.

FIG. 15 is a circuit diagram of a seventh embodiment of the scan output controller SOC according to the present invention.

The scan output controller SOC according to the seventh embodiment includes a B1-scan output switching device B1-SCO and a B2-scan output switching device B2-SCO, as shown in FIG. 15.

The B1-scan output switching device B1-SCO in the seventh embodiment is controlled by a B-carry pulse B-CR_n and is connected between a B1-clock transfer line which transfers a B1-clock pulse B1-CLK and a first scan output terminal SOT 1. That is, the B1-scan output switching device B1-SCO is turned on or off in response to the B-carry pulse B-CR_n, and interconnects the B1-clock transfer line and the first scan output terminal SOT1 when turned on.

The B2-scan output switching device B2-SCO in the seventh embodiment is controlled by the B-carry pulse B-CR_n and is connected between a B2-clock transfer line which transfers a B2-clock pulse B2-CLK and a second scan output terminal SOT2. That is, the B2-scan output switching device B2-SCO is turned on or off in response to the B-carry pulse B-CR_n, and interconnects the B2-clock transfer line and the second scan output terminal SOT2 when turned on.

Eighth Embodiment of Scan Output Controller SOC

Figure 16:
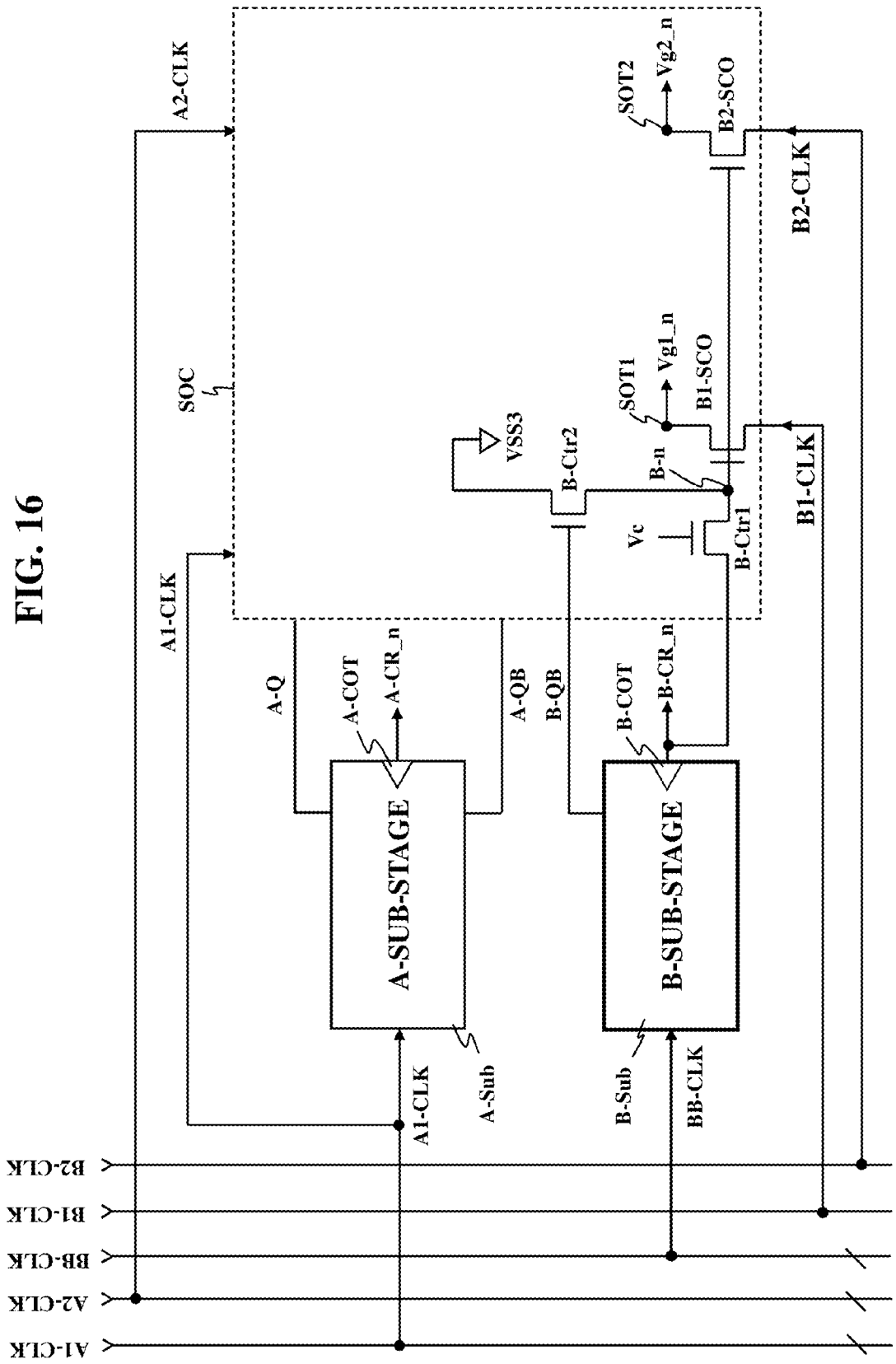
FIG. 16 is a circuit diagram of an eighth embodiment of the scan output controller according to the present invention.

FIG. 16 is a circuit diagram of an eighth embodiment of the scan output controller SOC according to the present invention.

The scan output controller SOC according to the eighth embodiment includes a first B-control switching device B-CTr1, a B1-scan output switching device B1-SCO, a B2-scan output switching device B2-SCO, and a second B-control switching device B-CTr2, as shown in FIG. 16.

The first B-control switching device B-CTr1 in the eighth embodiment is controlled by an external switching control signal Vc and is connected between a B-carry output terminal B-COT and a B-node B-n. That is, the first B-control switching device B-CTr1 is turned on or off in response to the switching control signal Vc, and interconnects the B-carry output terminal B-COT and the B-node B-n when turned on.

The B1-scan output switching device B1-SCO in the eighth embodiment is controlled by a voltage at the B-node B-n and is connected between a B1-clock transfer line which transfers a B1-clock pulse B1-CLK and a first scan output terminal SOT 1. That is, the B1-scan output switching device B1-SCO is turned on or off in response to the voltage at the B-node B-n, and interconnects the B1-clock transfer line and the first scan output terminal SOT1 when turned on.

The B2-scan output switching device B2-SCO in the eighth embodiment is controlled by the voltage at the B-node B-n and is connected between a B2-clock transfer line which transfers a B2-clock pulse B2-CLK and a second scan output terminal SOT2. That is, the B2-scan output switching device B2-SCO is turned on or off in response to the voltage at the B-node B-n, and interconnects the B2-clock transfer line and the second scan output terminal SOT2 when turned on.

The second B-control switching device B-CTr2 in the eighth embodiment is controlled by a voltage at a B-reset node B-QB and is connected between the B-node B-n and a third discharging voltage line which transfers a third discharging voltage VSS3. That is, the second B-control switching device B-CTr2 is turned on or off in response to the voltage at the B-reset node B-QB, and interconnects the B-node B-n and the third discharging voltage line when turned on.

The switching control signal Vc may be any one of a direct current (DC) voltage and an alternating current (AC) voltage. When the switching control signal Vc is the AC voltage, it may be output synchronously with a BB-clock pulse BB-CLK, and have a pulse width which is the same as or different from that of the BB-clock pulse BB-CLK. The relationship between the switching control signal Vc and the BB-clock pulse BB-CLK will hereinafter be described in detail with reference to FIG. 17.

Figure 17:
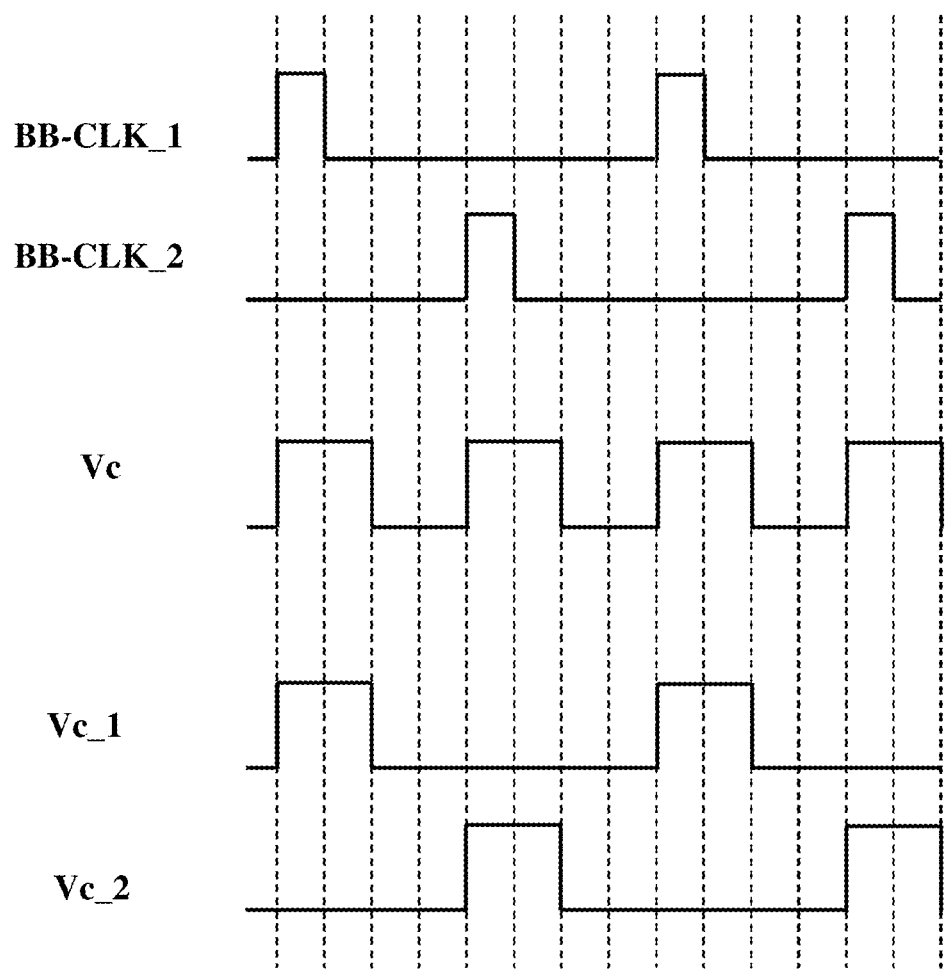
FIG. 17 is a timing diagram illustrating timing between a switching control signal and the BB-clock pulse.

FIG. 17 is a timing diagram illustrating timing between the switching control signal and the BB-clock pulse.

The switching control signal Vc may be any one of a DC voltage and an AC voltage, and may have a waveform as shown in FIG. 17 when being the AC voltage. In this case, when the switching control signal Vc is of a single phase, odd-numbered pulses of the switching control signal Vc are output synchronously with the first BB-clock pulse BB-CLK_1 and even-numbered pulses thereof are output synchronously with the second BB-clock pulse BB-CLK_2.

On the other hand, when the switching control signal Vc is of two phases, it may be divided into a first switching control signal Vc_1 and a second switching control signal Vc_2. The first switching control signal Vc_1 is composed of only the odd-numbered pulses among the above pulses of the switching control signal Vc, and the second switching control signal Vc_2 is composed of only the even-numbered pulses among the above pulses of the switching control signal Vc. The pulses of the first switching control signal Vc_1 are output synchronously with the first BB-clock pulse BB-CLK_1, and the pulses of the second switching control signal Vc_2 are output synchronously with the second BB-clock pulse BB-CLK_2.

The switching control signal Vc may have a pulse width which is the same as or different from that of the BB-clock pulse BB-CLK_1 or BB-CLK_2. On the other hand, the switching control signal Vc may have a wider pulse width than that of the BB-clock pulse BB-CLK_1 or BB-CLK_2 such that it completely surrounds the BB-clock pulse BB-CLK_1 or BB-CLK_2.

Ninth Embodiment of Scan Output Controller SOC

Figure 18:
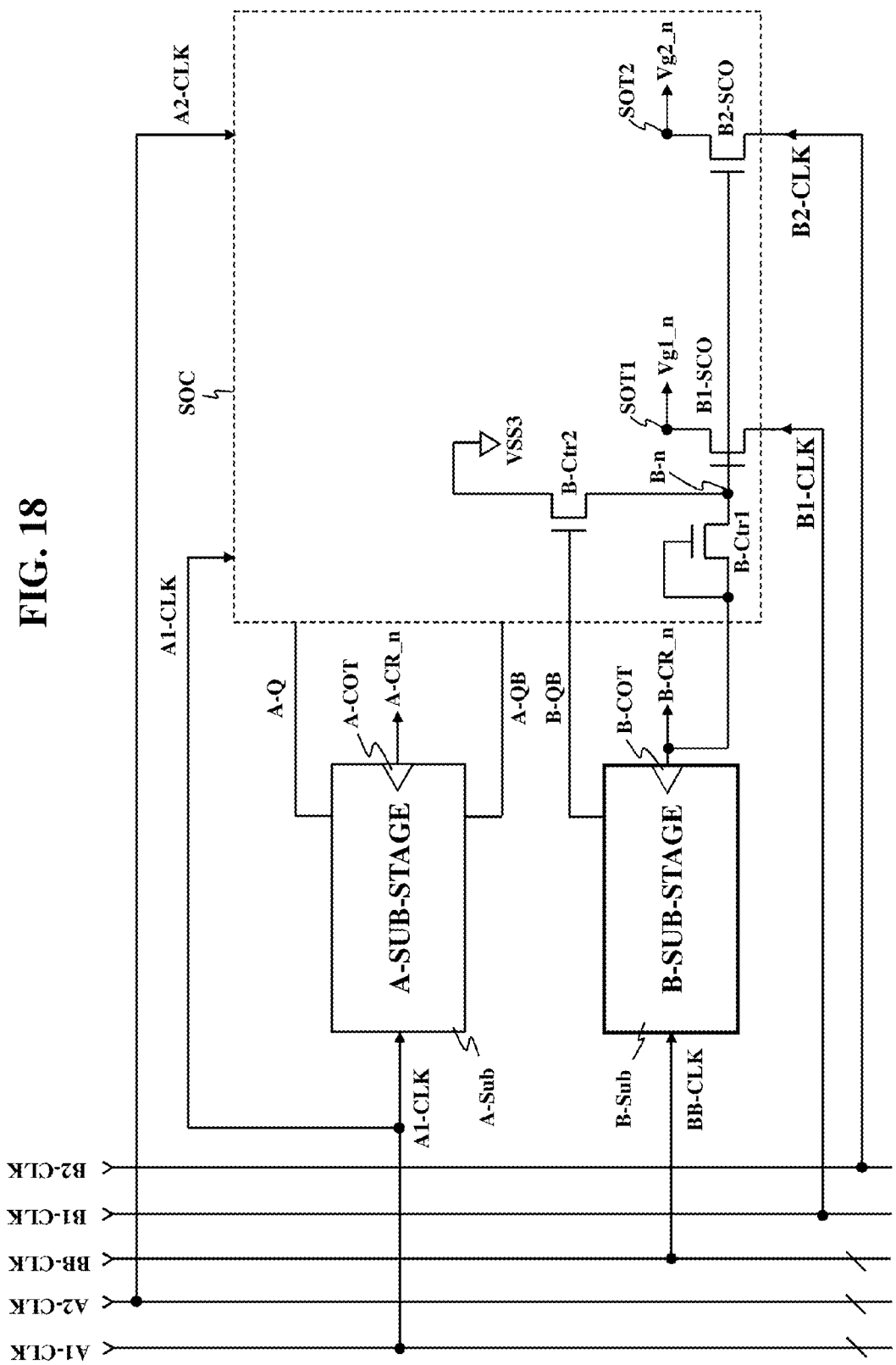
FIG. 18 is a circuit diagram of a ninth embodiment of the scan output controller according to the present invention.

FIG. 18 is a circuit diagram of a ninth embodiment of the scan output controller SOC according to the present invention.

The scan output controller SOC according to the ninth embodiment includes a first B-control switching device B-CTr1, a B1-scan output switching device B1-SCO, a B2-scan output switching device B2-SCO, and a second B-control switching device B-CTr2, as shown in FIG. 18.

The B1-scan output switching device B1-SCO, B2-scan output switching device B2-SCO and second B-control switching device B-CTr2 in the ninth embodiment are the same as those in the eighth embodiment, stated above, respectively, and a description thereof will thus be replaced by the above description of the eighth embodiment.

The first B-control switching device B-CTr1 in the ninth embodiment is controlled by a B-carry pulse B-CR_n and is connected between a B-carry output terminal B-COT and the B-node B-n. That is, the first B-control switching device B-CTr1 is turned on or off in response to the B-carry pulse B-CR_n, and interconnects the B-carry output terminal B-COT and the B-node B-n when turned on.

Tenth Embodiment of Scan Output Controller SOC

Figure 19:
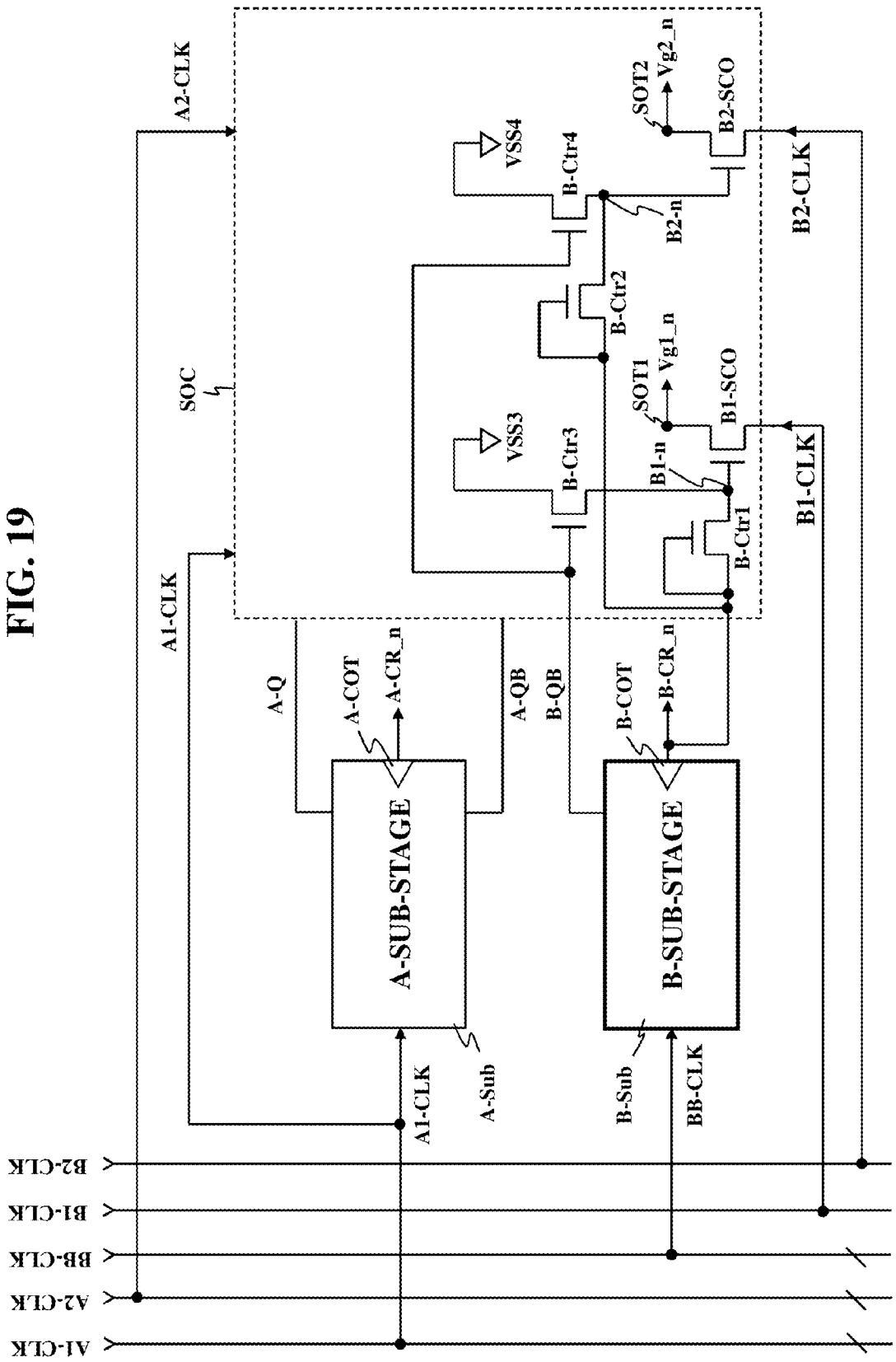
FIG. 19 is a circuit diagram of a tenth embodiment of the scan output controller according to the present invention.

FIG. 19 is a circuit diagram of a tenth embodiment of the scan output controller SOC according to the present invention.

The scan output controller SOC according to the tenth embodiment includes, as shown in FIG. 19, a first B-control switching device B-CTr1, a B1-scan output switching device B1-SCO, a second B-control switching device B-CTr2, a B2-scan output switching device B2-SCO, a third B-control switching device B-CTr3, and a fourth B-control switching device B-CTr4.

The first B-control switching device B-CTr1 in the tenth embodiment is controlled by a B-carry pulse B-CR_n and is connected between a B-carry output terminal B-COT and a B1-node B1-$n$. That is, the first B-control switching device B-CTr1 is turned on or off in response to the B-carry pulse B-CR_n, and interconnects the B-carry output terminal B-COT and the B1-node B1-$n$ when turned on.

The B1-scan output switching device B1-SCO in the tenth embodiment is controlled by a voltage at the B1-node B1-$n$ and is connected between a B1-clock transfer line which transfers a B1-clock pulse B1-CLK and a first scan output terminal SOT 1. That is, the B1-scan output switching device B1-SCO is turned on or off in response to the voltage at the B1-node B1-$n$, and interconnects the B1-clock transfer line and the first scan output terminal SOT1 when turned on.

The second B-control switching device B-CTr2 in the tenth embodiment is controlled by the B-carry pulse B-CR_n and is connected between the B-carry output terminal B-COT and a B2-node B2-$n$. That is, the second B-control switching device B-CTr2 is turned on or off in response to the B-carry pulse B-CR_n, and interconnects the B-carry output terminal B-COT and the B2-node B2-$n$ when turned on.

The B2-scan output switching device B2-SCO in the tenth embodiment is controlled by a voltage at the B2-node B2-$n$ and is connected between a B2-clock transfer line which transfers a B2-clock pulse B2-CLK and a second scan output terminal SOT2. That is, the B2-scan output switching device B2-SCO is turned on or off in response to the voltage at the B2-node B2-$n$, and interconnects the B2-clock transfer line and the second scan output terminal SOT2 when turned on.

The third B-control switching device B-CTr3 in the tenth embodiment is controlled by a voltage at a B-reset node B-QB and is connected between the B1-node B1-$n$ and a third discharging voltage line which transfers a third discharging voltage VSS3. That is, the third B-control switching device B-CTr3 is turned on or off in response to the voltage at the B-reset node B-QB, and interconnects the B1-node B1-$n$ and the third discharging voltage line when turned on.

The fourth B-control switching device B-CTr4 in the tenth embodiment is controlled by the voltage at the B-reset node B-QB and is connected between the B2-node B2-$n$ and a fourth discharging voltage line which transfers a fourth discharging voltage VSS4. That is, the fourth B-control switching device B-CTr4 is turned on or off in response to the voltage at the B-reset node B-QB, and interconnects the B2-node B2-$n$ and the fourth discharging voltage line when turned on.

Figure 20:
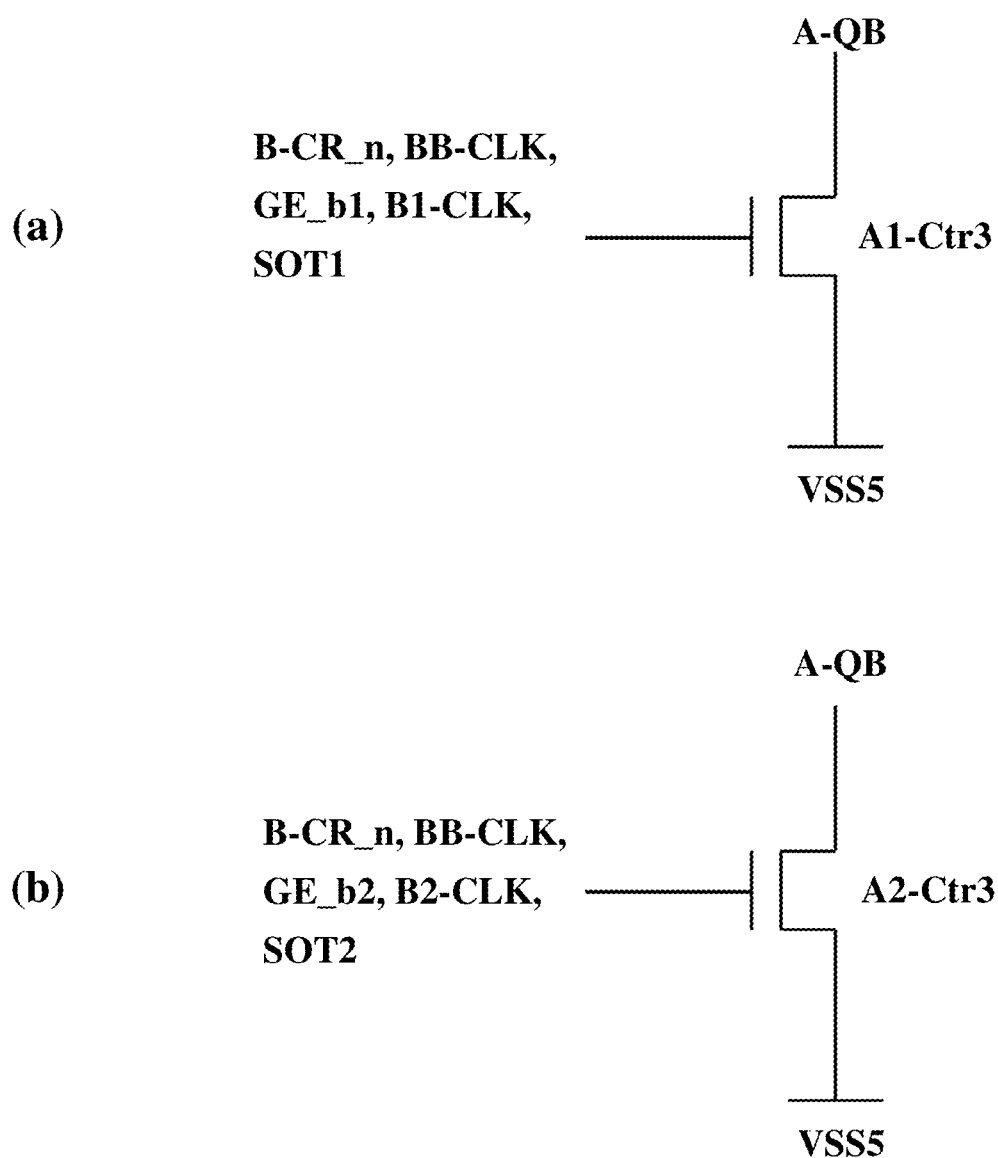
FIGS. 20(a) and 20(b) illustrate switching devices which may be additionally provided in the scan output controller.

FIG. 20 illustrates switching devices which may be additionally provided in the scan output controller SOC. The scan output controller SOC according to each of the above-stated first to tenth embodiments may further include at least one of two control switching devices A1-CTr3 and A2-CTr3 shown in FIG. 20.

Each of the two control switching devices A1-CTr3 and A2-CTr3 will hereinafter be described in detail.

The third A1-control switching device A1-CTr3 shown in FIG. 20(*a*) is controlled by a first control signal applied to the gate electrode thereof and is connected between the A-reset node A-QB and a fifth discharging voltage line which transfers a fifth discharging voltage VSS5. That is, the third A1-control switching device A1-CTr3 is turned on or off in response to the first control signal applied to the gate electrode thereof, and interconnects the A-reset node A-QB and the fifth discharging voltage line when turned on. Here, the first control signal may be any one of the B-carry pulse B-CR_n, the BB-clock pulse BB-CLK, a voltage applied to the gate electrode GE_b1 of the B1-scan output switching device B1-SCO, the B1-clock pulse B1-CLK and a voltage at the first scan output terminal SOT1.

The third A2-control switching device A2-CTr3 shown in FIG. 20(*b*) is controlled by a second control signal applied to the gate electrode thereof and is connected between the A-reset node A-QB and the fifth discharging voltage line which transfers the fifth discharging voltage VSS5. That is, the third A2-control switching device A2-CTr3 is turned on or off in response to the second control signal applied to the gate electrode thereof, and interconnects the A-reset node A-QB and the fifth discharging voltage line when turned on. Here, the second control signal may be any one of the B-carry pulse B-CR_n, the BB-clock pulse BB-CLK, a voltage applied to the gate electrode GE_b2 of the B2-scan output switching device B2-SCO, the B2-clock pulse B2-CLK and a voltage at the second scan output terminal SOT2.

Figure 21:
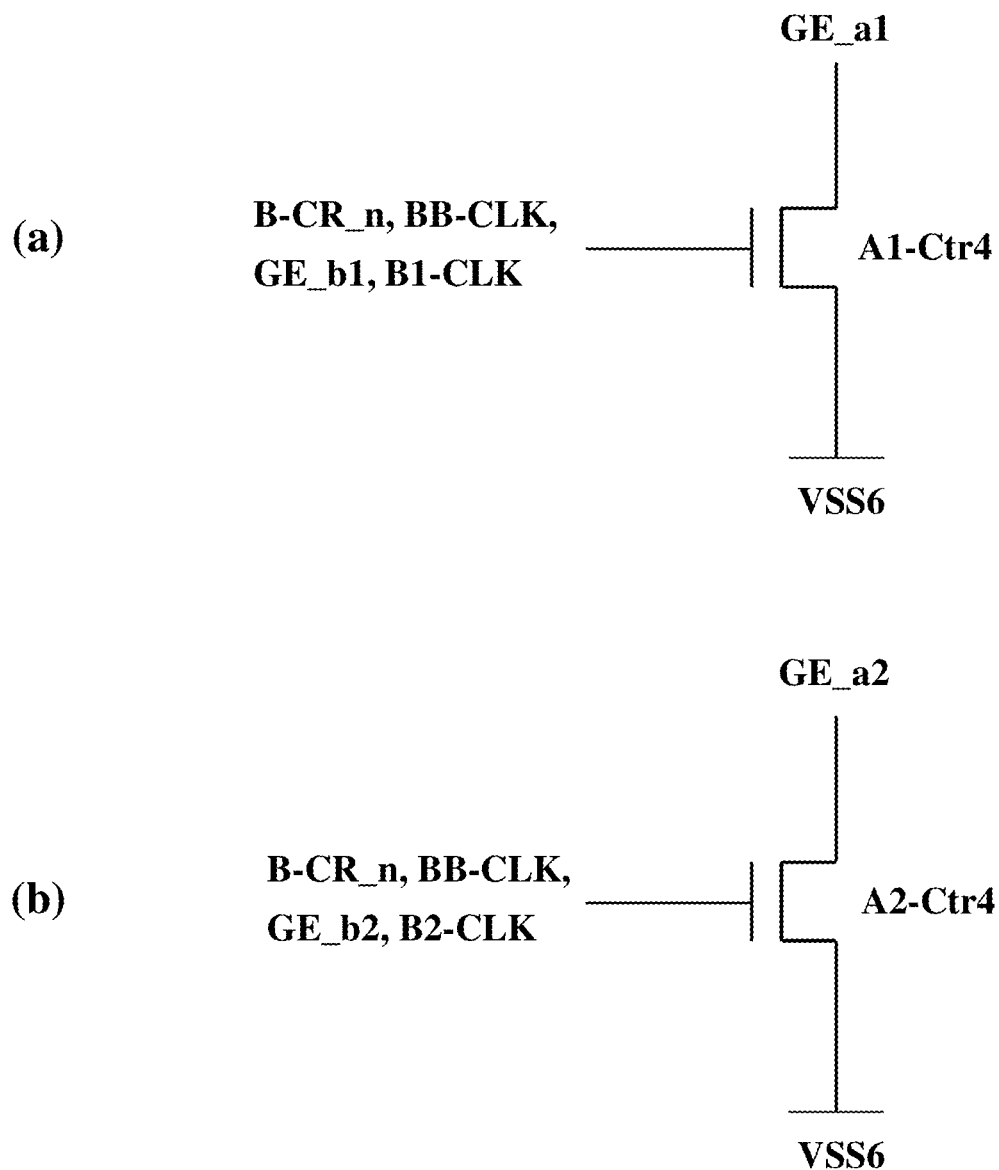
FIGS. 21(a) and 21(b) illustrate other switching devices which may be additionally provided in the scan output controller.

FIG. 21 illustrates other switching devices which may be additionally provided in the scan output controller SOC. The scan output controller SOC according to each of the above-stated first to tenth embodiments may further include at least one of two control switching devices A1-CTr4 and A2-CTr4 shown in FIG. 21.

Each of the two control switching devices A1-CTr4 and A2-CTr4 will hereinafter be described in detail.

The fourth A1-control switching device A1-CTr4 shown in FIG. 21(*a*) is controlled by a third control signal applied to the gate electrode thereof and is connected between the gate electrode GE_a1 of the A1-scan output switching device A1-SCO and a sixth discharging voltage line which transfers a sixth discharging voltage VSS6. That is, the fourth A1-control switching device A1-CTr4 is turned on or off in response to the third control signal applied to the gate electrode thereof, and interconnects the gate electrode GE_a1 of the A1-scan output switching device A1-SCO and the sixth discharging voltage line when turned on. Here, the third control signal may be any one of the B-carry pulse B-CR_n, the BB-clock pulse BB-CLK, a voltage applied to the gate electrode GE_b1 of the B1-scan output switching device B1-SCO and the B1-clock pulse B1-CLK.

The fourth A2-control switching device A2-CTr4 shown in FIG. 21(*b*) is controlled by a fourth control signal applied to the gate electrode thereof and is connected between the gate electrode GE_a2 of the A2-scan output switching device A2-SCO and the sixth discharging voltage line which transfers the sixth discharging voltage VSS6. That is, the fourth A2-control switching device A2-CTr4 is turned on or off in response to the fourth control signal applied to the gate electrode thereof, and interconnects the gate electrode GE_a2 of the A2-scan output switching device A2-SCO and the sixth discharging voltage line when turned on. Here, the fourth control signal may be any one of the B-carry pulse B-CR_n, the BB-clock pulse BB-CLK, a voltage applied to the gate electrode GE_b2 of the B2-scan output switching device B2-SCO and the B2-clock pulse B2-CLK.

Figure 22:
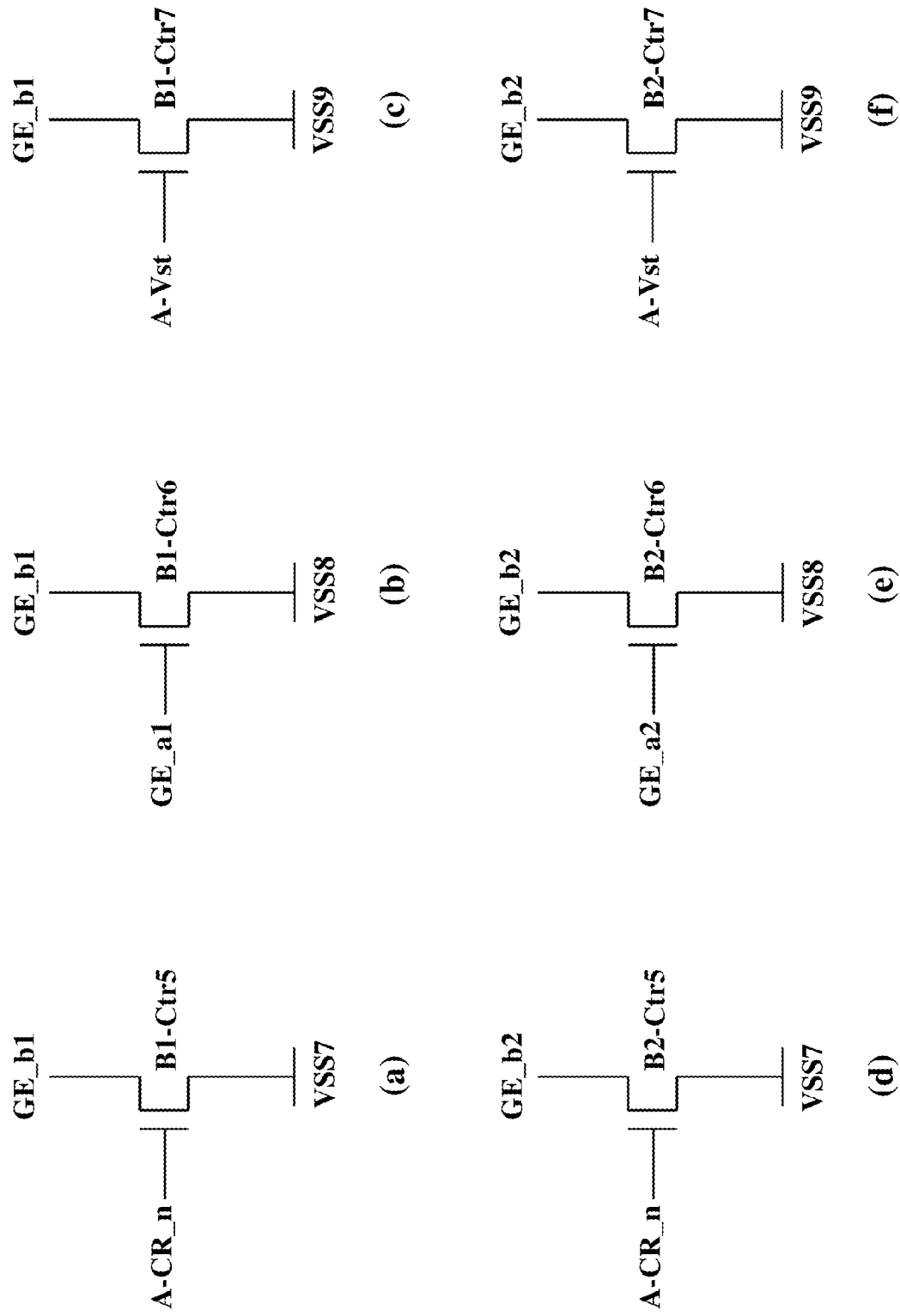
FIGS. 22 (a)-22(f) illustrate other switching devices which may be additionally provided in the scan output controller.

FIG. 22 illustrates other switching devices which may be additionally provided in the scan output controller SOC. The scan output controller SOC according to each of the above-stated first to tenth embodiments may further include at least one of six control switching devices B1-CTr5 to B1-CTr7 and B2-CTr5 to B2-CTr7 shown in FIG. 22.

Each of the six control switching devices B1-CTr5 to B1-CTr7 and B2-CTr5 to B2-CTr7 will hereinafter be described in detail.

The fifth B1-control switching device B1-CTr5 shown in FIG. 22(*a*) is controlled by the A-carry pulse A-CR_n and is connected between the gate electrode GE_b1 of the B1-scan output switching device B1-SCO and a seventh discharging voltage line which transfers a seventh discharging voltage VSS7. That is, the fifth B1-control switching device B1-CTr5 is turned on or off in response to the A-carry pulse A-CR_n, and interconnects the gate electrode GE_b1 of the B1-scan output switching device B1-SCO and the seventh discharging voltage line when turned on.

The sixth B1-control switching device B1-CTr6 shown in FIG. 22(*b*) is controlled by a voltage applied to the gate electrode GE_a1 of the A1-scan output switching device A1-SCO and is connected between the gate electrode GE_b1 of the B1-scan output switching device B1-SCO and an eighth discharging voltage line which transfers an eighth discharging voltage VSS8. That is, the sixth B1-control switching device B1-CTr6 is turned on or off in response to the voltage applied to the gate electrode GE_a1 of the A1-scan output switching device A1-SCO, and interconnects the gate electrode GE_b1 of the B1-scan output switching device B1-SCO and the eighth discharging voltage line when turned on.

The seventh B1-control switching device B1-CTr7 shown in FIG. 22(*c*) is controlled by an external A-start pulse A-Vst and is connected between the gate electrode GE_b1 of the B1-scan output switching device B1-SCO and a ninth discharging voltage line which transfers a ninth discharging voltage VSS9. That is, the seventh B1-control switching device B1-CTr7 is turned on or off in response to the A-start pulse A-Vst, and interconnects the gate electrode GE_b1 of the B1-scan output switching device B1-SCO and the ninth discharging voltage line when turned on.

The fifth B2-control switching device B2-CTr5 shown in FIG. 22(*d*) is controlled by the A-carry pulse A-CR_n and is connected between the gate electrode GE_b2 of the B2-scan output switching device B2-SCO and the seventh discharging voltage line which transfers the seventh discharging voltage VSS7. That is, the fifth B2-control switching device B2-CTr5 is turned on or off in response to the A-carry pulse A-CR_n, and interconnects the gate electrode GE_b2 of the B2-scan output switching device B2-SCO and the seventh discharging voltage line when turned on.

The sixth B2-control switching device B2-CTr6 shown in FIG. 22(*e*) is controlled by a voltage applied to the gate electrode GE_a2 of the A2-scan output switching device A2-SCO and is connected between the gate electrode GE_b2 of the B2-scan output switching device B2-SCO and the eighth discharging voltage line which transfers the eighth discharging voltage VSS8. That is, the sixth B2-control switching device B2-CTr6 is turned on or off in response to the voltage applied to the gate electrode GE_a2 of the A2-scan output switching device A2-SCO, and interconnects the gate electrode GE_b2 of the B2-scan output switching device B2-SCO and the eighth discharging voltage line when turned on.

The seventh B2-control switching device B2-CTr7 shown in FIG. 22(f) is controlled by the external A-start pulse A-Vst and is connected between the gate electrode GE_b2 of the B2-scan output switching device B2-SCO and the ninth discharging voltage line which transfers the ninth discharging voltage VSS9. That is, the seventh B2-control switching device B2-CTr7 is turned on or off in response to the A-start pulse A-Vst, and interconnects the gate electrode GE_b2 of the B2-scan output switching device B2-SCO and the ninth discharging voltage line when turned on.

Hereinafter, the configurations of the A-sub-stage A-Sub and B-sub-stage B-Sub of each stage will be described in detail.

First Embodiment of Stage

Figure 23:
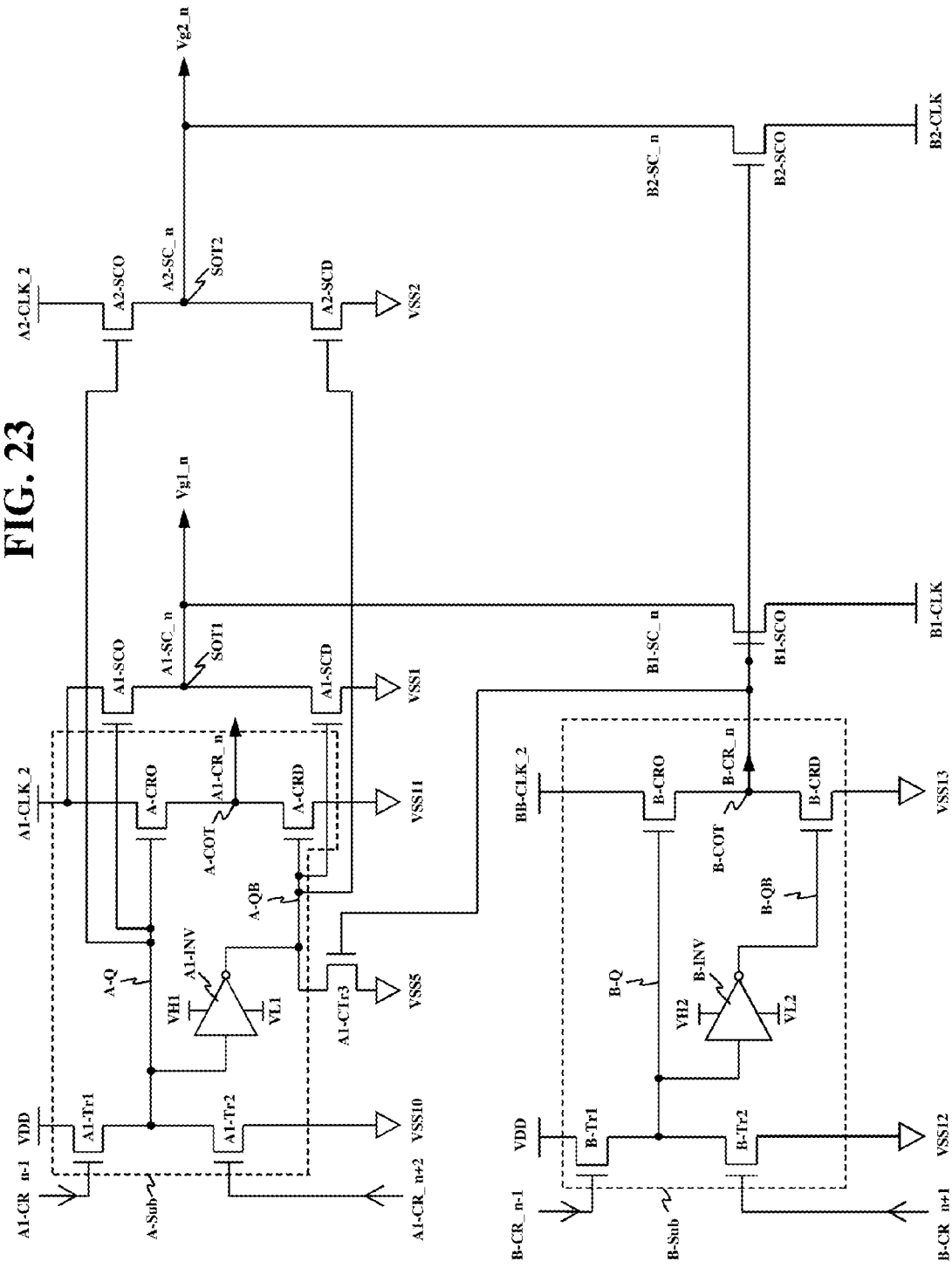
FIG. 23 is a circuit diagram of a first embodiment of a circuit configuration of an A-sub-stage, a B-sub-stage and a scan output controller provided in an nth stage in FIG. 1.

FIG. 23 is a circuit diagram of a first embodiment of a circuit configuration of an A-sub-stage A-Sub, a B-sub-stage B-Sub and a scan output controller (the reference character SOC is not shown in the drawing) provided in the nth stage. The scan output controller SOC in FIG. 23 includes switching devices A1-CTr3, A1-SCO, A2-SCO, A1-SCD A2-SCD, B1-SCO and B2-SCO other than switching devices surrounded by dotted boxes. The switching devices included in the scan output controller SOC in FIG. 23 are ones selected from among the switching devices provided in the scan output controller SOC according to each of the above-stated first to tenth embodiments. For example, the A1-scan output switching device A1-SCO, B1-scan output switching device B1-SCO and third A1-control switching device A1-CTr3 in FIG. 23 are the same as the A1-scan output switching device A1-SCO in FIG. 9, the B1-scan output switching device B1-SCO in FIG. 15 and the third A1-control switching device A1-CTr3 in FIG. 20, respectively.

Configuration of a-Sub-Stage a-Sub of Nth Stage

The A-sub-stage A-Sub of the nth stage (referred to hereinafter as an nth A-sub-stage A-Sub) includes a first A-switching device A-Tr1, a second A-switching device A-Tr2, an A-inverter A-INV, an A-carry output switching device A-CRO, and an A-carry discharge switching device A-CRD, as shown in FIG. 23.

The first A-switching device A-Tr1 of the nth A-sub-stage A-Sub is controlled by an A-set control signal (for example, an A1-carry pulse A1-CR from an (n−1)th A-sub-stage A-Sub) and is connected between a charging voltage line and an A-set node A-Q. That is, the first A-switching device A-Tr1 is turned on or off in response to the A1-carry pulse A1-CR from the (n−1)th A-sub-stage A-Sub, and interconnects the charging voltage line and the A-set node A-Q when turned on. Here, the charging voltage line is supplied with a charging voltage VDD. This charging voltage VDD is a DC voltage having a value capable of turning on corresponding switching devices, which is a high voltage higher than the above-stated uth discharging voltage (where u is a natural number).

Exceptionally, because there is no stage upstream of the first stage which operates earliest among all stages in one frame period T_F, the A-sub-stage A-Sub of the first stage (referred to hereinafter as a first A-sub-stage A-Sub) is supplied with an A-start pulse A-Vst from a timing controller (not shown). As a result, the first A-switching device A-Tr1 of the first A-sub-stage A-Sub is supplied with the A-start pulse A-Vst instead of an upstream A1-carry pulse A1-CR.

The second A-switching device A-Tr2 of the nth A-sub-stage A-Sub is controlled by an A-reset control signal (for example, an A1-carry pulse A1-CR from an (n+2)th A-sub-stage A-Sub) and is connected between the A-set node A-Q and a tenth discharging voltage line which transfers a tenth discharging voltage VSS10. That is, the second A-switching device A-Tr2 is turned on or off in response to the A1-carry pulse A1-CR from the (n+2)th A-sub-stage A-Sub, and interconnects the A-set node A-Q and the tenth discharging voltage line when turned on.

The A-inverter A-INV of the nth A-sub-stage A-Sub controls a voltage at an A-reset node A-QB based on a voltage at the A-set node A-Q such that the voltage at the A-set node A-Q and the voltage at the A-reset node A-QB have opposite logics. For example, when the voltage at the A-set node A-Q is high, the A-inverter A-INV makes the voltage at the A-reset node A-QB low. Conversely, when the voltage at the A-set node A-Q is low, the A-inverter A-INV makes the voltage at the A-reset node A-QB high. Here, the A-inverter A-INV makes the voltage at the A-reset node A-QB high using a first high voltage VH1, and low using a first low voltage VL1.

The A-carry output switching device A-CRO of the nth A-sub-stage A-Sub is controlled by the voltage at the A-set node A-Q and is connected between any one A1-clock transfer line which transfers an A1-clock pulse (for example, a second A1-clock pulse A1-CLK_2) and an A-carry output terminal A-COT of the nth A-sub-stage A-Sub. That is, the A-carry output switching device A-CRO is turned on or off in response to the voltage at the A-set node A-Q, and interconnects the A1-clock transfer line and the A-carry output terminal A-COT when turned on.

The A-carry discharge switching device A-CRD of the nth A-sub-stage A-Sub is controlled by the voltage at the A-reset node A-QB and is connected between the A-carry output terminal A-COT and an eleventh discharging voltage line which transfers an eleventh discharging voltage VSS11. That is, the A-carry discharge switching device A-CRD is turned on or off in response to the voltage at the A-reset node A-QB, and interconnects the A-carry output terminal A-COT and the eleventh discharging voltage line when turned on.

Configuration of B-Sub-Stage B-Sub of Nth Stage

The B-sub-stage B-Sub of the nth stage (referred to hereinafter as an nth B-sub-stage B-Sub) includes a first B-switching device B-Tr1, a second B-switching device B-Tr2, a B-inverter B-INV, a B-carry output switching device B-CRO, and a B-carry discharge switching device B-CRD, as shown in FIG. 23.

The first B-switching device B-Tr1 of the nth B-sub-stage B-Sub is controlled by a B-set control signal (for example, a B-carry pulse B-CR from an (n−1)th B-sub-stage B-Sub) and is connected between the charging voltage line which transfers the charging voltage VDD and a B-set node B-Q. That is, the first B-switching device B-Tr1 is turned on or off in response to the B-carry pulse B-CR from the (n−1)th B-sub-stage B-Sub, and interconnects the charging voltage line and the B-set node B-Q when turned on.

Exceptionally, because there is no stage upstream of the first stage which operates earliest among all stages in one frame period T_F, the B-sub-stage B-Sub of the first stage (referred to hereinafter as a first B-sub-stage B-Sub) is supplied with a B-start pulse B-Vst from the timing controller (not shown). As a result, the first B-switching device B-Tr1 of the first B-sub-stage B-Sub is supplied with the B-start pulse B-Vst instead of an upstream B-carry pulse B-CR.

The second B-switching device B-Tr2 of the nth B-sub-stage B-Sub is controlled by a B-reset control signal (for example, a B-carry pulse B-CR from an (n+1)th B-sub-stage B-Sub) and is connected between the B-set node B-Q and a twelfth discharging voltage line which transfers a twelfth discharging voltage VSS12. That is, the second B-switching device B-Tr2 is turned on or off in response to the B-carry pulse B-CR from the (n+1)th B-sub-stage B-Sub, and interconnects the B-set node B-Q and the twelfth discharging voltage line when turned on.

The B-inverter B-INV of the nth B-sub-stage B-Sub controls a voltage at a B-reset node B-QB based on a voltage at the B-set node B-Q such that the voltage at the B-set node B-Q and the voltage at the B-reset node B-QB have opposite logics. For example, when the voltage at the B-set node B-Q is high, the B-inverter B-INV makes the voltage at the B-reset node B-QB low. Conversely, when the voltage at the B-set node B-Q is low, the B-inverter B-INV makes the voltage at the B-reset node B-QB high. Here, the B-inverter B-INV makes the voltage at the B-reset node B-QB high using a second high voltage VH2, and low using a second low voltage VL2.

The B-carry output switching device B-CRO of the nth B-sub-stage B-Sub is controlled by the voltage at the B-set node B-Q and is connected between any one BB-clock transfer line which transfers a BB-clock pulse (for example, a second BB-clock pulse BB-CLK_2) and a B-carry output terminal B-COT of the nth B-sub-stage B-Sub. That is, the B-carry output switching device B-CRO is turned on or off in response to the voltage at the B-set node B-Q, and interconnects the BB-clock transfer line and the B-carry output terminal B-COT when turned on.

The B-carry discharge switching device B-CRD of the nth B-sub-stage B-Sub is controlled by the voltage at the B-reset node B-QB and is connected between the B-carry output terminal B-COT and a thirteenth discharging voltage line which transfers a thirteenth discharging voltage VSS13. That is, the B-carry discharge switching device B-CRD is turned on or off in response to the voltage at the B-reset node B-QB, and interconnects the B-carry output terminal B-COT and the thirteenth discharging voltage line when turned on.

The operations of the A-sub-stage A-Sub and B-sub-stage B-Sub with the above-stated configurations will hereinafter be described in detail.

First, the operation of the A-sub-stage A-Sub will be described with reference to FIGS. 4 to 8 and the configurations of the A-sub-stage A-Sub and B-sub-stage B-Sub in FIG. 23.

1) Set Time

At a set time t_s of the nth A-sub-stage A-Sub, the A1-carry pulse (A1-CR_n−1 in FIG. 5) of the high state from the (n−1)th A-sub-stage A-Sub is supplied to the first A-switching device A-Tr1 of the nth A-sub-stage A-Sub. Accordingly, the first A-switching device A-Tr1 is turned on, and the charging voltage VDD is supplied to the A-set node A-Q of the nth A-sub-stage A-Sub through the turned-on first A-switching device A-Tr1. As a result, the A-set node A-Q is charged, and the A-carry output switching device A-CRO, A1-scan output switching device A1-SCO and A2-scan output switching device A2-SCO, connected to the charged A-set node A-Q through the gate electrodes thereof, are turned on.

Also, because the voltage at the charged A-set node A-Q is high, the A-inverter A-INV discharges the A-reset node A-QB to the first low voltage VL1. As a result, the A-carry discharge switching device A-CRD, A1-scan discharge switching device A1-SCD and A2-scan discharge switching device A2-SCD, connected to the discharged A-reset node A-QB through the gate electrodes thereof, are turned off.

On the other hand, at the set time t_s of the nth A-sub-stage A-Sub, the A1-carry pulse A1-CR_n+2 from the (n+2)th A-sub-stage A-Sub is low, thereby causing the second A-switching device A-Tr2, supplied with the A1-carry pulse A1-CR_n+2 through the gate electrode thereof, to be turned off.

Also, at the set time t_s of the nth A-sub-stage A-Sub, the B-set node B-Q of the nth B-sub-stage B-Sub is kept charged by the B-carry pulse B-CR from the (n−1)th B-sub-stage B-Sub, and the B-reset node B-QB of the nth B-sub-stage B-Sub is kept discharged by the B-carry pulse B-CR from the (n−1)th B-sub-stage B-Sub. As a result, the B-carry output switching device B-CRO is kept on, and the B-carry discharge switching device B-CRD is kept off. At this time, the second BB-clock pulse BB-CLK_2 is low. Accordingly, a B-carry pulse B-CR_n of the low state is output through the turned-on B-carry output switching device B-CRO. The output B-carry pulse B-CR_n of the low state is supplied to the gate electrode of the B1-scan output switching device B1-SCO, the gate electrode of the B2-scan output switching device B2-SCO and the gate electrode of the third A1-control switching device A1-CTr3 through the B-carry output terminal B-COT.

As a result, at the set time t_s of the nth A-sub-stage A-Sub, the B1-scan output switching device B1-SCO, the B2-scan output switching device B2-SCO and the third A1-control switching device A1-CTr3 are all turned off.

In this manner, at the set time t_s of the A-sub-stage A-Sub, the A-set node A-Q of the A-sub-stage A-Sub is charged and the A-reset node A-QB of the A-sub-stage A-Sub is discharged, so that the A-sub-stage A-Sub is set.

2) Output Time

Thereafter, at an output time t_o of the nth A-sub-stage A-Sub, the second A1-clock pulse A1-CLK_2 is applied to the nth A-sub-stage A-Sub. That is, the second A1-clock pulse A1-CLK_2 is applied to both the turned-on A-carry output switching device A-CRO and A1-scan output switching device A1-SCO. Thus, an A1-carry pulse (A1-CR_n in FIG. 5) is output via the turned-on A-carry output switching device A-CRO, and an A1-scan pulse (A1-SC_n in FIG. 4) is output via the turned-on A1-scan output switching device A1-SCO.

Also, at a falling time TL of the first A1-clock pulse A1-CLK_1, the first A1-clock pulse A1-CLK_1 makes a high to low transition, so that the (n−1)th A1-carry pulse A1-CR_n−1 generated by the first A1-clock pulse A1-CLK_1 makes a high to low transition, thereby causing the first A-switching device A-Tr1 of the nth A-sub-stage A-Sub to be turned off. As a result, the A-set node A-Q of the nth A-sub-stage A-Sub floats at the falling time TL, and the voltage at the A-set node A-Q is thus bootstrapped by a coupling phenomenon at the moment that the second A1-clock pulse A1-CLK_2 is input to the A-sub-stage A-Sub at the falling time TL. Accordingly, the A-carry output switching device A-CRO and the A1-scan output switching device A1-SCO are almost completely turned on, so that the A1-carry pulse A1-CR_n and the A1-scan pulse A1-SC_n are stably output therefrom.

Also, at the output time t_o of the nth A-sub-stage A-Sub, the second A2-clock pulse A2-CLK_2 is applied to the A2-scan output switching device A2-SCO. That is, the second A2-clock pulse A2-CLK_2 is applied to the turned-on A2-scan output switching device A2-SCO. Thus, an A2-scan pulse (A2-SC_n in FIG. 6) is output via the turned-on A2-scan output switching device A2-SCO. At this time, the voltage at the A-set node A-Q is bootstrapped by a coupling phenomenon at the moment that the second A2-clock pulse A2-CLK_2 is input to the A2-scan output switching device A2-SCO at the above falling time TL. Accordingly, the A2-scan output switching device A2-SCO is almost completely turned on, so that the A2-scan pulse A2-SC_n is stably output therefrom.

In this manner, in the present invention, the A-set node A-Q is bootstrapped using the A1-clock pulse A1-CLK and the A2-clock pulse A2-CLK, not a constant voltage, and the floating structure, so that the A1-carry pulse A1-CR, the A1-scan pulse A1-SC and the A2-scan pulse A2-SC can be stably output even using the A1-clock pulse A1-CLK and A2-clock pulse A2-CLK of the relatively low voltages. Further, the stabilization of the output voltages by the bootstrapping makes it possible to prevent the output voltages from being attenuated even if the size of each of the A1-scan output switching device A1-SCO and A2-scan output switching device A2-SCO is made to be relatively small.

The A1-carry pulse A1-CR_n output through the A-carry output terminal A-COT is supplied to the (n+1)th A-sub-stage A-Sub and the (n−2)th A-sub-stage A-Sub. Therefore, the (n+1)th A-sub-stage A-Sub is set and the (n−2)th A-sub-stage A-Sub is reset.

The A1-scan pulse A1-SC_n output through the first scan output terminal SOT1 is also supplied to an mth gate line, and the A2-scan pulse A2-SC_n output through the second scan output terminal SOT2 is also supplied to an (m+1)th gate line.

At the output time t_o of the nth A-sub-stage A-Sub, the B1-scan output switching device B1-SCO and the B2-scan output switching device B2-SCO are both kept off.

3) Reset Time

Thereafter, at a reset time t_r of the nth A-sub-stage A-Sub, the A1-carry pulse (A1-CR_n+2 in FIG. 5) from the (n+2)th A-sub-stage A-Sub becomes high, thereby causing the second A-switching device A-Tr2 of the nth A-sub-stage A-Sub, supplied with the A1-carry pulse A1-CR_n+2, to be turned on. As a result, the tenth discharging voltage VSS10 is supplied to the A-set node A-Q through the turned-on second A-switching device A-Tr2. Accordingly, the A-set node A-Q is discharged, and the A-carry output switching device A-CRO, A1-scan output switching device A1-SCO and A2-scan output switching device A2-SCO, connected to the discharged A-set node A-Q through the gate electrodes thereof, are turned off.

Also, because the voltage at the discharged A-set node A-Q is low, the A-inverter A-INV charges the A-reset node A-QB to the first high voltage VH1. As a result, the A-carry discharge switching device A-CRD, A1-scan discharge switching device A1-SCD and A2-scan discharge switching device A2-SCD, connected to the charged A-reset node A-QB through the gate electrodes thereof, are turned on.

Accordingly, the eleventh discharging voltage VSS11 is output to the A-carry output terminal A-COT via the turned-on A-carry discharge switching device A-CRD, the first discharging voltage VSS1 is output to the first scan output terminal SOT1 via the turned-on A1-scan discharge switching device A1-SCD, and the second discharging voltage VSS2 is output to the second scan output terminal SOT2 via the turned-on A2-scan discharge switching device A2-SCD. Here, the first discharging voltage VSS1 output through the first scan output terminal SOT1 is supplied to the mth gate line, and the second discharging voltage VSS2 output through the second scan output terminal SOT2 is supplied to the (m+1)th gate line.

On the other hand, the eleventh discharging voltage VSS11 output through the A-carry output terminal A-COT is supplied to the (n+1)th A-sub-stage A-Sub and the (n−2)th A-sub-stage A-Sub.

At the reset time t_r of the nth A-sub-stage A-Sub, the third A1-control switching device A1-CTr3, the B1-scan output switching device B1-SCO and the B2-scan output switching device B2-SCO are all kept off.

After all A-sub-stages A-Sub output A1-carry pulses A1-CR once in the above manner, the second BB-clock pulse BB-CLK_2 and B1-clock pulse B1-CLK of the high state are applied to the nth stage ST_n in the B1-output period T_B1 of this frame period T_F. That is, the second BB-clock pulse BB-CLK_2 of the high state is applied to the B-carry output switching device B-CRO of the nth B-sub-stage B-Sub. Because the B-carry output switching device B-CRO has already been turned on, the second BB-clock pulse BB-CLK_2 of the high state applied thereto is output as a B-carry pulse (B-CR_n in FIG. 8) through the B-carry output terminal B-COT.

Here, the high state of each of the BB-clock pulses BB-CLK_1 and BB-CLK_2 may be set to have a voltage higher than that of the high state of the B1-clock pulse B1-CLK. In this case, the voltage at the B-carry output terminal B-COT may be boosted, thereby causing the B1-scan output switching device B1-SCO and the B2-scan output switching device B2-SCO to be almost completely turned on. Therefore, a B1-scan pulse B1-SC_n and a B2-scan pulse B2-SC_n may be stably output from the B1-scan output switching device B1-SCO and the B2-scan output switching device B2-SCO, respectively.

In this manner, in the present invention, the voltage at the B-carry output terminal B-COT can be boosted using the BB-clock pulse BB-CLK and the B1-clock pulse B1-CLK, which has a voltage lower than that of the BB-clock pulse BB-CLK, not a constant voltage. That is, the B1-scan pulse B1-SC and the B2-scan pulse B2-SC_n can be stably output even using the B1-clock pulse B1-CLK and B2-clock pulse B2-CLK of the relatively low voltages. Further, because the output voltages are stabilized by the boosting of the voltage at the B-carry output terminal B-COT, they can be prevented from being attenuated even if the size of each of the B1-scan output switching device B1-SCO and B2-scan output switching device B2-SCO is made to be relatively small.

The B-carry pulse B-CR_n of the high state, output through the B-carry output terminal B-COT in the above manner, is applied to the (n+1)th B-sub-stage B-Sub, the (n−1)th B-sub-stage B-Sub and the third A1-control switching device A1-CTr3 of the nth A-sub-stage A-Sub, as well as the B1-scan output switching device B1-SCO and B2-scan output switching device B2-SCO of the nth stage, as stated previously. Therefore, the (n+1)th B-sub-stage B-Sub is set and the (n−1)th B-sub-stage B-Sub is reset.

On the other hand, the above B-carry pulse B-CR_n of the high state is applied to the gate electrode of the third A1-control switching device A1-CTr3, so as to turn on the third A1-control switching device A1-CTr3. As a result, the fifth discharging voltage VSS5 is supplied to the A-reset node A-QB through the turned-on third A1-control switching device A1-CTr3, so as to discharge the A-reset node A-QB. Accordingly, the A-carry discharge switching device A-CRD, connected to the discharged A-reset node A-QB through the gate electrode thereof, is turned off.

Also, the B1-clock pulse B1-CLK is applied to the first scan output terminal SOT1 through the turned-on B1-scan output switching device B1-SCO. That is, the B1-clock pulse B1-CLK applied to the first scan output terminal SOT1 is the very B1-scan pulse (B1-SC_n in FIG. 4).

Also, the B2-clock pulse B2-CLK is applied to the second scan output terminal SOT2 through the turned-on B2-scan output switching device B2-SCO. That is, the B2-clock pulse B2-CLK applied to the second scan output terminal SOT2 is the very B2-scan pulse (B2-SC_n in FIG. 6).

The B1-scan pulse B1-SC_n output through the first scan output terminal SOT1 is applied to the mth gate line, and the B2-scan pulse B2-SC_n output through the second scan output terminal SOT2 is applied to the (m+1)th gate line.

Thereafter, at a reset time of the nth B-sub-stage B-Sub, the B-carry pulse B-CR_n+1 from the (n+1)th B-sub-stage B-Sub becomes high, thereby causing the second B-switching device B-Tr2 of the nth B-sub-stage B-Sub, supplied with the B-carry pulse B-CR_n+1, to be turned on. As a result, the twelfth discharging voltage VSS12 is supplied to the B-set node B-Q through the turned-on second B-switching device B-Tr2. Accordingly, the B-set node B-Q is discharged, and the B-carry output switching device B-CRO, connected to the discharged B-set node B-Q through the gate electrode thereof, is turned off.

In addition, because the voltage at the discharged B-set node B-Q is low, the B-inverter B-INV charges the B-reset node B-QB to the second high voltage VH2. As a result, the B-carry discharge switching device B-CRD, connected to the charged B-reset node B-QB through the gate electrode thereof, is turned on.

Accordingly, the thirteenth discharging voltage VSS13 is output to the B-carry output terminal B-COT via the turned-on B-carry discharge switching device B-CRD. The thirteenth discharging voltage VSS13 output through the B-carry output terminal B-COT is applied to the (n+1)th B-sub-stage B-Sub, the (n−1)th B-sub-stage B-Sub, the third A1-control switching device A1-CTr3 of the nth A-sub-stage A-Sub, the B1-scan output switching device B1-SCO of the nth B-sub-stage B-Sub and the B2-scan output switching device B2-SCO of the nth B-sub-stage B-Sub. As a result, the third A1-control switching device A1-CTr3, the B1-scan output switching device B1-SCO and the B2-scan output switching device B2-SCO are all turned off.

Second Embodiment of Stage

Figure 24:
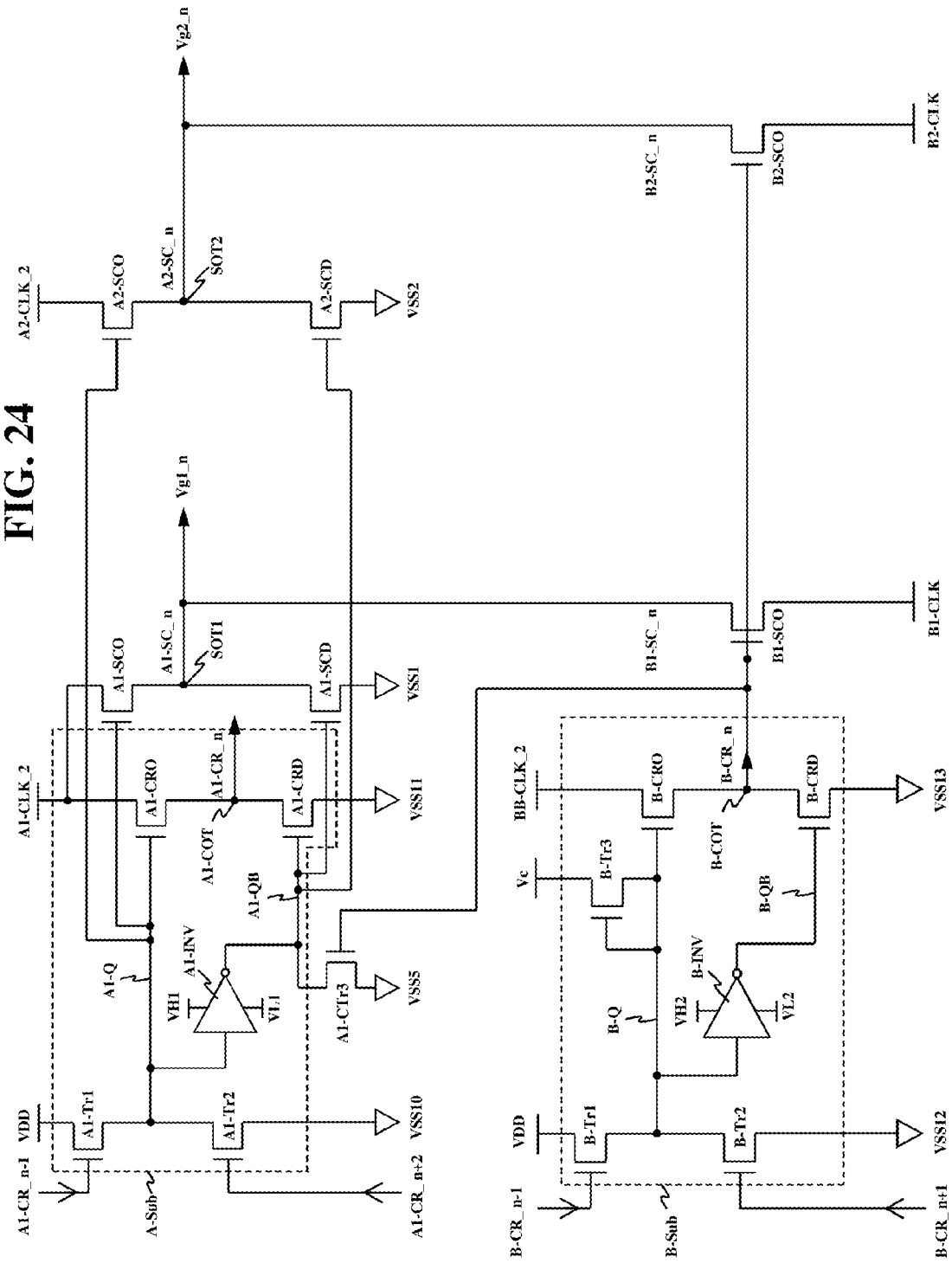
FIG. 24 is a circuit diagram of a second embodiment of the circuit configuration of the A-sub-stage, B-sub-stage and scan output controller provided in the nth stage.

FIG. 24 is a circuit diagram of a second embodiment of the circuit configuration of the A-sub-stage A-Sub, B-sub-stage B-Sub and scan output controller SOC provided in the nth stage.

The configurations of the A-sub-stage A-Sub and scan output controller SOC in the second embodiment are the same as those in the first embodiment, stated above, respectively, and a description thereof will thus be replaced by the above description of the first embodiment.

The B-sub-stage B-Sub in the second embodiment further includes a third B-switching device B-Tr3, compared with that in the first embodiment, as shown in FIG. 24.

The third B-switching device B-Tr3 in the second embodiment is controlled by the voltage at the B-set node B-Q and is connected between a control transfer line which transfers an external switching control signal Vc and the B-set node B-Q. That is, the third B-switching device B-Tr3 is turned on or off in response to the voltage at the B-set node B-Q, and interconnects the control transfer line which transfers the switching control signal Vc and the B-set node B-Q when turned on. Refer to the above description of FIG. 17 for a description of the switching control signal Vc.

Third Embodiment of Stage

Figure 25:
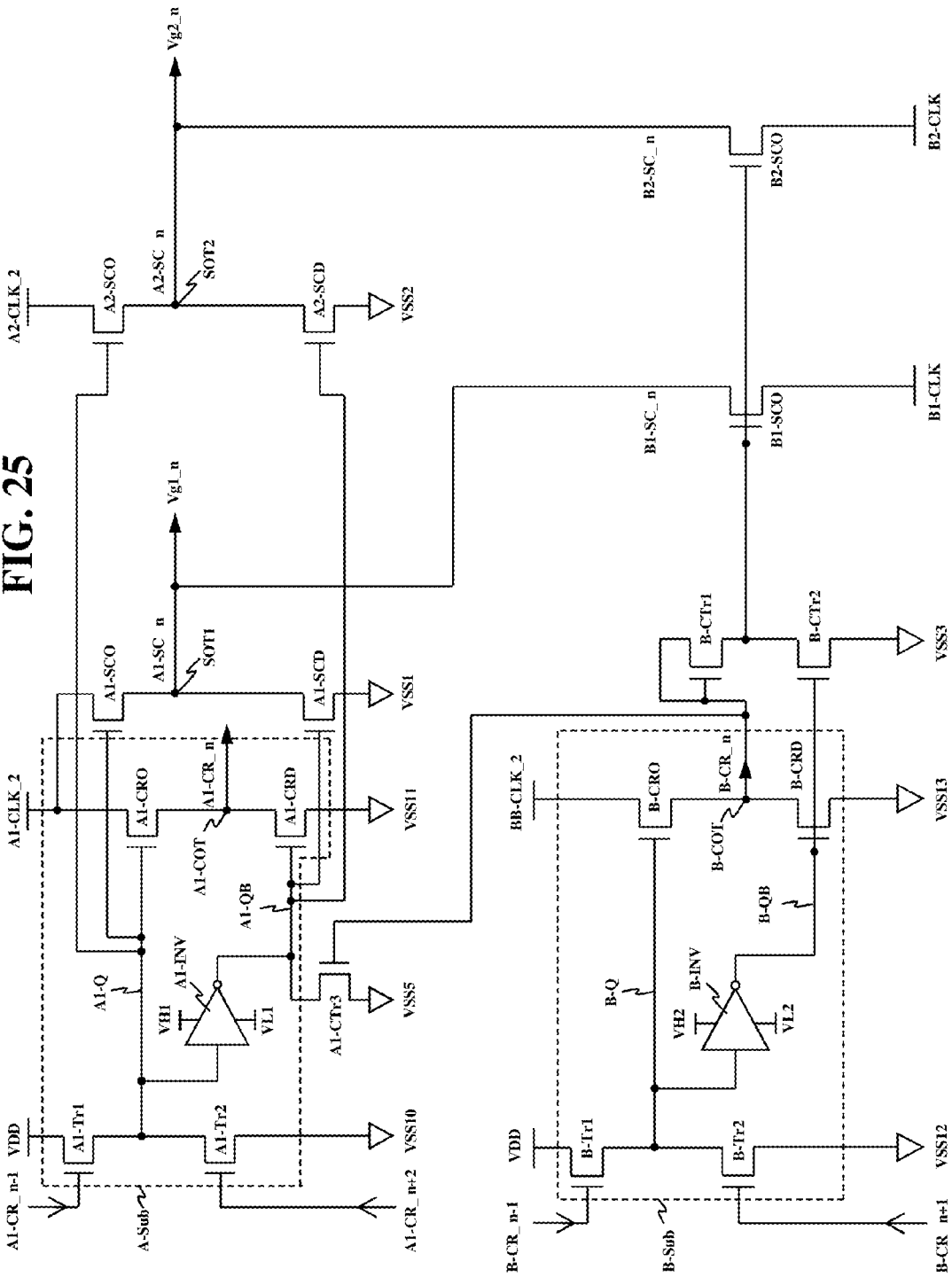
FIG. 25 is a circuit diagram of a third embodiment of the circuit configuration of the A-sub-stage, B-sub-stage and scan output controller provided in the nth stage.

FIG. 25 is a circuit diagram of a third embodiment of the circuit configuration of the A-sub-stage A-Sub, B-sub-stage B-Sub and scan output controller SOC provided in the nth stage.

The configurations of the A-sub-stage A-Sub and B-sub-stage B-Sub in the third embodiment are the same as those in the first embodiment, stated above, respectively, and a description thereof will thus be replaced by the above description of the first embodiment.

The scan output controller SOC in the third embodiment further includes a first B-control switching device B-CTr1 and a second B-control switching device B-CTr2, compared with that in the first embodiment, as shown in FIG. 25.

The first B-control switching device B-CTr1 and the second B-control switching device B-CTr2 correspond respectively to the above-stated first B-control switching device B-CTr1 and second B-control switching device B-CTr2 in FIG. 18.

First Embodiment of A-INVERTER A-INV

Figure 26:
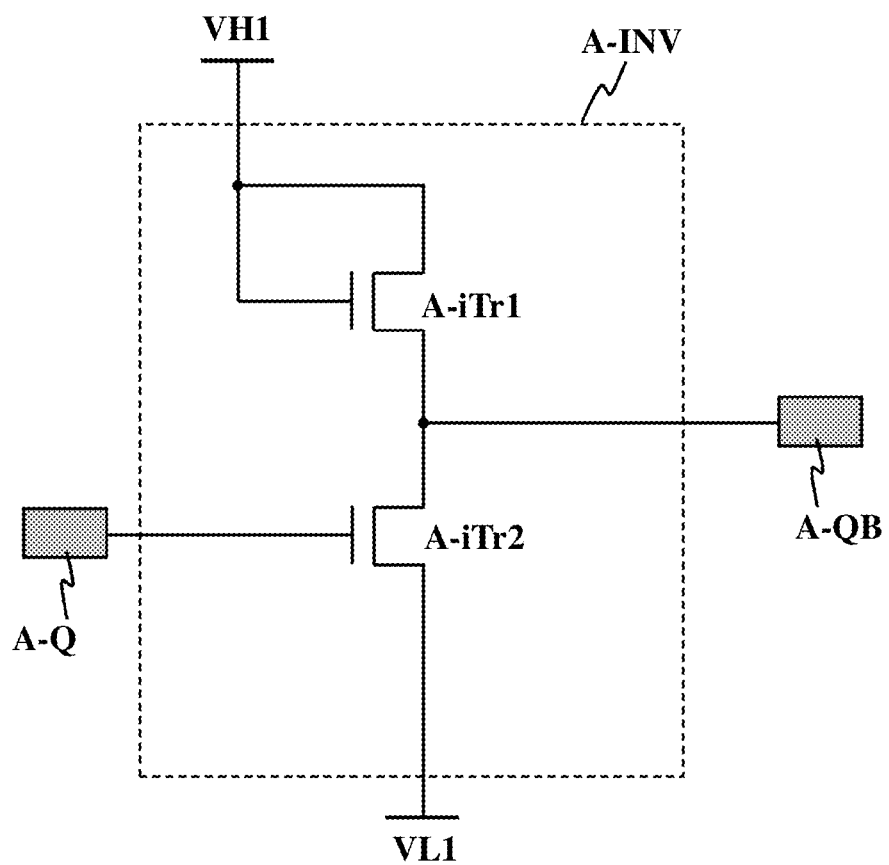
FIG. 26 is a detailed circuit diagram of a first embodiment of an A-inverter.

FIG. 26 is a detailed circuit diagram of a first embodiment of the A-inverter A-INV.

The A-inverter A-INV of the nth A-sub-stage A-Sub includes a first A-inverting switching device A-iTr1 and a second A-inverting switching device A-iTr2, as shown in FIG. 26.

The first A-inverting switching device A-iTr1 of the nth A-sub-stage A-Sub is controlled by the first high voltage VH1 from a high voltage line and is connected between the high voltage line and the A-reset node A-QB. That is, the first A-inverting switching device A-iTr1 is turned on or off in response to the first high voltage VH1, and interconnects the high voltage line and the A-reset node A-QB when turned on.

The second A-inverting switching device A-iTr2 of the nth A-sub-stage A-Sub is controlled by the voltage at the A-set node A-Q and is connected between the A-reset node A-QB and a low voltage line. That is, the second A-inverting switching device A-iTr2 is turned on or off in response to the voltage at the A-set node A-Q, and interconnects the A-reset node A-QB and the low voltage line when turned on. The low voltage line is supplied with the first low voltage VL1.

Here, the second A-inverting switching device A-iTr2 is larger in size (for example, channel width) than the first A-inverting switching device A-iTr1 such that the A-reset node A-QB is kept discharged when the first A-inverting switching device A-iTr1 and the second A-inverting switching device A-iTr2 are both kept on.

Second Embodiment of A-INVERTER A-INV

Figure 27:
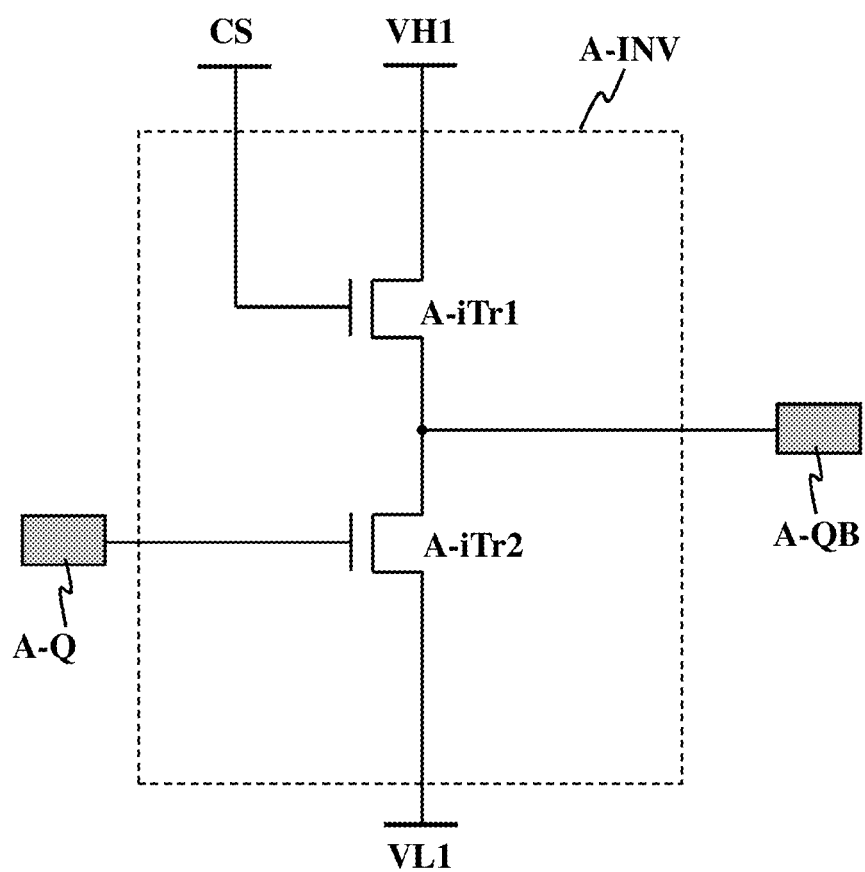
FIG. 27 is a detailed circuit diagram of a second embodiment of the A-inverter.

FIG. 27 is a detailed circuit diagram of a second embodiment of the A-inverter A-INV.

The A-inverter A-INV of the nth A-sub-stage A-Sub includes a first A-inverting switching device A-iTr1 and a second A-inverting switching device A-iTr2, as shown in FIG. 27.

The first A-inverting switching device A-iTr1 of the nth A-sub-stage A-Sub is controlled by an external control signal CS and is connected between a high voltage line and the A-reset node A-QB. That is, the first A-inverting switching device A-iTr1 is turned on or off in response to the control signal CS, and interconnects the high voltage line and the A-reset node A-QB when turned on. The high voltage line is supplied with the first high voltage VH1.

The second A-inverting switching device A-iTr2 of the nth A-sub-stage A-Sub is controlled by the voltage at the A-set node A-Q and is connected between the A-reset node A-QB and a low voltage line. That is, the second A-inverting switching device A-iTr2 is turned on or off in response to the voltage at the A-set node A-Q, and interconnects the A-reset node A-QB and the low voltage line when turned on. The low voltage line is supplied with the first low voltage VL1.

Here, the control signal CS is kept at a low voltage when the A-set node A-Q is kept charged (i.e., high), and at a high voltage when the A-set node A-Q is kept discharged (i.e., low). When the control signal CS has the high voltage, the first A-inverting switching device A-iTr1, supplied with the control signal CS, is turned on. In contrast, when the control signal CS has the low voltage, the first A-inverting switching device A-iTr1, supplied with the control signal CS, is turned off.

Also, the second A-inverting switching device A-iTr2 is larger in size (for example, channel width) than the first A-inverting switching device A-iTr1 such that the A-reset node A-QB is kept discharged when the first A-inverting switching device A-iTr1 and the second A-inverting switching device A-iTr2 are both kept on.

Third Embodiment of A-INVERTER A-INV

Figure 28:
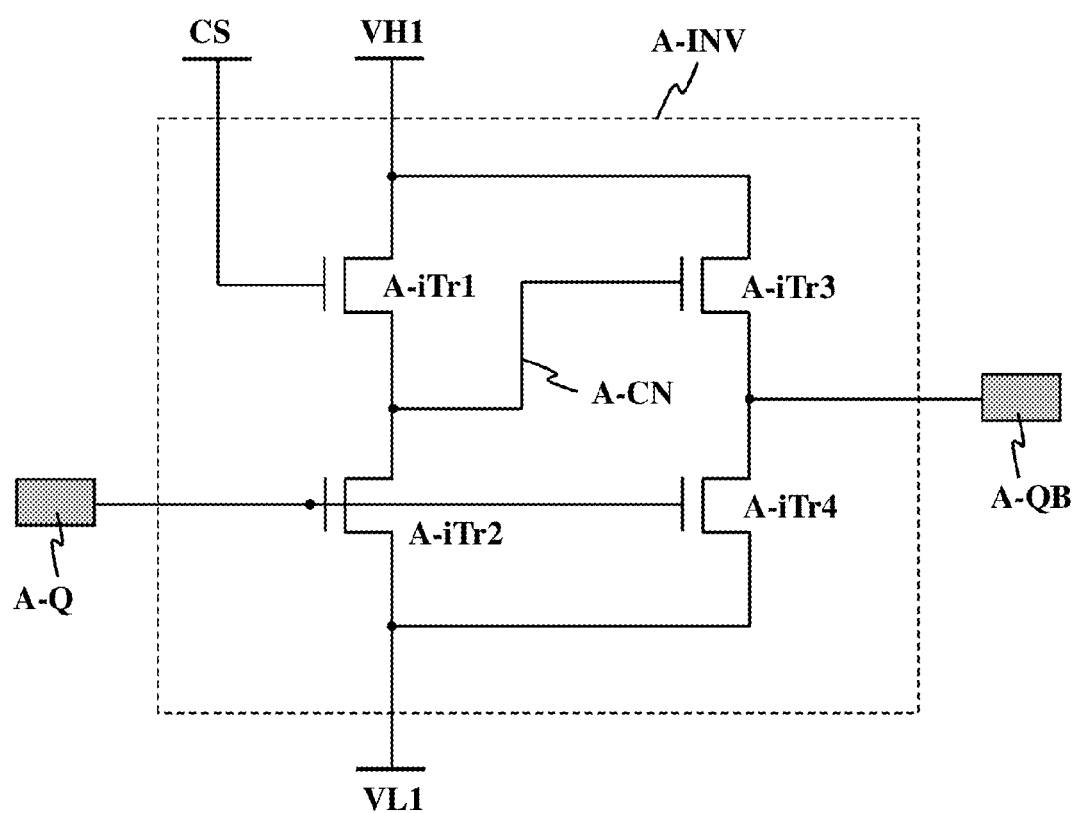
FIG. 28 is a detailed circuit diagram of a third embodiment of the A-inverter.

FIG. 28 is a detailed circuit diagram of a third embodiment of the A-inverter A-INV.

The A-inverter A-INV of the nth A-sub-stage A-Sub includes first to fourth A-inverting switching devices A-iTr1 to A-iTr4, as shown in FIG. 28.

The first A-inverting switching device A-iTr1 of the nth A-sub-stage A-Sub is controlled by an external control signal CS and is connected between a high voltage line and an A-common node A-CN. That is, the first A-inverting switching device A-iTr1 is turned on or off in response to the control signal CS, and interconnects the high voltage line and the A-common node A-CN when turned on. The high voltage line is supplied with the first high voltage VH1.

The second A-inverting switching device A-iTr2 of the nth A-sub-stage A-Sub is controlled by the voltage at the A-set node A-Q and is connected between the A-common node A-CN and a low voltage line. That is, the second A-inverting switching device A-iTr2 is turned on or off in response to the voltage at the A-set node A-Q, and interconnects the A-common node A-CN and the low voltage line when turned on. The low voltage line is supplied with the first low voltage VL1.

The third A-inverting switching device A-iTr3 of the nth A-sub-stage A-Sub is controlled by a voltage at the A-common node A-CN and is connected between the high voltage line and the A-reset node A-QB. That is, the third A-inverting switching device A-iTr3 is turned on or off in response to the voltage at the A-common node A-CN, and interconnects the high voltage line and the A-reset node A-QB when turned on.

The fourth A-inverting switching device A-iTr4 of the nth A-sub-stage A-Sub is controlled by the voltage at the A-set node A-Q and is connected between the A-reset node A-QB and the low voltage line. That is, the fourth A-inverting switching device A-iTr4 is turned on or off in response to the voltage at the A-set node A-Q, and interconnects the A-reset node A-QB and the low voltage line when turned on. The low voltage line is supplied with the first low voltage VL1, as stated above.

Here, the control signal CS is kept at a low voltage when the A-set node A-Q is kept charged (i.e., high), and at a high voltage when the A-set node A-Q is kept discharged (i.e., low). When the control signal CS has the high voltage, the first A-inverting switching device A-iTr1, supplied with the control signal CS, is turned on. In contrast, when the control signal CS has the low voltage, the first A-inverting switching device A-iTr1, supplied with the control signal CS, is turned off.

Also, the second A-inverting switching device A-iTr2 is larger in size (for example, channel width) than the first A-inverting switching device A-iTr1 such that the A-reset node A-QB is kept discharged when the first A-inverting switching device A-iTr1 and the second A-inverting switching device A-iTr2 are both kept on.

Fourth Embodiment of A-INVERTER A-INV

Figure 29:
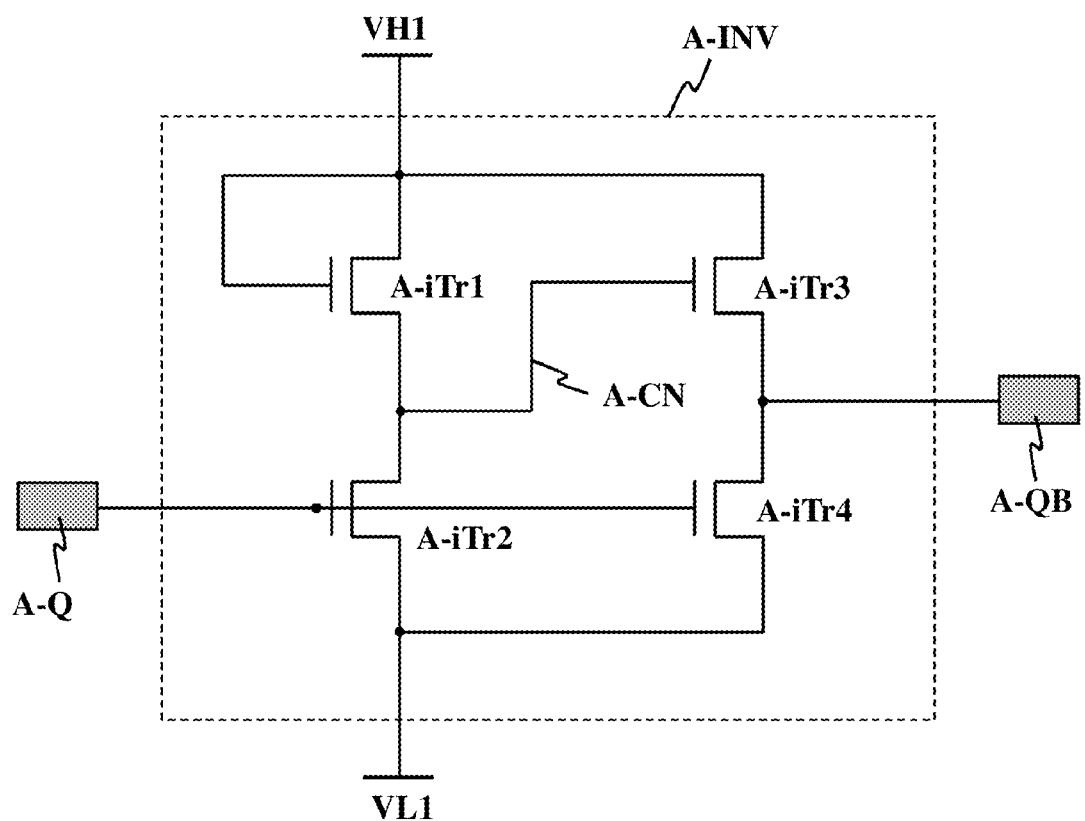
FIG. 29 is a detailed circuit diagram of a fourth embodiment of the A-inverter.

FIG. 29 is a detailed circuit diagram of a fourth embodiment of the A-inverter A-INV.

The A-inverter A-INV of the nth A-sub-stage A-Sub includes first to fourth A-inverting switching devices A-iTr1 to A-iTr4, as shown in FIG. 29.

The first A-inverting switching device A-iTr1 of the nth A-sub-stage A-Sub is controlled by the first high voltage VH1 from a high voltage line and is connected between the high voltage line and an A-common node A-CN. That is, the first A-inverting switching device A-iTr1 is turned on or off in response to the first high voltage VH1, and interconnects the high voltage line and the A-common node A-CN when turned on.

The second A-inverting switching device A-iTr2 of the nth A-sub-stage A-Sub is controlled by the voltage at the A-set node A-Q and is connected between the A-common node A-CN and a low voltage line. That is, the second A-inverting switching device A-iTr2 is turned on or off in response to the voltage at the A-set node A-Q, and interconnects the A-common node A-CN and the low voltage line when turned on. The low voltage line is supplied with the first low voltage VL1.

The third A-inverting switching device A-iTr3 of the nth A-sub-stage A-Sub is controlled by a voltage at the A-common node A-CN and is connected between the high voltage line and the A-reset node A-QB. That is, the third A-inverting switching device A-iTr3 is turned on or off in response to the voltage at the A-common node A-CN, and interconnects the high voltage line and the A-reset node A-QB when turned on.

The fourth A-inverting switching device A-iTr4 of the nth A-sub-stage A-Sub is controlled by the voltage at the A-set node A-Q and is connected between the A-reset node A-QB and the low voltage line. That is, the fourth A-inverting switching device A-iTr4 is turned on or off in response to the voltage at the A-set node A-Q, and interconnects the A-reset node A-QB and the low voltage line when turned on. The low voltage line is supplied with the first low voltage VL1, as stated above.

Here, the second A-inverting switching device A-iTr2 is larger in size (for example, channel width) than the first A-inverting switching device A-iTr1 such that the A-reset node A-QB is kept discharged when the first A-inverting switching device A-iTr1 and the second A-inverting switching device A-iTr2 are both kept on.

Fifth Embodiment of A-inverter A-inv

Figure 30:
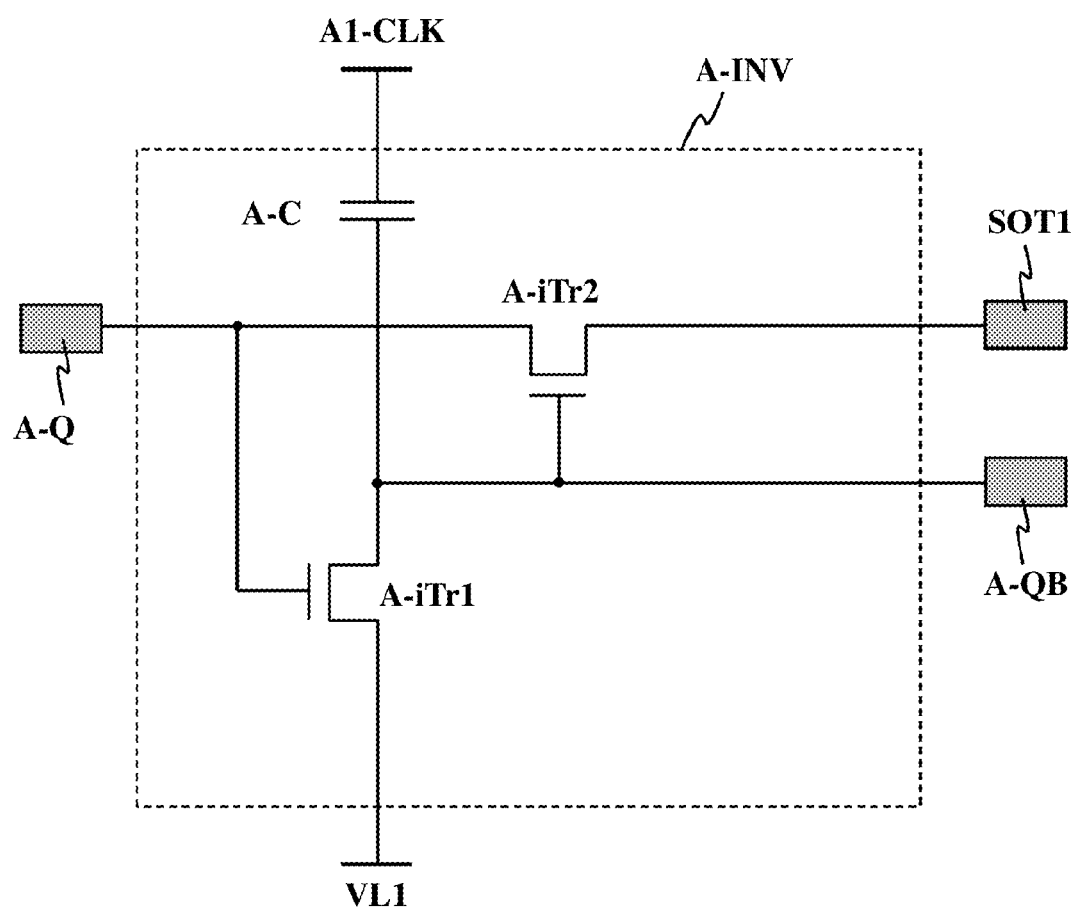
FIG. 30 is a detailed circuit diagram of a fifth embodiment of the A-inverter.

FIG. 30 is a detailed circuit diagram of a fifth embodiment of the A-inverter A-INV.

The A-inverter A-INV of the nth A-sub-stage A-Sub includes a first A-inverting switching device A-iTr1, a second A-inverting switching device A-iTr2, and an A-capacitor A-C, as shown in FIG. 30.

The first A-inverting switching device A-iTr1 of the nth A-sub-stage A-Sub is controlled by the voltage at the A-set node A-Q and is connected between the A-reset node A-QB and a low voltage line. That is, the first A-inverting switching device A-iTr1 is turned on or off in response to the voltage at the A-set node A-Q, and interconnects the A-reset node A-QB and the low voltage line when turned on. The low voltage line is supplied with the first low voltage VL1.

The second A-inverting switching device A-iTr2 of the nth A-sub-stage A-Sub is controlled by the voltage at the A-reset node A-QB and is connected between the A-set node A-Q and the first scan output terminal SOT1. That is, the second A-inverting switching device A-iTr2 is turned on or off in response to the voltage at the A-reset node A-QB, and interconnects the A-set node A-Q and the first scan output terminal SOT1 when turned on.

The A-capacitor A-C of the nth A-sub-stage A-Sub is connected between any one A1-clock transfer line which transfers an A1-clock pulse A1-CLK and the A-reset node A-QB.

FIG. 31 illustrates inverting switching devices which may be additionally provided in the A-inverter A-INV. The A-inverter A-INV according to each of the first to fifth embodiments shown in FIGS. 26 to 30 may further include at least one of four inverting switching devices A-iTr5 to A-iTr8 shown in FIG. 31.

Each of the four inverting switching devices A-iTr5 to A-iTr8 will hereinafter be described in detail.

As shown in FIG. 31(a), the fifth A-inverting switching device A-iTr5 of the nth A-sub-stage A-Sub is controlled by the A-set control signal (i.e., the A1-carry pulse A1-CR_n−1 from the (n−1)th A-sub-stage A-Sub) and is connected between the A-reset node A-QB of the nth A-sub-stage A-Sub and the low voltage line. That is, the fifth A-inverting switching device A-iTr5 is turned on or off in response to the A1-carry pulse A1-CR_n−1 from the upstream A-sub-stage A-Sub, and interconnects the A-reset node A-QB and the low voltage line when turned on.

As shown in FIG. 31(b), the sixth A-inverting switching device A-iTr6 of the nth A-sub-stage A-Sub is controlled by the voltage at the A-reset node A-QB and is connected between the A-set node A-Q and the low voltage line. That is, the sixth A-inverting switching device A-iTr6 is turned on or off in response to the voltage at the A-reset node A-QB, and interconnects the A-set node A-Q and the low voltage line when turned on.

As shown in FIG. 31(c), the seventh A-inverting switching device A-iTr7 of the nth A-sub-stage A-Sub is controlled by an A1-clock pulse A1-CLK from any one A1-clock transfer line and is connected between an output terminal (i.e., an A-carry output terminal A-COT of the (n−1)th A-sub-stage A-Sub) which outputs the A-set control signal (i.e., the A1-carry pulse A1-CR_n−1 from the (n−1)th A-sub-stage A-Sub) and the A-set node A-Q of the nth A-sub-stage A-Sub. That is, the seventh A-inverting switching device A-iTr7 is turned on or off in response to the A1-clock pulse A1-CLK, and interconnects the A-carry output terminal A-COT of the (n−1)th A-sub-stage A-Sub) and the A-set node A-Q of the nth A-sub-stage A-Sub when turned on.

As shown in FIG. 31(d), the eighth A-inverting switching device A-iTr8 of the nth A-sub-stage A-Sub is controlled by the voltage at the A-reset node A-QB and is connected between the A-set node A-Q and a terminal. That is, the eighth A-inverting switching device A-iTr8 is turned on or off in response to the voltage at the A-reset node A-QB, and interconnects the A-set node A-Q and the terminal when turned on. Here, the terminal may be any one of the first scan output terminal SOT1, the second scan output terminal SOT2, an A1-clock transfer line which transfers an A1-clock pulse A1-CLK and an A2-clock transfer line which transfers an A2-clock pulse A2-CLK.

The A-inverter A-INV according to the first embodiment shown in FIG. 26 may further include one or more of the fifth to eighth A-inverting switching devices A-iTr5 to A-iTr8 shown in FIG. 31.

Similarly, the A-inverter A-INV according to the second embodiment shown in FIG. 27 may further include one or more of the fifth to eighth A-inverting switching devices A-iTr5 to A-iTr8 shown in FIG. 31.

Similarly, the A-inverter A-INV according to the third embodiment shown in FIG. 28 may further include one or more of the fifth to eighth A-inverting switching devices A-iTr5 to A-iTr8 shown in FIG. 31.

Figure 32:
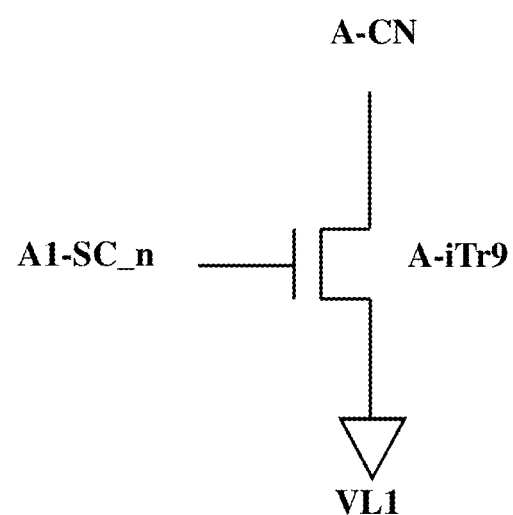
FIG. 32 is a view illustrating another inverting switching device which may be additionally provided in the third and fourth embodiments of the A-inverter.

FIG. 32 illustrates another inverting switching device which may be additionally provided in the third and fourth embodiments of the A-inverter A-INV. The A-inverter A-INV according to each of the third and fourth embodiments shown in FIGS. 28 and 29 may further include an inverting switching device A-iTr9 shown in FIG. 32.

This inverting switching device A-iTr9 will hereinafter be described in detail.

As shown in FIG. 32, the ninth A-inverting switching device A-iTr9 of the nth A-sub-stage A-Sub is controlled by a voltage applied to the gate electrode of the B1-scan output switching device B1-SCO and is connected between the A-common node A-CN and the low voltage line. That is, the ninth A-inverting switching device A-iTr9 is turned on or off in response to the voltage applied to the gate electrode of the B1-scan output switching device B1-SCO, and interconnects the A-common node A-CN and the low voltage line when turned on.

Here, the B-carry output terminal B-COT, instead of the gate electrode of the B1-scan output switching device B1-SCO, may be directly connected to the gate electrode of the ninth A-inverting switching device A-iTr9.

On the other hand, the B-inverter B-INV may also have the configurations as shown in FIGS. 26 to 32. For example, the B-inverter B-INV may have a configuration as shown in FIG. 33.

Figure 33:
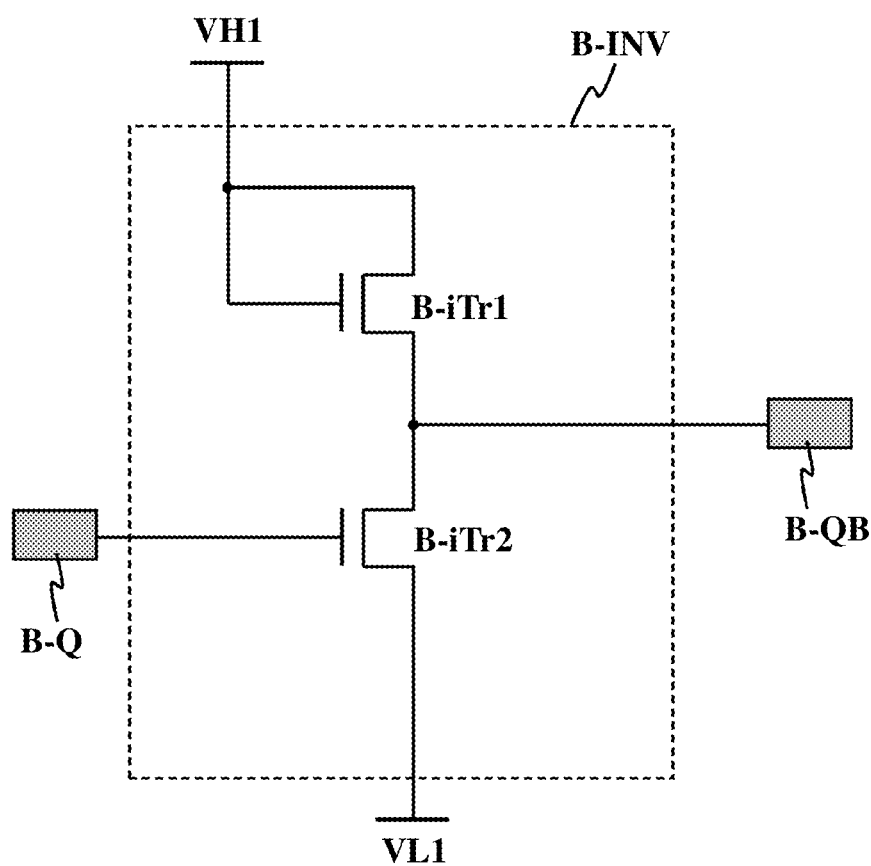
FIG. 33 is a detailed circuit diagram of a B-inverter.

FIG. 33 is a detailed circuit diagram of the B-inverter B-INV.

The B-inverter B-INV of the nth B-sub-stage B-Sub includes a first B-inverting switching device B-iTr1 and a second B-inverting switching device B-iTr2, as shown in FIG. 33.

The first B-inverting switching device B-iTr1 of the nth B-sub-stage B-Sub is controlled by the second high voltage VH2 from a high voltage line and is connected between the high voltage line and the B-reset node B-QB. That is, the first B-inverting switching device B-iTr1 is turned on or off in response to the second high voltage VH2, and interconnects the high voltage line and the B-reset node B-QB when turned on.

The second B-inverting switching device B-iTr2 of the nth B-sub-stage B-Sub is controlled by the voltage at the B-set node B-Q and is connected between the B-reset node B-QB and a low voltage line. That is, the second B-inverting switching device B-iTr2 is turned on or off in response to the voltage at the B-set node B-Q, and interconnects the B-reset node B-QB and the low voltage line when turned on. The low voltage line is supplied with the second low voltage VL2.

Here, the second B-inverting switching device B-iTr2 is larger in size (for example, channel width) than the first B-inverting switching device B-iTr1 such that the B-reset node B-QB is kept discharged when the first B-inverting switching device B-iTr1 and the second B-inverting switching device B-iTr2 are both kept on.

On the other hand, according to the present invention, one stage may include two or more B-sub-stages. Hereinafter, with reference to FIG. 34, a description will be given of a configuration of one stage having two B-sub-stages, as one example.

Figure 34:
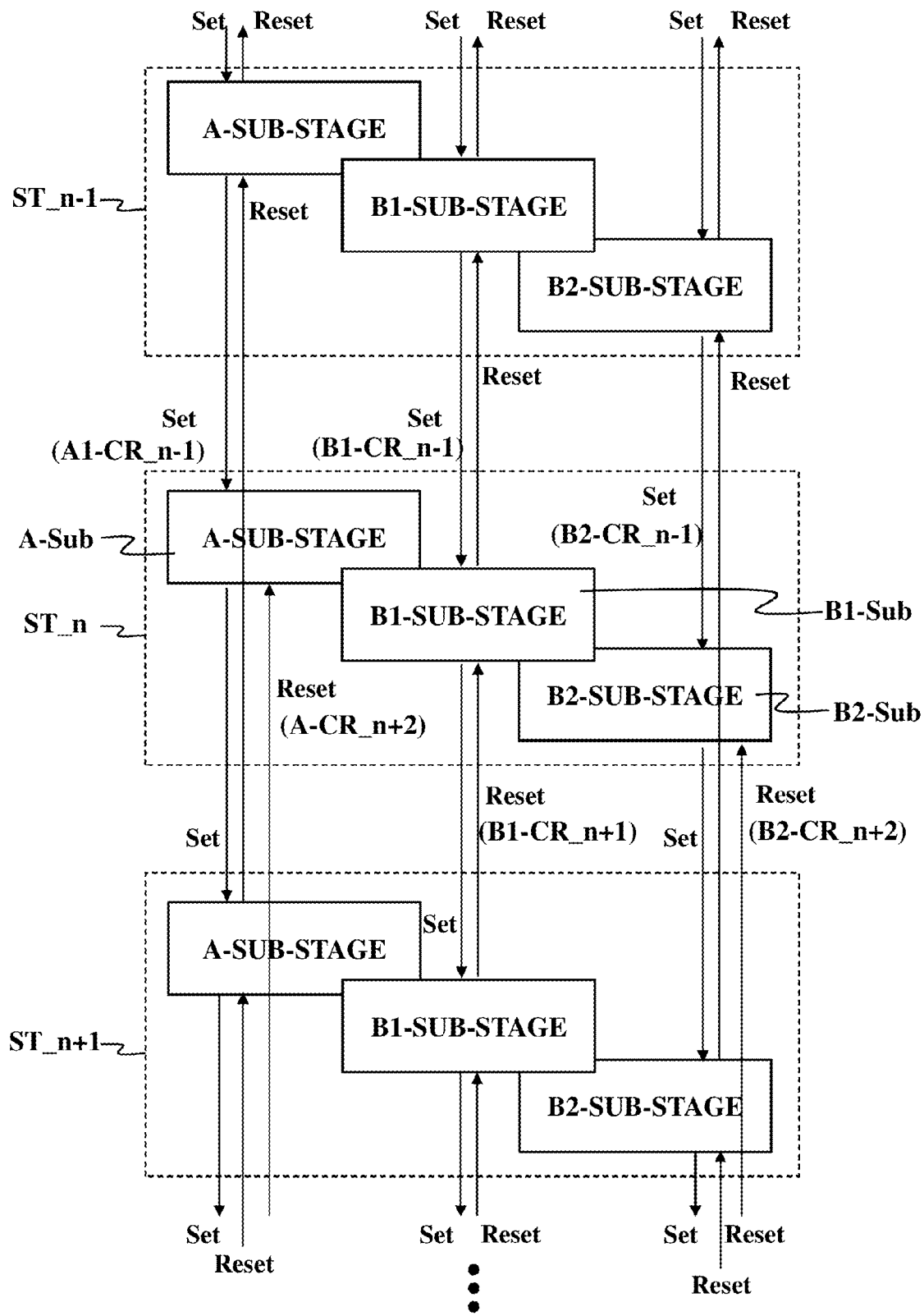
FIG. 34 is a block diagram illustrating an example of provision of two B-sub-stages in each stage in FIG. 1.

FIG. 34 is a block diagram illustrating an example of provision of two B-sub-stages in each stage in FIG. 1.

As shown in FIG. 34, each stage ST_n−2 to ST_n+2 includes one A-sub-stage A-Sub and two B-sub-stages (namely, a B1-sub-stage B1-Sub and a B2-sub-stage B2-Sub). Here, the A-sub-stage A-Sub is controlled by the A-control signal as stated previously, the B1-sub-stage B1-Sub is controlled by a B1-control signal, and the B2-sub-stage B2-Sub is controlled by a B2-control signal.

Here, the B1-control signal may be divided into a B1-set control signal and a B1-reset control signal. The B1-set control signal is required to set the B1-sub-stage B1-Sub of a corresponding stage supplied with the B1-set control signal, and the B1-reset control signal is required to reset the B1-sub-stage B1-Sub of a corresponding stage supplied with the B1-reset control signal.

The B1-set control signal may be an output from any one of stages upstream of the current stage supplied with the B1-set control signal. That is, the B1-sub-stage B1-Sub of the nth stage ST_n (where n is a natural number) may receive, as the above B1-set control signal, a B1-carry pulse output from the B1-sub-stage B1-Sub of an (n−r)th stage (where r is a natural number less than n or equal to p). For example, the B1-sub-stage B1-Sub of the nth stage ST_n may receive, as the above B1-set control signal, a B1-carry pulse B1-CR_n−1 output from the B1-sub-stage B1-Sub of the (n−1)th stage ST_n−1, as shown in FIG. 34.

In contrast, the B1-reset control signal may be an output from any one of stages downstream of the current stage supplied with the B1-reset control signal. That is, the B1-sub-stage B1-Sub of the nth stage ST_n may receive, as the above B1-reset control signal, a B1-carry pulse output from the B1-sub-stage B1-Sub of an (n+s)th stage (where s is an arbitrary natural number or a natural number equal to r). For example, the B1-sub-stage B1-Sub of the nth stage ST_n may receive, as the above B1-reset control signal, a B1-carry pulse B1-CR_n+1 output from the B1-sub-stage B1-Sub of the (n+1)th stage ST_n+1, as shown in FIG. 34.

Similarly, the B2-control signal may be divided into a B2-set control signal and a B2-reset control signal. The B2-set control signal is required to set the B2-sub-stage B2-Sub of a corresponding stage supplied with the B2-set control signal, and the B2-reset control signal is required to reset the B2-sub-stage B2-Sub of a corresponding stage supplied with the B2-reset control signal.

The B2-set control signal may be an output from any one of stages upstream of the current stage supplied with the B2-set control signal. That is, the B2-sub-stage B2-Sub of the nth stage ST_n (where n is a natural number) may receive, as the above B2-set control signal, a B2-carry pulse output from the B2-sub-stage B2-Sub of an (n−r)th stage (where r is a natural number less than n or equal to p). For example, the B2-sub-stage B2-Sub of the nth stage ST_n may receive, as the above B2-set control signal, a B2-carry pulse B2-CR_n−1 output from the B2-sub-stage B2-Sub of the (n−1)th stage ST_n−1, as shown in FIG. 34.

In contrast, the B2-reset control signal may be an output from any one of stages downstream of the current stage supplied with the B2-reset control signal. That is, the B2-sub-stage B2-Sub of the nth stage ST_n may receive, as the above B2-reset control signal, a B2-carry pulse output from the B2-sub-stage B2-Sub of an (n+s)th stage (where s is an arbitrary natural number or a natural number equal to r). For example, the B2-sub-stage B2-Sub of the nth stage ST_n may receive, as the above B2-reset control signal, a B2-carry pulse B2-CR_n+1 output from the B2-sub-stage B2-Sub of the (n+1)th stage ST_n+1, as shown in FIG. 34.

In this manner, the A-sub-stages A-Sub are interconnected to constitute one shift register that sequentially outputs A1-carry pulses A1-CR_i, the B1-sub-stages B1-Sub are interconnected to constitute another shift register that sequentially outputs B1-carry pulses B1-CR_i, and the B2-sub-stages B2-Sub are interconnected to constitute another shift register that sequentially outputs B2-carry pulses B2-CR_i.

In each stage, the B1-sub-stage controls the B1-scan output switching device B1-SCO, and the B2-sub-stage controls the B2-scan output switching device B2-SCO.

In the case where a plurality of B-sub-stages are provided in one stage in the above manner, some of the control switching devices in the above-stated scan output controller SOC may be changed in connection structure, as will hereinafter be described in detail with reference to the associated drawings.

Figure 35:
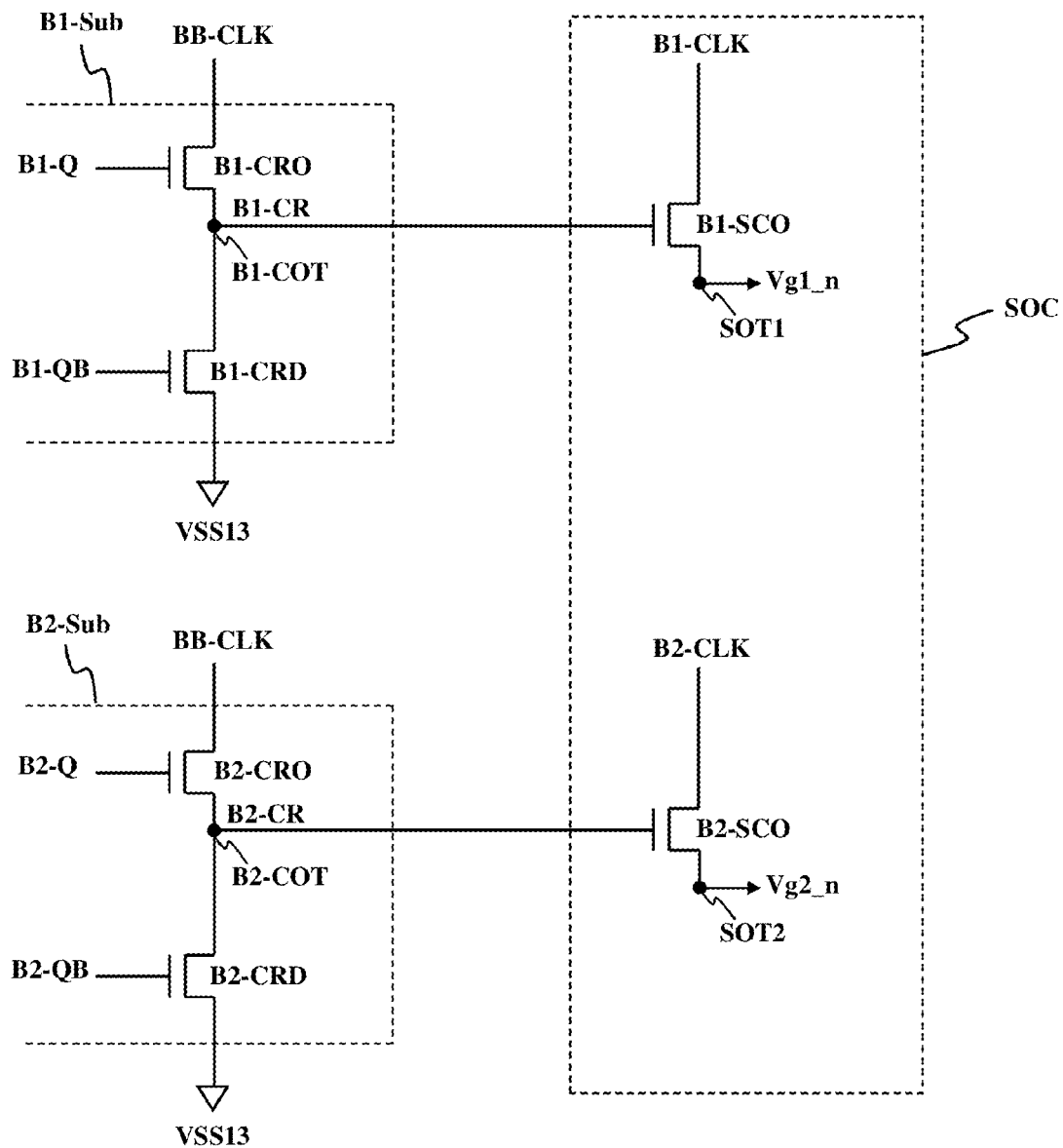
FIG. 35 is a circuit diagram of a first embodiment of a scan output controller in a structure having a plurality of B-sub-stages.

FIG. 35 is a circuit diagram of a first embodiment of a scan output controller SOC in a structure having a plurality of B-sub-stages.

The scan output controller SOC according to the first embodiment includes a B1-scan output switching device B1-SCO and a B2-scan output switching device B2-SCO, as shown in FIG. 35.

The B1-scan output switching device B1-SCO is controlled by a B1-carry pulse B1-CR and is connected between a B1-clock transfer line which transfers a B1-clock pulse B1-CLK and a first scan output terminal SOT 1. That is, the B1-scan output switching device B1-SCO is turned on or off in response to the B1-carry pulse B1-CR, and interconnects the B1-clock transfer line and the first scan output terminal SOT1 when turned on.

The B2-scan output switching device B2-SCO is controlled by a B2-carry pulse B2-CR and is connected between a B2-clock transfer line which transfers a B2-clock pulse B2-CLK and a second scan output terminal SOT2. That is, the B2-scan output switching device B2-SCO is turned on or off in response to the B2-carry pulse B2-CR, and interconnects the B2-clock transfer line and the second scan output terminal SOT2 when turned on.

On the other hand, each of a B1-sub-stage B1-Sub and a B2-sub-stage B2-Sub may have the same configuration as that of the above-described B-sub-stage B-Sub. In this case, the same BB-clock pulse BB-CLK or different BB-clock pulses BB-CLK may be supplied to the B1-sub-stage B1-Sub and the B2-sub-stage B2-Sub.

A B1-carry output switching device B1-CRO and a B1-carry discharge switching device B1-CRD provided in the B1-sub-stage B1-Sub correspond respectively to the B-carry output switching device B-CRO and B-carry discharge switching device B-CRD provided in the above-described B-sub-stage B-Sub. Similarly, a B2-carry output switching device B2-CRO and a B2-carry discharge switching device B2-CRD provided in the B2-sub-stage B2-Sub correspond respectively to the B-carry output switching device B-CRO and B-carry discharge switching device B-CRD provided in the above-described B-sub-stage B-Sub.

Figure 36:
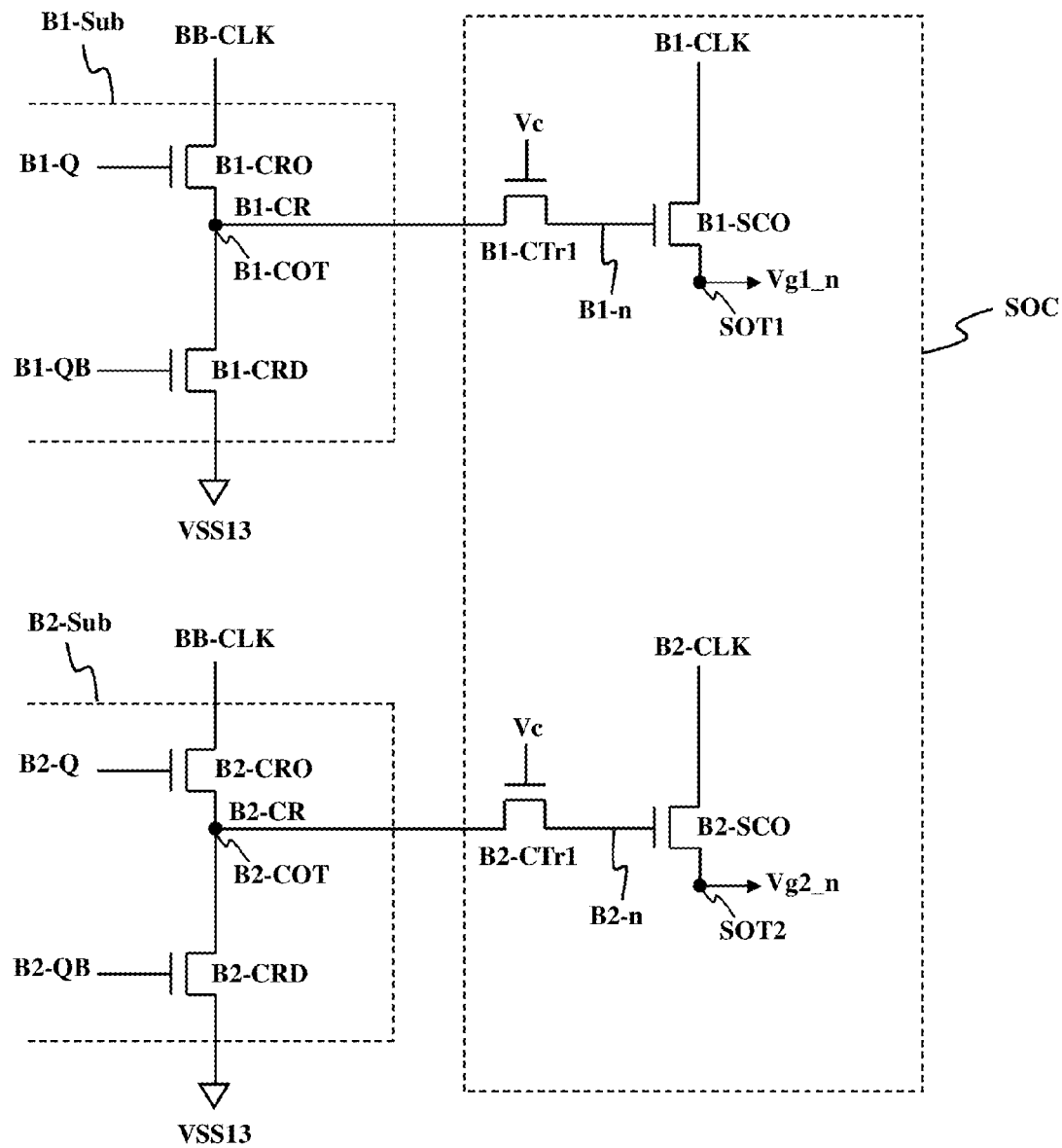
FIG. 36 is a circuit diagram of a second embodiment of the scan output controller in the structure having the plurality of B-sub-stages.

FIG. 36 is a circuit diagram of a second embodiment of the scan output controller SOC in the structure having the plurality of B-sub-stages.

The scan output controller SOC according to the second embodiment includes a first B1-control switching device B1-CTr1, a B1-scan output switching device B1-SCO, a first B2-control switching device B2-CTr1, and a B2-scan output switching device B2-SCO, as shown in FIG. 36.

The first B1-control switching device B1-CTr1 in the second embodiment is controlled by an external switching control signal Vc and is connected between a B1-carry output terminal B1-COT and a B1-node B1-*n*.

The B1-scan output switching device B1-SCO in the second embodiment is controlled by a voltage at the B1-node B1-*n* and is connected between a B1-clock transfer line which transfers a B1-clock pulse B1-CLK and a first scan output terminal SOT 1.

The first B2-control switching device B2-CTr2 in the second embodiment is controlled by the external switching control signal Vc and is connected between a B2-carry output terminal B2-COT and a B2-node B2-*n*.

The B2-scan output switching device B2-SCO in the second embodiment is controlled by a voltage at the B2-node B2-*n* and is connected between a B2-clock transfer line which transfers a B2-clock pulse B2-CLK and a second scan output terminal SOT2.

Figure 37:
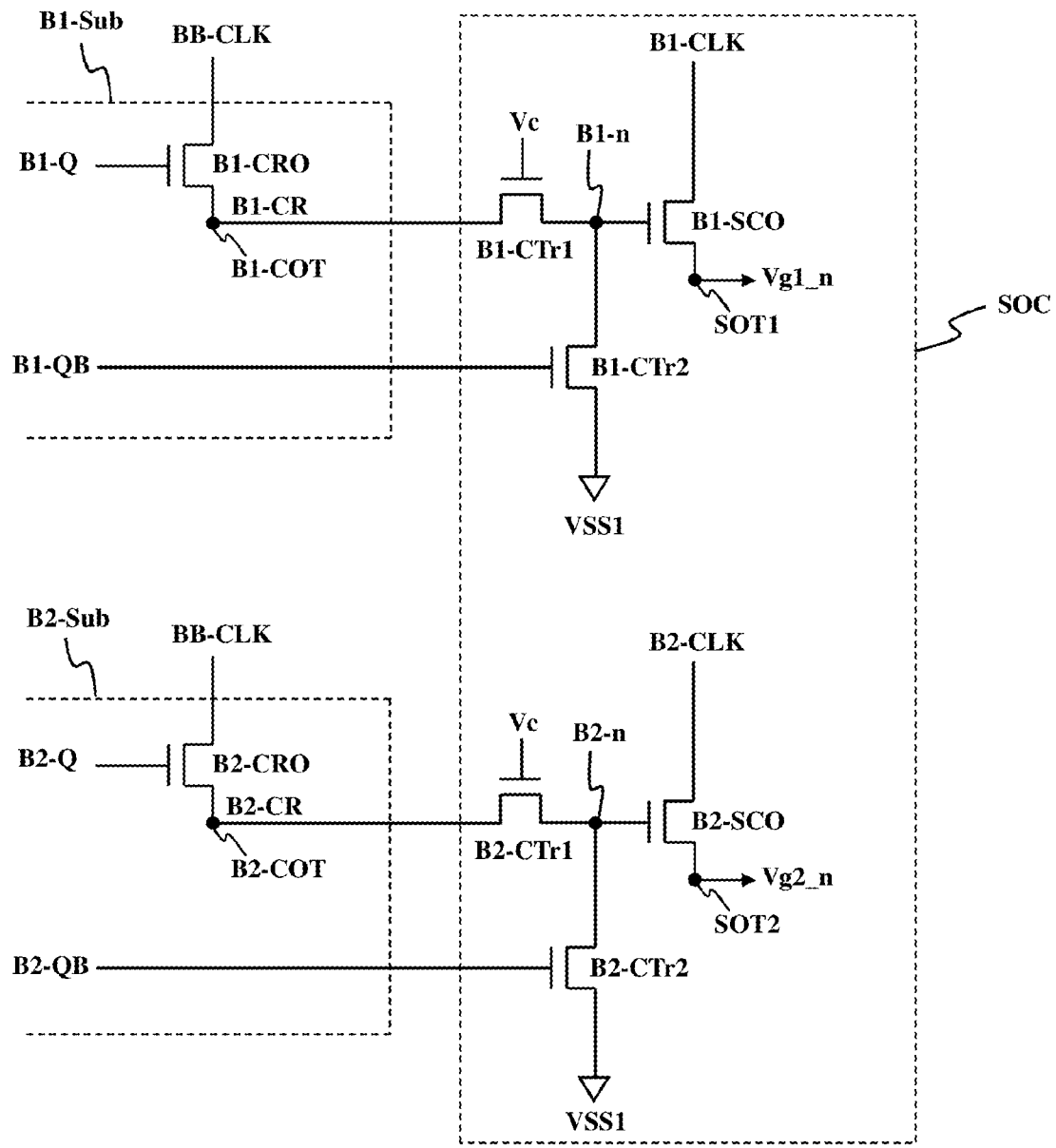
FIG. 37 is a circuit diagram of a third embodiment of the scan output controller in the structure having the plurality of B-sub-stages.

FIG. 37 is a circuit diagram of a third embodiment of the scan output controller SOC in the structure having the plurality of B-sub-stages.

The scan output controller SOC according to the third embodiment includes a first B1-control switching device B1-CTr1, a B1-scan output switching device B1-SCO, a first B2-control switching device B2-CTr1, a B2-scan output switching device B2-SCO, a second B1-control switching device B1-CTr2, and a second B2-control switching device B2-CTr2, as shown in FIG. 37.

The first B1-control switching device B1-CTr1, B1-scan output switching device B1-SCO, first B2-control switching device B2-CTr1 and B2-scan output switching device B2-SCO in the third embodiment are the same as those in the second embodiment, stated above, respectively, and a description thereof will thus be replaced by the above description of the second embodiment.

The second B1-control switching device B1-CTr2 in the third embodiment is controlled by a voltage at a B1-reset node B1-QB and is connected between the B1-node B1-*n* and a first discharging voltage line which transfers a first discharging voltage VSS1.

The second B2-control switching device B2-CTr2 in the third embodiment is controlled by a voltage at a B2-reset node B2-QB and is connected between the B2-node B2-*n* and the first discharging voltage line which transfers the first discharging voltage VSS1.

On the other hand, a B1-carry discharge switching device B1-CRD and a B2-carry discharge switching device B2-CRD are not installed in a B1-sub-stage B1-Sub and a B2-sub-stage B2-Sub in FIG. 37. The B1-carry discharge switching device B1-CRD and the B2-carry discharge switching device B2-CRD are replaced by the second B1-control switching device B1-CTr2 and the second B2-control switching device B2-CTr2, respectively.

Figure 38:
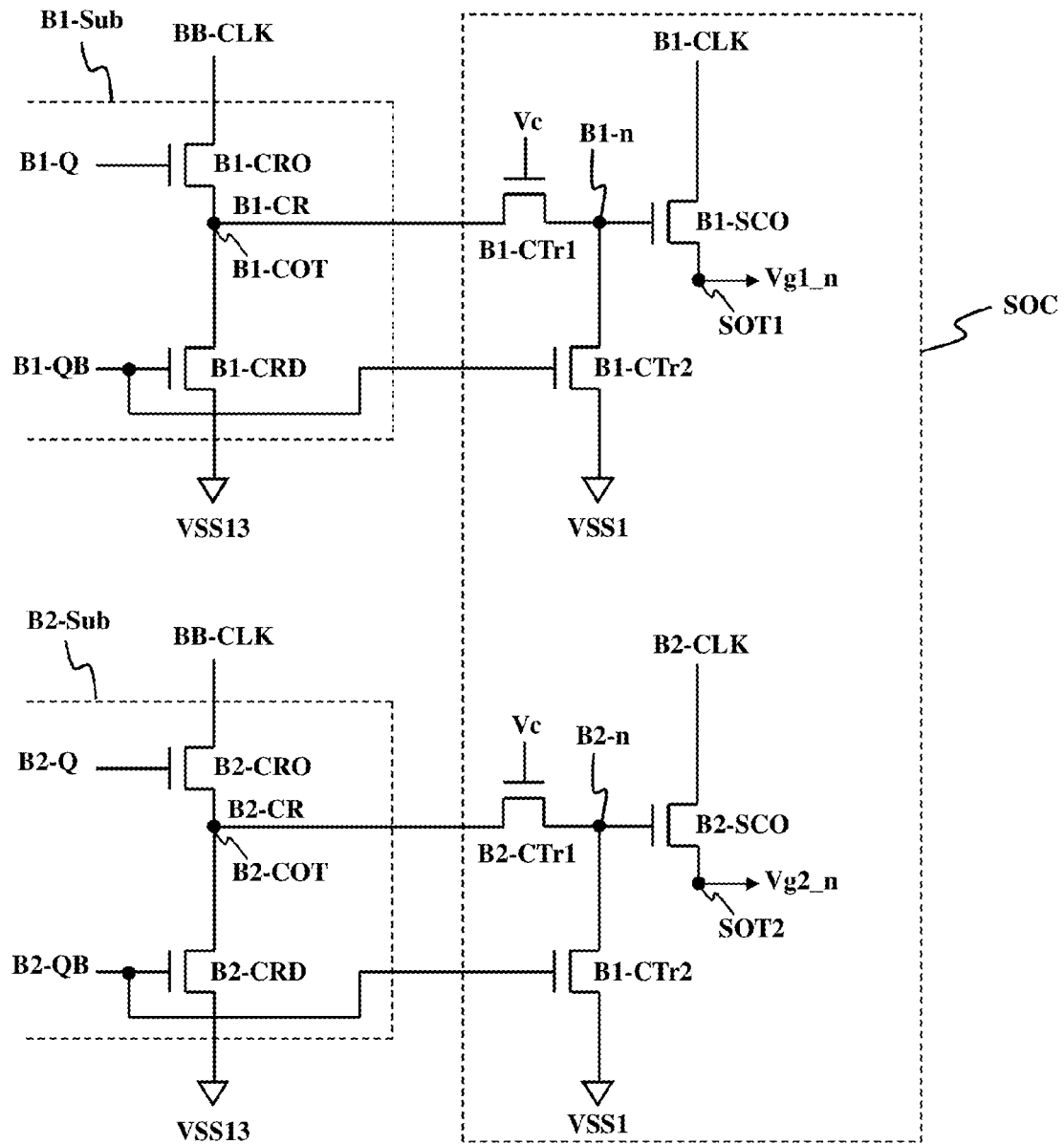
FIG. 38 is a circuit diagram of a fourth embodiment of the scan output controller in the structure having the plurality of B-sub-stages.

FIG. 38 is a circuit diagram of a fourth embodiment of the scan output controller SOC in the structure having the plurality of B-sub-stages.

The scan output controller SOC according to the fourth embodiment includes a first B1-control switching device B1-CTr1, a B1-scan output switching device B1-SCO, a first B2-control switching device B2-CTr1, a B2-scan output switching device B2-SCO, a second B1-control switching device B1-CTr2, and a second B2-control switching device B2-CTr2, as shown in FIG. 38.

The configuration of the scan output controller SOC in FIG. 38 is the same as that in FIG. 37, stated above.

In FIG. 38, a B1-sub-stage B1-Sub and a B2-sub-stage B2-Sub further include a B1-carry discharge switching device B1-CRD and a B2-carry discharge switching device B2-CRD, respectively, compared with those in FIG. 37.

Figure 39:
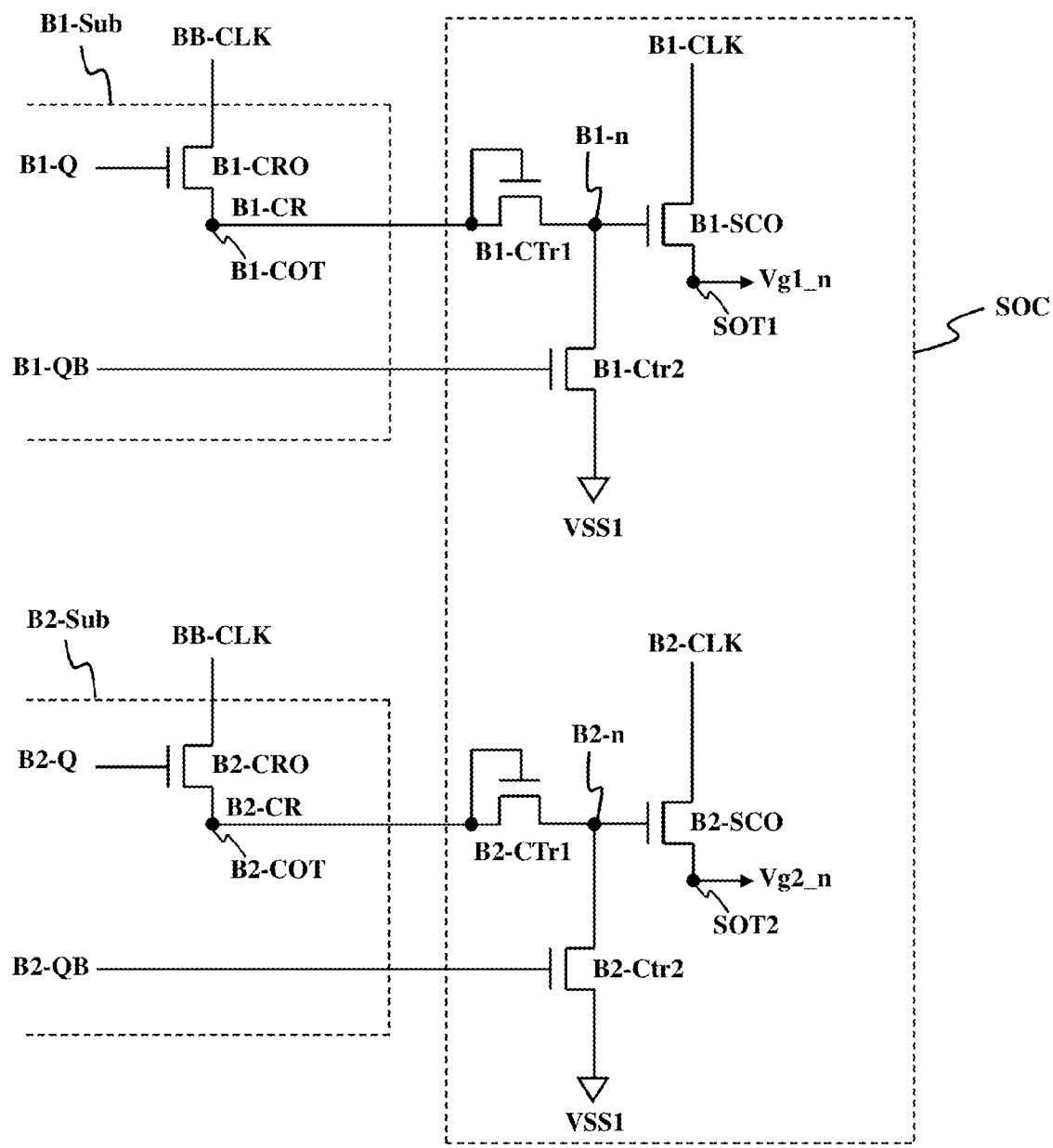
FIG. 39 is a circuit diagram of a fifth embodiment of the scan output controller in the structure having the plurality of B-sub-stages.

FIG. 39 is a circuit diagram of a fifth embodiment of the scan output controller SOC in the structure having the plurality of B-sub-stages.

The scan output controller SOC according to the fifth embodiment includes a first B1-control switching device B1-CTr1, a B1-scan output switching device B1-SCO, a first B2-control switching device B2-CTr1, a B2-scan output switching device B2-SCO, a second B1-control switching device B1-CTr2, and a second B2-control switching device B2-CTr2, as shown in FIG. 39.

The B1-scan output switching device B1-SCO, B2-scan output switching device B2-SCO, second B1-control switching device B1-CTr2 and second B2-control switching device B2-CTr2 in the fifth embodiment are the same as those in the third embodiment, stated above, respectively, and a description thereof will thus be replaced by the above description of the third embodiment.

The first B1-control switching device B1-CTr1 in the fifth embodiment is controlled by a B1-carry pulse B1-CR and is connected between a B1-carry output terminal B1-COT and the B1-node B1-*n*.

The first B2-control switching device B2-CTr1 in the fifth embodiment is controlled by a B2-carry pulse B2-CR and is connected between a B2-carry output terminal B2-COT and the B2-node B2-*n*.

Figure 40:
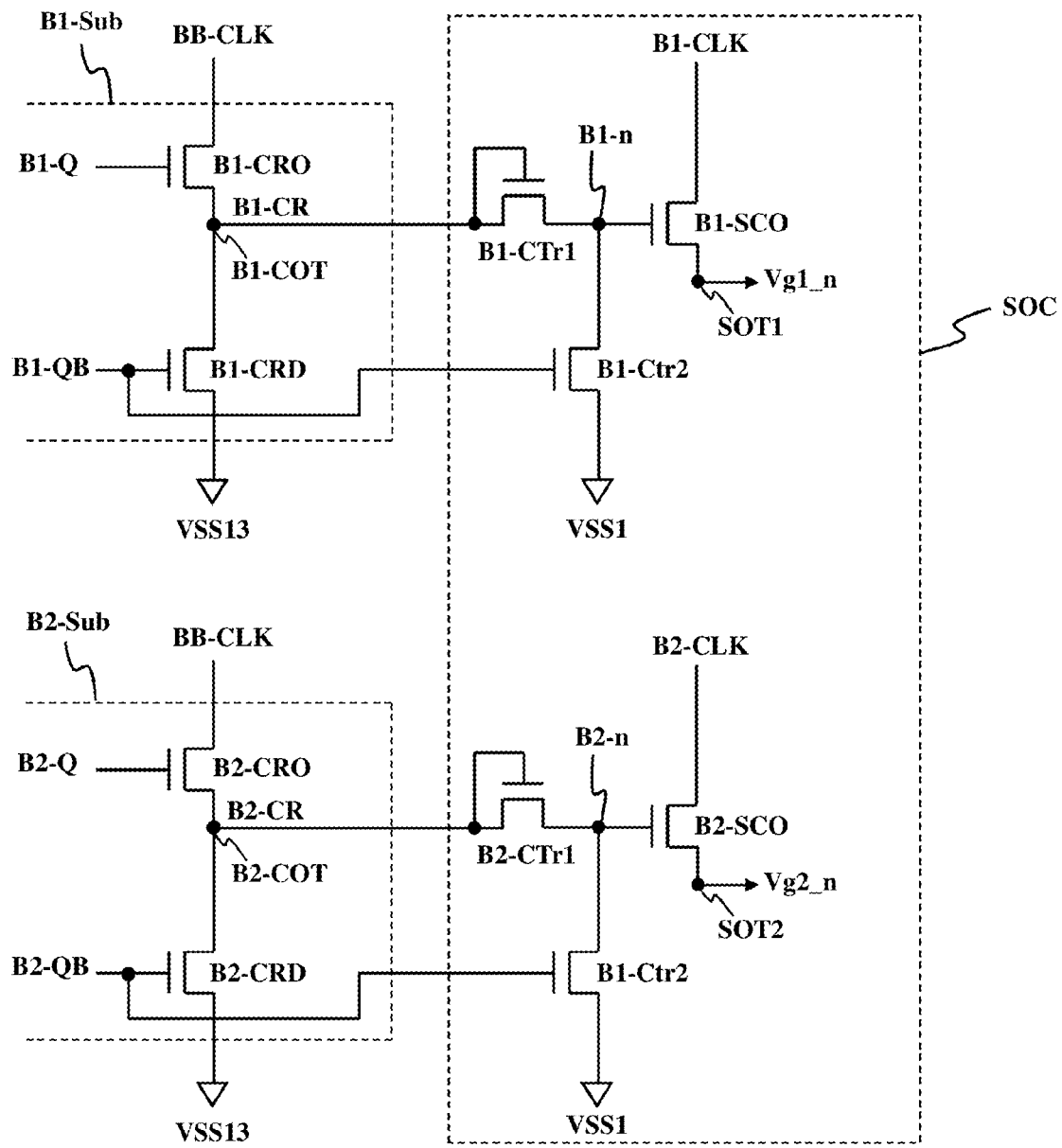
FIG. 40 is a circuit diagram of a sixth embodiment of the scan output controller in the structure having the plurality of B-sub-stages.

FIG. 40 is a circuit diagram of a sixth embodiment of the scan output controller SOC in the structure having the plurality of B-sub-stages.

The scan output controller SOC according to the sixth embodiment includes a first B1-control switching device B1-CTr1, a B1-scan output switching device B1-SCO, a first B2-control switching device B2-CTr1, a B2-scan output switching device B2-SCO, a second B1-control switching device B1-CTr2, and a second B2-control switching device B2-CTr2, as shown in FIG. 40.

The configuration of the scan output controller SOC in FIG. 40 is the same as that in FIG. 39, stated above.

In FIG. 40, a B1-sub-stage B1-Sub and a B2-sub-stage B2-Sub further include a B1-carry discharge switching device B1-CRD and a B2-carry discharge switching device B2-CRD, respectively, compared with those in FIG. 39.

Figure 41:
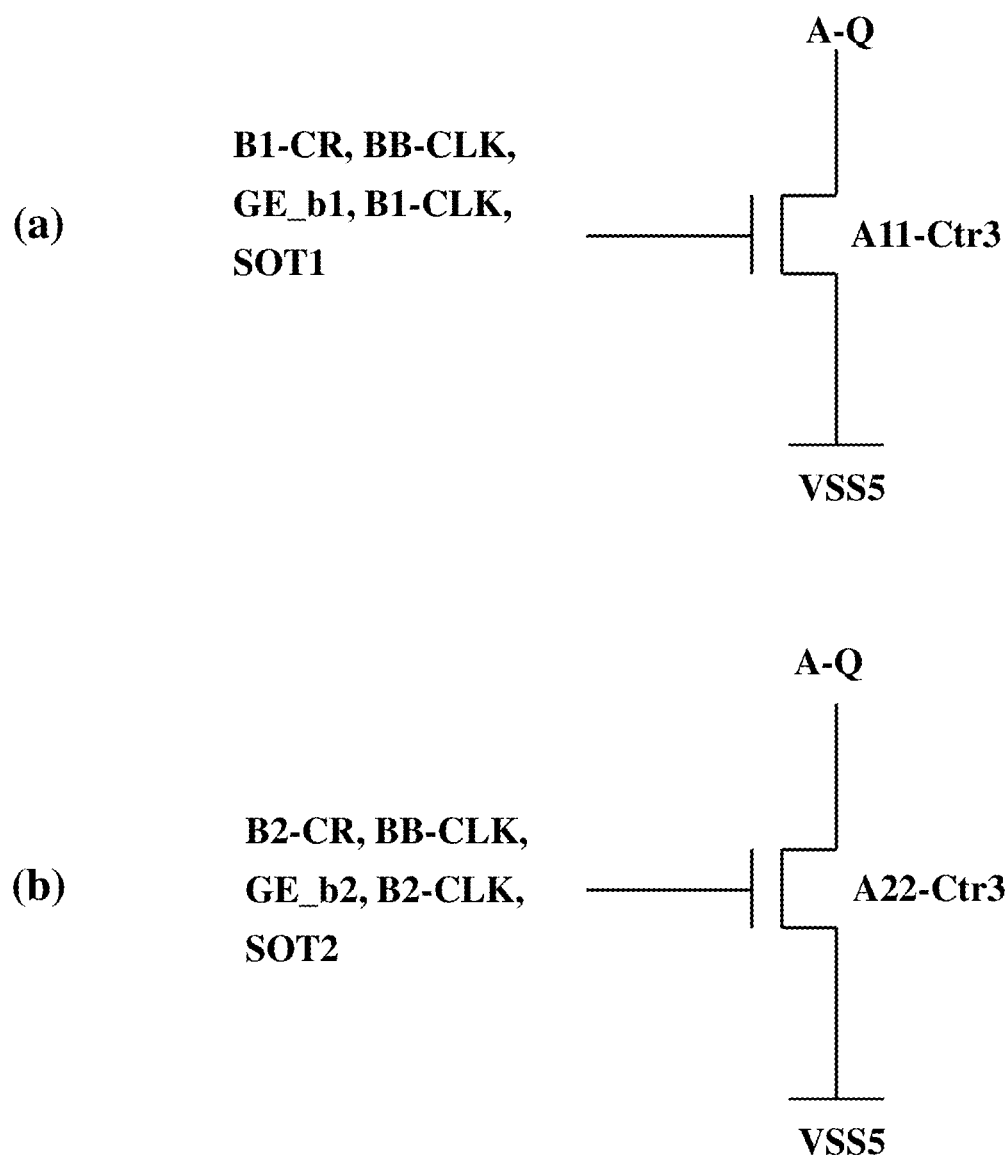
FIGS. 41(a)-41(b) illustrate switching devices which may be additionally provided in the scan output controller in the structure having the plurality of B-sub-stages.

FIG. 41 illustrates switching devices which may be additionally provided in the scan output controller SOC in the structure having the plurality of B-sub-stages. The scan output controller SOC according to each of the above-stated first to sixth embodiments may further include at least one of two control switching devices A11-CTr3 and A22-CTr3 shown in FIG. 41.

Each of the two control switching devices A11-CTr3 and A22-CTr3 will hereinafter be described in detail.

The third A11-control switching device A11-CTr3 shown in FIG. 41(*a*) is controlled by a fifth control signal applied to the gate electrode thereof and is connected between an A-reset node A-QB and a fifth discharging voltage line which transfers a fifth discharging voltage VSS5. Here, the fifth control signal may be any one of the B1-carry pulse B1-CR, the BB-clock pulse BB-CLK, a voltage applied to the gate electrode GE_b1 of the B1-scan output switching device B1-SCO, the B1-clock pulse B1-CLK and a voltage at the first scan output terminal SOT1.

The third A22-control switching device A22-CTr3 shown in FIG. 41(*b*) is controlled by a sixth control signal applied to the gate electrode thereof and is connected between the A-reset node A-QB and the fifth discharging voltage line which transfers the fifth discharging voltage VSS5. Here, the sixth control signal may be any one of the B2-carry pulse B2-CR, the BB-clock pulse BB-CLK, a voltage applied to the gate electrode GE_b2 of the B2-scan output switching device B2-SCO, the B2-clock pulse B2-CLK and a voltage at the second scan output terminal SOT2.

Figure 42:
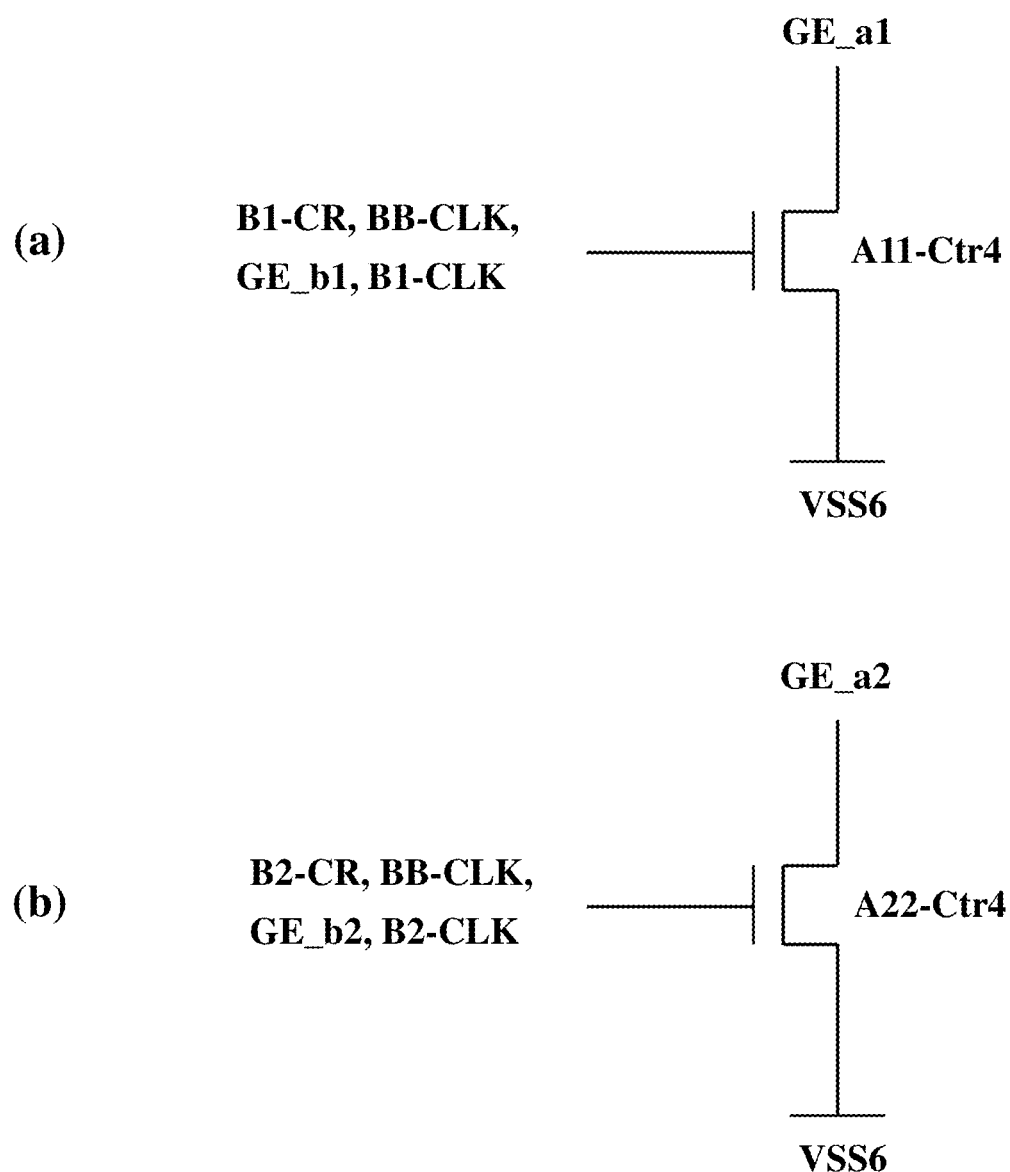
FIGS. 42(a) and 42(b) illustrate other switching devices which may be additionally provided in the scan output controller.

FIG. 42 illustrates other switching devices which may be additionally provided in the scan output controller SOC in the structure having the plurality of B-sub-stages. The scan output controller SOC according to each of the above-stated first to sixth embodiments may further include at least one of two control switching devices A11-CTr4 and A22-CTr4 shown in FIG. 42.

Each of the two control switching devices A11-CTr4 and A22-CTr4 will hereinafter be described in detail.

The fourth A11-control switching device A11-CTr4 shown in FIG. 42(a) is controlled by a seventh control signal applied to the gate electrode thereof and is connected between the gate electrode GE_a1 of the A1-scan output switching device A1-SCO and a sixth discharging voltage line which transfers a sixth discharging voltage VSS6. Here, the seventh control signal may be any one of the B1-carry pulse B1-CR, the BB-clock pulse BB-CLK, a voltage applied to the gate electrode GE_b1 of the B1-scan output switching device B1-SCO and the B1-clock pulse B1-CLK.

The fourth A22-control switching device A22-CTr4 shown in FIG. 42(b) is controlled by an eighth control signal applied to the gate electrode thereof and is connected between the gate electrode GE_a2 of the A2-scan output switching device A2-SCO and the sixth discharging voltage line which transfers the sixth discharging voltage VSS6. Here, the eighth control signal may be any one of the B2-carry pulse B2-CR, the BB-clock pulse BB-CLK, a voltage applied to the gate electrode GE_b2 of the B2-scan output switching device B2-SCO and the B2-clock pulse B2-CLK.

On the other hand, each of the A-sub-stage A-Sub, B-sub-stage B-Sub, B1-sub-stage B1-Sub and B2-sub-stage B2-Sub according to the present invention may have a circuit configuration having two or more reset nodes. Hereinafter, a description will be given of a circuit configuration of the A-sub-stage A-Sub having two reset nodes, as one example.

Figure 43:
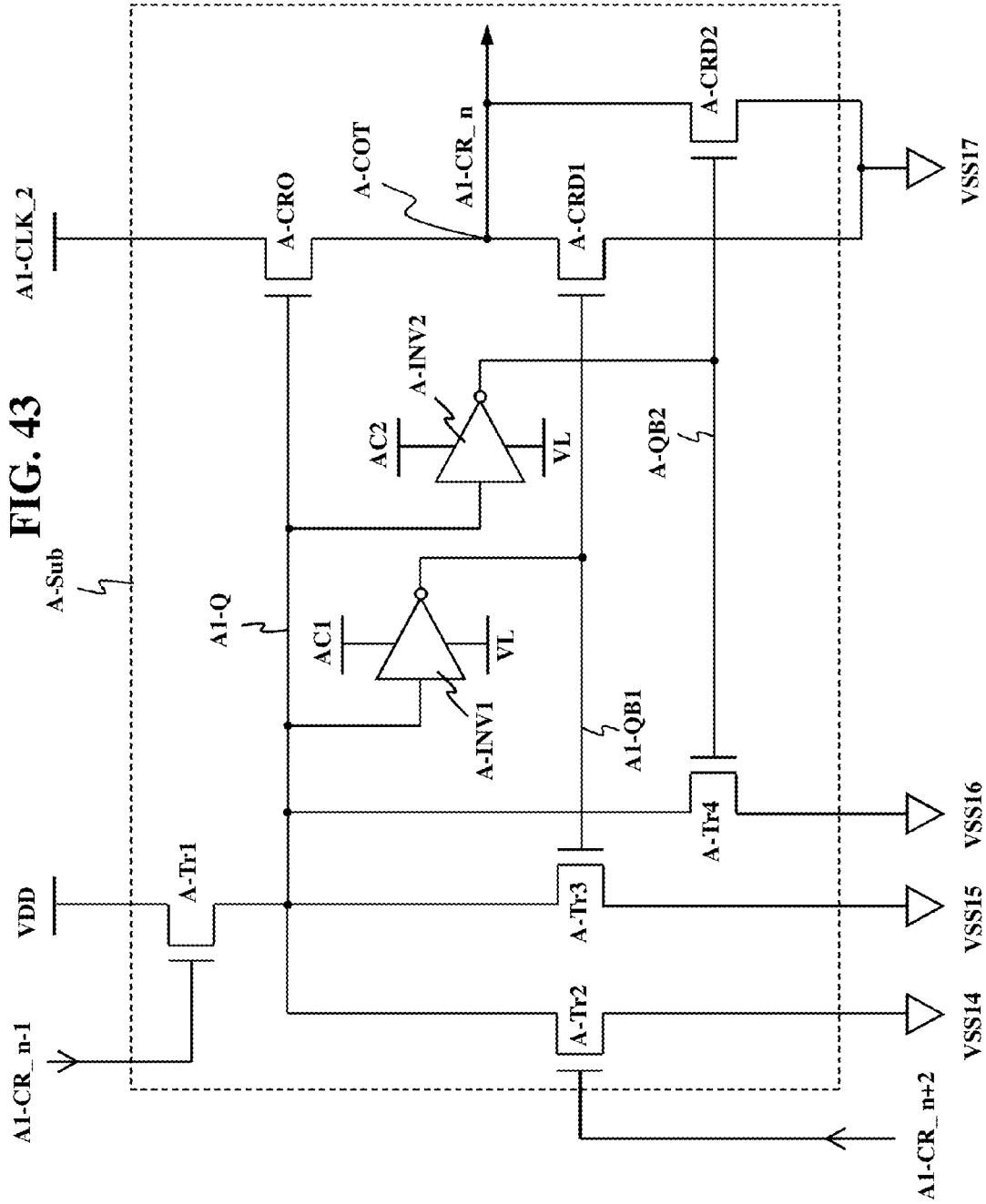
FIG. 43 is a circuit diagram of another embodiment of the A-sub-stage in the nth stage.

FIG. 43 is a circuit diagram of another embodiment of the A-sub-stage A-Sub in the nth stage.

The A-sub-stage A-Sub of the nth stage (referred to hereinafter as an nth A-sub-stage A-Sub) includes first to fourth A-switching devices A-Tr1 to A-Tr4, a first A-inverter A-INV1, a second A-inverter A-INV2, an A-carry output switching device A-CRO, a first A-carry discharge switching device A-CRD1, and a second A-carry discharge switching device A-CRD2, as shown in FIG. 43.

The first A-switching device A-Tr1 of the nth A-sub-stage A-Sub is controlled by an A-set control signal (for example, an A1-carry pulse A1-CR_n−1 from an (n−1)th A-sub-stage A-Sub) and is connected between a charging voltage line which transfers a charging voltage VDD and an A-set node A-Q. That is, the first A-switching device A-Tr1 is turned on or off in response to the A1-carry pulse A1-CR_n−1 from the (n−1)th A-sub-stage A-Sub, and interconnects the charging voltage line and the A-set node A-Q when turned on. Here, the charging voltage VDD is a DC voltage having a value capable of turning on corresponding switching devices.

Exceptionally, because there is no stage upstream of the first stage which operates earliest among all stages in one frame period T_F, the A-sub-stage A-Sub of the first stage (referred to hereinafter as a first A-sub-stage A-Sub) is supplied with an A-start pulse A-Vst from a timing controller (not shown). As a result, the first A-switching device A-Tr1 of the first A-sub-stage A-Sub is supplied with the A-start pulse A-Vst instead of an upstream A1-carry pulse.

The second A-switching device A-Tr2 of the nth A-sub-stage A-Sub is controlled by an A-reset control signal (for example, an A1-carry pulse A1-CR_n+2 from an (n+2)th A-sub-stage A-Sub) and is connected between the A-set node A-Q and a fourteenth discharging voltage line which transfers a fourteenth discharging voltage VSS14. That is, the second A-switching device A-Tr2 is turned on or off in response to the A1-carry pulse A1-CR_n+2 from the (n+2)th A-sub-stage A-Sub, and interconnects the A-set node A-Q and the fourteenth discharging voltage line when turned on.

The third A-switching device A-Tr3 of the nth A-sub-stage A-Sub is controlled by a voltage at a first A-reset node A-QB1 and is connected between the A-set node A-Q and a fifteenth discharging voltage line which transfers a fifteenth discharging voltage VSS15. That is, the third A-switching device A-Tr3 is turned on or off in response to the voltage at the first A-reset node A-QB1, and interconnects the A-set node A-Q and the fifteenth discharging voltage line when turned on.

The fourth A-switching device A-Tr4 of the nth A-sub-stage A-Sub is controlled by a voltage at a second A-reset node A-QB2 and is connected between the A-set node A-Q and a sixteenth discharging voltage line which transfers a sixteenth discharging voltage VSS16. That is, the fourth A-switching device A-Tr4 is turned on or off in response to the voltage at the second A-reset node A-QB2, and interconnects the A-set node A-Q and the sixteenth discharging voltage line when turned on.

The first A-inverter A-INV1 of the nth A-sub-stage A-Sub controls the voltage at the first A-reset node A-QB1 based on a voltage at the A-set node A-Q such that the voltage at the A-set node A-Q and the voltage at the first A-reset node A-QB1 have opposite logics. In detail, when the voltage at the A-set node A-Q is logic high, the first A-inverter A-INV1 applies a low voltage VL to the first A-reset node A-QB1 to discharge the first A-reset node A-QB1. In contrast, when the voltage at the A-set node A-Q is logic low, the first A-inverter A-INV1 applies a first AC voltage AC1 to the first A-reset node A-QB1.

The second A-inverter A-INV2 of the nth A-sub-stage A-Sub controls the voltage at the second A-reset node A-QB2 based on the voltage at the A-set node A-Q such that the voltage at the A-set node A-Q and the voltage at the second A-reset node A-QB2 have opposite logics. In detail, when the voltage at the A-set node A-Q is logic high, the second A-inverter A-INV2 applies the low voltage VL to the second A-reset node A-QB2 to discharge the second A-reset node A-QB2. In contrast, when the voltage at the A-set node A-Q is logic low, the second A-inverter A-INV2 applies a second AC voltage AC2 to the second A-reset node A-QB2.

Here, each of the first AC voltage AC1 and second AC voltage AC2 is an AC signal which alternately has a high voltage VH and the low voltage VL at intervals of f frames (where f is a natural number). The first AC voltage AC1 is 180° phase-inverted with respect to the second AC voltage AC2. In this regard, provided that the first AC voltage AC1 is kept at the high voltage VH for a specific frame period, the second AC voltage AC2 will be kept at the low voltage VL for the same period.

The A-carry output switching device A-CRO of the nth A-sub-stage A-Sub is controlled by the voltage at the A-set node A-Q and is connected between any one A1-clock transfer line which transfers an A1-clock pulse A1-CLK_2 and an A-carry output terminal A-COT of the nth A-sub-stage A-Sub. That is, the A-carry output switching device A-CRO is turned on or off in response to the voltage at the A-set node A-Q, and interconnects the A1-clock transfer line and the A-carry output terminal A-COT when turned on.

The first A-carry discharge switching device A-CRD1 of the nth A-sub-stage A-Sub is controlled by the voltage at the first A-reset node A-QB1 and is connected between the A-carry output terminal A-COT and a seventeenth discharging voltage line which transfers a seventeenth discharging voltage VSS17. That is, the first A-carry discharge switching device A-CRD1 is turned on or off in response to the voltage at the first A-reset node A-QB1, and interconnects the A-carry output terminal A-COT and the seventeenth discharging voltage line when turned on.

The second A-carry discharge switching device A-CRD2 of the nth A-sub-stage A-Sub is controlled by the voltage at the second A-reset node A-QB2 and is connected between the A-carry output terminal A-COT and the seventeenth discharging voltage line. That is, the second A-carry discharge switching device A-CRD2 is turned on or off in response to the voltage at the second A-reset node A-QB2, and interconnects the A-carry output terminal A-COT and the seventeenth discharging voltage line when turned on.

On the other hand, the B-clock pulse B-CLK may be of two or more phases. A description will hereinafter be given of an example when the B-clock pulse B-CLK may be of two phases.

Figure 44:
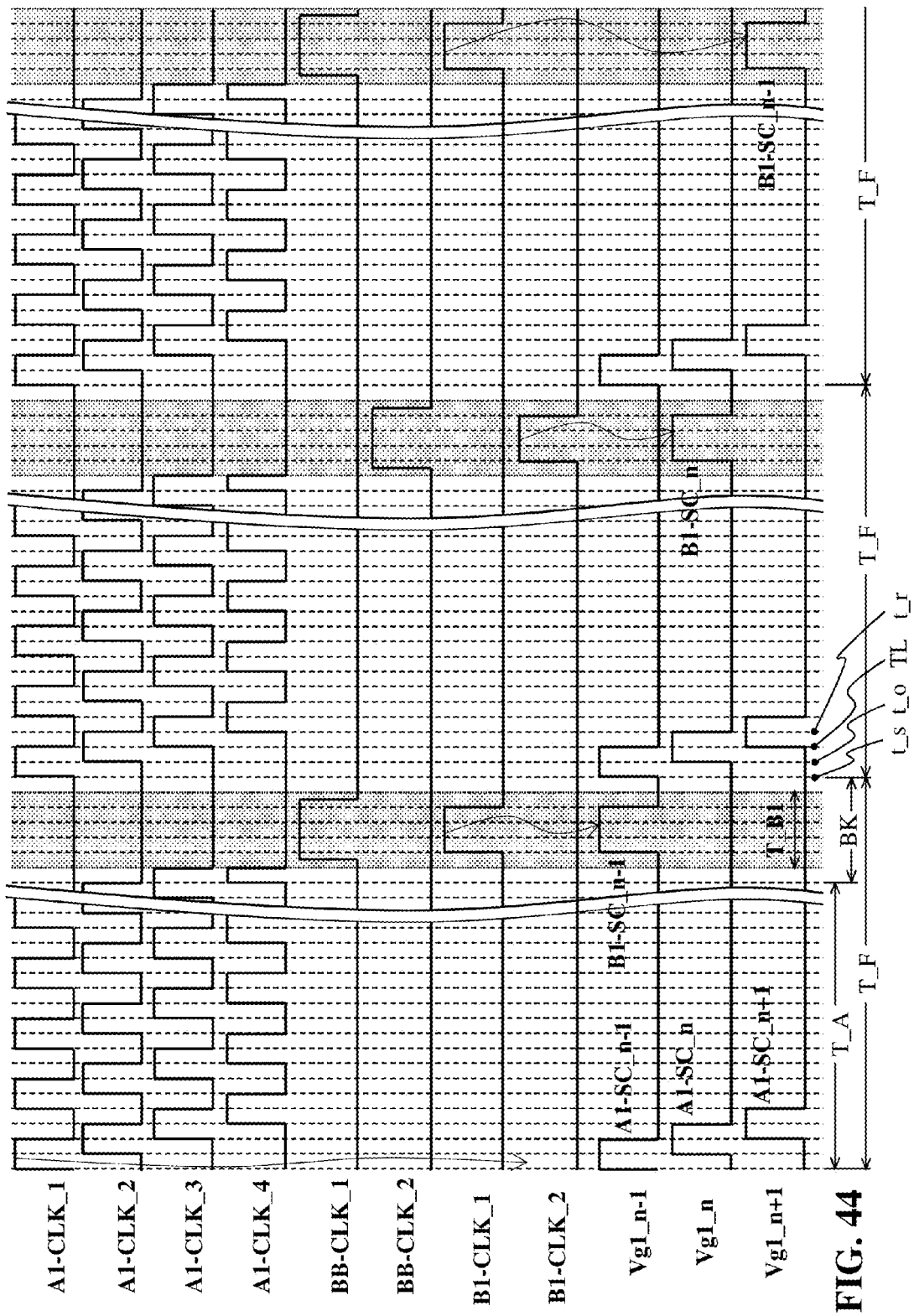
FIG. 44 is a timing diagram when a B#-clock pulse (where # is 1 or 2) is of two phases.

FIG. 44 is a timing diagram when a B#-clock pulse B#-CLK (where # is 1 or 2) is of two phases.

As shown in FIG. 44, a first B1-clock pulse B1-CLK_1 is selectively output only in an odd-numbered B1-output period T_B1, whereas a second B1-clock pulse B1-CLK_2 is selectively output only in an even-numbered B1-output period T_B1. Hence, the B1-scan pulse B1-SC is generated by the first B1-clock pulse B1-CLK_1 in the odd-numbered B1-output period T_B1, and by the second B1-clock pulse B1-CLK_2 in the even-numbered B1-output period T_B1.

On the other hand, at least one of the control switching devices provided in the scan output controller SOC may be built in at least one of the A-sub-stage A-Sub and B-sub-stage B-Sub of the corresponding stage.

The first to seventeenth discharging voltages VSS1 to VSS17 may have the same values or different values.

On the other hand, the distances between adjacent dotted lines in FIGS. 4 to 8 and FIG. 44 may be the same or different according to the respective drawings. For example, assuming that the distance between adjacent dotted lines in FIG. 4 is d1 and the distance between adjacent dotted lines in FIG. 6 is d2, d1 and d2 may be the same or different.

As is apparent from the above description, a shift register according to the present invention has effects as follows.

Firstly, a set node is bootstrapped using clock pulses, not a constant voltage, and a floating structure, so that an A-scan pulse and a B-scan pulse can be stably output even if the clock pulses have relatively low voltages.

Secondly, the stabilization of the output voltages by the bootstrapping makes it possible to prevent the output voltages from being attenuated even if the sizes of scan output switching devices are made to be relatively small. Therefore, the occupied area of a display device is minimized, which is advantageous to reducing the size of the display device.

Thirdly, two A-scan pulses (A1-scan pulse and A2-scan pulse) are generated using nodes included in one A-stage, so that a plurality of composite pulses can be output from the one stage using only a smaller number of switching devices.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising a plurality of stages, each of the stages outputting k composite pulses (where k is a natural number greater than 1), each of the composite pulses comprising an A-scan pulse and a B-scan pulse, wherein at least one of the stages comprises:

an A-sub-stage for controlling a voltage at an A-set node and a voltage at at least one A-reset node in response to an external A-control signal and generating an A-carry pulse based on the voltage at the A-set node, the voltage at the at least one A-reset node and any one A-clock pulse;

at least one B-sub-stage for controlling a voltage at a B-set node and a voltage at at least one B-reset node in response to an external B-control signal and generating a B-carry pulse based on the voltage at the B-set node, the voltage at the at least one B-reset node and any one BB-clock pulse; and a scan output controller for generating k A-scan pulses based on at least one of the voltage at the A-set node and the A-carry pulse and k A-clock pulses, generating k B-scan pulses based on the B-carry pulse and k B-clock pulses, and outputting one of the A-scan pulses and one of the B-scan pulses corresponding to each other as a corresponding one of the composite pulses.

2. The shift register according to claim 1, wherein:

k is 2;

the k A-clock pulses are divided into a plurality of A1-clock pulses having different phases and a plurality of A2-clock pulses having different phases;

any one of the A1-clock pulses is supplied to the A-sub-stage and the scan output controller;

any one of the A2-clock pulses is supplied to the scan output controller;

the k B-clock pulses are divided into a B1-clock pulse and a B2-clock pulse;

the A-sub-stage outputs the A-carry pulse through an A-carry output terminal;

the B-sub-stage outputs the B-carry pulse through a B-carry output terminal;

the scan output controller generates an A1-scan pulse based on at least one of the voltage at the A-set node and the A-carry pulse and the A1-clock pulse supplied thereto, generates a B1-scan pulse based on the B-carry pulse and the B1-clock pulse, and outputs the A1-scan pulse and the B1-scan pulse as a first one of the composite pulses;

the scan output controller generates an A2-scan pulse based on at least one of the voltage at the A-set node and the A-carry pulse and the A2-clock pulse supplied thereto, generates a B2-scan pulse based on the B-carry pulse and the B2-clock pulse, and outputs the A2-scan pulse and the B2-scan pulse as a second one of the composite pulses; and the at least one stage outputs the first composite pulse from the scan output controller through a first scan output terminal and outputs the second composite pulse from the scan output controller through a second scan output terminal.

3. The shift register according to claim 2, wherein the scan output controller comprises:

an A1-scan output switching device controlled by the voltage at the A-set node and connected between an A1-clock transfer line, the A1-clock transfer line transferring the A1-clock pulse, and the first scan output terminal; and an A2-scan output switching device controlled by the voltage at the A-set node and connected between an A2-clock transfer line, the A2-clock transfer line transferring the A2-clock pulse, and the second scan output terminal.

4. The shift register according to claim 2, wherein the scan output controller comprises:

an A1-scan output switching device controlled by the voltage at the A-set node and connected between an A1-clock transfer line, the A1-clock transfer line transferring the A1-clock pulse, and the first scan output terminal;

an A-control switching device controlled by the voltage at the A-set node and connected between the A-set node and an A-node; and an A2-scan output switching device controlled by a voltage at the A-node and connected between an A2-clock transfer line, the A2-clock transfer line transferring the A2-clock pulse, and the second scan output terminal.

5. The shift register according to claim 2, wherein the scan output controller comprises:
   a first A-control switching device controlled by the voltage at the A-set node and connected between the A-set node and an A1-node;
   an A1-scan output switching device controlled by a voltage at the A1-node and connected between an A1-clock transfer line, the A1-clock transfer line transferring the A1-clock pulse, and the first scan output terminal;
   a second A-control switching device controlled by the voltage at the A-set node and connected between the A-set node and an A2-node; and
   an A2-scan output switching device controlled by a voltage at the A2-node and connected between an A2-clock transfer line, the A2-clock transfer line transferring the A2-clock pulse, and the second scan output terminal.

6. The shift register according to claim 2, wherein the scan output controller comprises:
   an A1-scan output switching device controlled by the voltage at the A-set node and connected between an A1-clock transfer line, the A1-clock transfer line transferring the A1-clock pulse, and the first scan output terminal;
   an A-control switching device controlled by the A-carry pulse and connected between the A-carry output terminal and an A-node; and
   an A2-scan output switching device controlled by a voltage at the A-node and connected between an A2-clock transfer line, the A2-clock transfer line transferring the A2-clock pulse, and the second scan output terminal.

7. The shift register according to claim 2, wherein the scan output controller comprises:
   a first A-control switching device controlled by the A-carry pulse and connected between the A-carry output terminal and an A1-node;
   an A1-scan output switching device controlled by a voltage at the A1-node and connected between an A1-clock transfer line, the A1-clock transfer line transferring the A1-clock pulse, and the first scan output terminal;
   a second A-control switching device controlled by the A-carry pulse and connected between the A-carry output terminal and an A2-node; and
   an A2-scan output switching device controlled by a voltage at the A2-node and connected between an A2-clock transfer line, the A2-clock transfer line transferring the A2-clock pulse, and the second scan output terminal.

8. The shift register according to any one of claims 3 to 7, wherein the scan output controller further comprises:
   an A1-scan discharge switching device controlled by the voltage at the A-reset node and connected between the first scan output terminal and a first discharging voltage line, the first discharging voltage line transferring a first discharging voltage; and
   an A2-scan discharge switching device controlled by the voltage at the A-reset node and connected between the second scan output terminal and a second discharging voltage line, the second discharging voltage line transferring a second discharging voltage.

9. The shift register according to claim 2, wherein the scan output controller comprises:

a B1-scan output switching device controlled by the B-carry pulse and connected between a B1-clock transfer line, the B1-clock transfer line transferring the B1-clock pulse, and the first scan output terminal; and a B2-scan output switching device controlled by the B-carry pulse and connected between a B2-clock transfer line, the B2-clock transfer line transferring the B2-clock pulse, and the second scan output terminal.

10. The shift register according to claim 2, wherein the scan output controller comprises:
   a first B-control switching device controlled by an external switching control signal and connected between the B-carry output terminal and a B-node;
   a B1-scan output switching device controlled by a voltage at the B-node and connected between a B1-clock transfer line, the B1-clock transfer line transferring the B1-clock pulse, and the first scan output terminal;
   a B2-scan output switching device controlled by the voltage at the B-node and connected between a B2-clock transfer line, the B2-clock transfer line transferring the B2-clock pulse, and the second scan output terminal; and
   a second B-control switching device controlled by the voltage at the B-reset node and connected between the B-node and a third discharging voltage line, the third discharging voltage line transferring a third discharging voltage.

11. The shift register according to claim 10, wherein the switching control signal is any one of a direct current (DC) voltage and an alternating current (AC) voltage.

12. The shift register according to claim 11, wherein the AC voltage is output synchronously with the BB-clock pulse and has a pulse width equal to or different from that of the BB-clock pulse.

13. The shift register according to claim 2, wherein the scan output controller comprises:
   a first B-control switching device controlled by the B-carry pulse and connected between the B-carry output terminal and a B-node;
   a B1-scan output switching device controlled by a voltage at the B-node and connected between a B1-clock transfer line, the B1-clock transfer line transferring the B1-clock pulse, and the first scan output terminal;
   a B2-scan output switching device controlled by the voltage at the B-node and connected between a B2-clock transfer line, the B2-clock transfer line transferring the B2-clock pulse, and the second scan output terminal; and
   a second B-control switching device controlled by the voltage at the B-reset node and connected between the B-node and a third discharging voltage line, the third discharging voltage line transferring a third discharging voltage.

14. The shift register according to claim 2, wherein the scan output controller comprises:
   a first B-control switching device controlled by the B-carry pulse and connected between the B-carry output terminal and a B1-node;
   a B1-scan output switching device controlled by a voltage at the B1-node and connected between a B1-clock transfer line, the B1-clock transfer line transferring the B1-clock pulse, and the first scan output terminal;
   a second B-control switching device controlled by the B-carry pulse and connected between the B-carry output terminal and a B2-node;
   a B2-scan output switching device controlled by a voltage at the B2-node and connected between a B2-clock transfer line, the B2-clock transfer line transferring the B2-clock pulse, and the second scan output terminal;
a third B-control switching device controlled by the voltage at the B-reset node and connected between the B1-node and a third discharging voltage line, the third discharging voltage line transferring a third discharging voltage; and
a fourth B-control switching device controlled by the voltage at the B-reset node and connected between the B2-node and a fourth discharging voltage line, the fourth discharging voltage line transferring a fourth discharging voltage.

15. The shift register according to any one of claims 9, 10, 13 and 14, wherein the scan output controller further comprises at least one of:
a third A1-control switching device controlled by any one of the B-carry pulse, the BB-clock pulse, a voltage applied to a gate electrode of the B1-scan output switching device, the B1-clock pulse and a voltage at the first scan output terminal and connected between the A-reset node and a fifth discharging voltage line, the fifth discharging voltage line transferring a fifth discharging voltage; and
a third A2-control switching device controlled by any one of the B-carry pulse, the BB-clock pulse, a voltage applied to a gate electrode of the B2-scan output switching device, the B2-clock pulse and a voltage at the second scan output terminal and connected between the A-reset node and the fifth discharging voltage line.

16. The shift register according to any one of claims 9, 10, 13 and 14, wherein the scan output controller further comprises:
an A1-scan output switching device directly or indirectly controlled by the voltage at the A-set node and connected between an A1-clock transfer line, the A1-clock transfer line transferring the A1-clock pulse, and the first scan output terminal;
an A2-scan output switching device directly or indirectly controlled by the voltage at the A-set node and connected between an A2-clock transfer line, the A2-clock transfer line transferring the A2-clock pulse, and the second scan output terminal; and
at least one of:
a fourth A1-control switching device controlled by any one of the B-carry pulse, the BB-clock pulse, a voltage applied to a gate electrode of the B1-scan output switching device and the B1-clock pulse and connected between a gate electrode of the A1-scan output switching device and a sixth discharging voltage line, the sixth discharging voltage line transferring a sixth discharging voltage; and
a fourth A2-control switching device controlled by any one of the B-carry pulse, the BB-clock pulse, a voltage applied to a gate electrode of the B2-scan output switching device and the B2-clock pulse and connected between a gate electrode of the A2-scan output switching device and the sixth discharging voltage line.

17. The shift register according to claim 2, wherein the scan output controller comprises an A1-scan output switching device directly or indirectly controlled by the voltage at the A-set node and connected between an A1-clock transfer line, the A1-clock transfer line transferring the A1-clock pulse, and the first scan output terminal, an A2-scan output switching device directly or indirectly controlled by the voltage at the A-set node and connected between an A2-clock transfer line, the A2-clock transfer line transferring the A2-clock pulse, and the second scan output terminal, a B1-scan output switching device directly or indirectly controlled by the B-carry pulse and connected between a B1-clock transfer line, the B1-clock transfer line transferring the B1-clock pulse, and the first scan output terminal,
wherein the scan output controller further comprises at least one of:
a fifth B1-control switching device controlled by the A-carry pulse and connected between a gate electrode of the B1-scan output switching device and a seventh discharging voltage line, the seventh discharging voltage line transferring a seventh discharging voltage;
a sixth B1-control switching device controlled by a voltage applied to a gate electrode of the A1-scan output switching device and connected between the gate electrode of the B1-scan output switching device and an eighth discharging voltage line, the eighth discharging voltage line transferring an eighth discharging voltage;
a seventh B1-control switching device controlled by an external A-start pulse and connected between the gate electrode of the B1-scan output switching device and a ninth discharging voltage line, the ninth discharging voltage line transferring a ninth discharging voltage;
a fifth B2-control switching device controlled by the A-carry pulse and connected between a gate electrode of the B2-scan output switching device and the seventh discharging voltage line;
a sixth B2-control switching device controlled by a voltage applied to a gate electrode of the A2-scan output switching device and connected between the gate electrode of the B2-scan output switching device and the eighth discharging voltage line; and
a seventh B2-control switching device controlled by the external A-start pulse and connected between the gate electrode of the B2-scan output switching device and the ninth discharging voltage line.

18. The shift register according to claim 2, wherein:
the A1-clock pulse is of two or more phases;
the A2-clock pulse is of two or more phases;
the BB-clock pulse is of two or more phases;
the B1-clock pulse is of one or more phases; and
the B2-clock pulse is of one or more phases,
wherein the BB-clock pulse has a period longer than each of the A1-clock pulse and A2-clock pulse,
wherein the A1-clock pulse, the A2-clock pulse, the BB-clock pulse, the B1-clock pulse and the B2-clock pulse have the same pulse widths or at least two of the A1-clock pulse, the A2-clock pulse, the BB-clock pulse, the B1-clock pulse and the B2-clock pulse have different pulse widths.

19. The shift register according to claim 16, wherein the A1-clock pulse and the A2-clock pulse are kept low while the BB-clock pulse is kept high.

20. The shift register according to claim 2, wherein the external A-control signal comprises an A-set control signal and an A-reset control signal,
wherein the A-sub-stage of the at least one stage comprises:
a first A-switching device controlled by the A-set control signal and connected between a charging voltage line, the charging voltage line transferring a charging voltage, and the A-set node;
a second A-switching device controlled by the A-reset control signal and connected between the A-set node and a tenth discharging voltage line, the tenth discharging voltage line transferring a tenth discharging voltage;

an A-inverter for controlling the voltage at the A-reset node based on the voltage at the A-set node such that the voltage at the A-set node and the voltage at the A-reset node have opposite logics;

an A-carry output switching device controlled by the voltage at the A-set node and connected between an A1-clock transfer line, the A1-clock transfer line transferring the A1-clock pulse, and the A-carry output terminal; and an A-carry discharge switching device controlled by the voltage at the A-reset node and connected between the A-carry output terminal and an eleventh discharging voltage line, the eleventh discharging voltage line transferring an eleventh discharging voltage.

21. The shift register according to claim 20, wherein the A-inverter comprises:
   a first A-inverting switching device controlled by a high voltage from a high voltage line and connected between the high voltage line and the A-reset node; and
   a second A-inverting switching device controlled by the voltage at the A-set node and connected between the A-reset node and a low voltage line, the low voltage line transferring a low voltage.

22. The shift register according to claim 20, wherein the A-inverter comprises:
   a first A-inverting switching device controlled by an external control signal and connected between a high voltage line, the high voltage line transferring a high voltage, and the A-reset node; and
   a second A-inverting switching device controlled by the voltage at the A-set node and connected between the A-reset node and a low voltage line, the low voltage line transferring a low voltage.

23. The shift register according to claim 20, wherein the A-inverter comprises:
   a first A-inverting switching device controlled by an external control signal and connected between a high voltage line, the high voltage line transferring a high voltage, and an A-common node;
   a second A-inverting switching device controlled by the voltage at the A-set node and connected between the A-common node and a low voltage line, the low voltage line transferring a low voltage;
   a third A-inverting switching device controlled by a voltage at the A-common node and connected between the high voltage line and the A-reset node; and
   a fourth A-inverting switching device controlled by the voltage at the A-set node and connected between the A-reset node and the low voltage line.

24. The shift register according to claim 20, wherein the A-inverter comprises:
   a first A-inverting switching device controlled by a high voltage from a high voltage line and connected between the high voltage line and an A-common node;
   a second A-inverting switching device controlled by the voltage at the A-set node and connected between the A-common node and a low voltage line, the low voltage line transferring a low voltage;
   a third A-inverting switching device controlled by a voltage at the A-common node and connected between the high voltage line and the A-reset node; and
   a fourth A-inverting switching device controlled by the voltage at the A-set node and connected between the A-reset node and the low voltage line.

25. The shift register according to claim 20, wherein the A-inverter comprises:
   a first A-inverting switching device controlled by the voltage at the A-set node and connected between the A-reset node and a low voltage line, the low voltage line transferring a low voltage;
   a second A-inverting switching device controlled by the voltage at the A-reset node and connected between the A-set node and the first scan output terminal or between the A-set node and the A-carry output terminal; and
   an A-capacitor connected between an A-clock transfer line and the A-reset node.

26. The shift register according to any one of claims 21 to 25, wherein the A-inverter further comprises at least one of:
   a fifth A-inverting switching device controlled by the A-set control signal and connected between the A-reset node and the low voltage line;
   a sixth A-inverting switching device controlled by the voltage at the A-reset node and connected between the A-set node and the low voltage line;
   a seventh A-inverting switching device controlled by the A-clock pulse from the A-clock transfer line and connected between an output terminal, the output terminal outputting the A-set control signal, and the A-set node; and
   an eighth A-inverting switching device controlled by the voltage at the A-reset node and connected between the A-set node and a terminal,
   wherein the terminal is any one of the first scan output terminal, the second scan output terminal, the A1-clock transfer line and an A2-clock transfer line.

27. The shift register according to claim 23 or 24, wherein the A-inverter further comprises a ninth A-inverting switching device controlled by any one of the B-carry pulse and a voltage applied to a gate electrode of a B1-scan output switching device of the scan output controller and connected between the A-common node and the low voltage line.

28. The shift register according to claim 20, wherein:
   the A-set control signal is an A-start pulse, or an A-carry pulse output from any one of stages operating earlier than the at least one stage, among the plurality of stages; and
   the A-reset control signal is an A-carry pulse or A-scan pulse output from any one of stages operating later than the at least one stage, among the plurality of stages.

29. The shift register according to claim 2, wherein the external B-control signal comprises a B-set control signal and a B-reset control signal,
   wherein the B-sub-stage of the at least one stage comprises:
   a first B-switching device controlled by the B-set control signal and connected between a charging voltage line, the charging voltage line transferring a charging voltage, and the B-set node;
   a second B-switching device controlled by the B-reset control signal and connected between the B-set node and a twelfth discharging voltage line, the twelfth discharging voltage line transferring a twelfth discharging voltage;
   a B-inverter for controlling the voltage at the B-reset node based on the voltage at the B-set node such that the voltage at the B-set node and the voltage at the B-reset node have opposite logics;
   a B-carry output switching device controlled by the voltage at the B-set node and connected between a B-clock transfer line, the B-clock transfer line transferring the B-clock pulse, and the B-carry output terminal; and
   a B-carry discharge switching device controlled by the voltage at the B-reset node and connected between the B-carry output terminal and a thirteenth discharging voltage line, the thirteenth discharging voltage line transferring a thirteenth discharging voltage.

30. The shift register according to claim 29, wherein the B-sub-stage further comprises a third B-switching device controlled by the voltage at the B-set node and connected between a control transfer line, the control transfer line transferring an external switching control signal, and the B-set node.

31. The shift register according to claim 29, wherein:
the B-set control signal is a B-start pulse, or a B-carry pulse output from any one of stages operating earlier than the at least one stage, among the plurality of stages; and
the B-reset control signal is a B-carry pulse output from any one of stages operating later than the at least one stage, among the plurality of stages.

32. The shift register according to claim 1, wherein:
k is 2;
the at least one B-sub-stage comprises two B-stages, one being a B1-sub-stage and the other being a B2-sub-stage,
the k A-clock pulses are divided into a plurality of A1-clock pulses having different phases and a plurality of A2-clock pulses having different phases;
any one of the A1-clock pulses is supplied to the A-sub-stage and the scan output controller;
any one of the A2-clock pulses is supplied to the scan output controller;
the k B-clock pulses are divided into a B1-clock pulse and a B2-clock pulse;
the B-carry pulse is divided into a B1-carry pulse and a B2-carry pulse;
the A-sub-stage outputs the A-carry pulse through an A-carry output terminal;
the B1-sub-stage outputs the B1-carry pulse through a B1-carry output terminal;
the B2-sub-stage outputs the B2-carry pulse through a B2-carry output terminal;
the scan output controller generates an A1-scan pulse based on at least one of the voltage at the A-set node and the A-carry pulse and the A1-clock pulse supplied thereto, generates a B1-scan pulse based on one of the B1-carry pulse and the B2-carry pulse and the B1-clock pulse, and outputs the A1-scan pulse and the B1-scan pulse as a first one of the composite pulses;
the scan output controller generates an A2-scan pulse based on at least one of the voltage at the A-set node and the A-carry pulse and the A2-clock pulse supplied thereto, generates a B2-scan pulse based on one of the B1-carry pulse and the B2-carry pulse and the B2-clock pulse, and outputs the A2-scan pulse and the B2-scan pulse as a second one of the composite pulses; and
the at least one stage outputs the first composite pulse from the scan output controller through a first scan output terminal and outputs the second composite pulse from the scan output controller through a second scan output terminal.

33. The shift register according to claim 32, wherein the scan output controller comprises:
a B1-scan output switching device controlled by the B1-carry pulse and connected between a B1-clock transfer line, the B1-clock transfer line transferring the B1-clock pulse, and the first scan output terminal; and
a B2-scan output switching device controlled by the B2-carry pulse and connected between a B2-clock transfer line, the B2-clock transfer line transferring the B2-clock pulse, and the second scan output terminal.

34. The shift register according to claim 32, wherein the scan output controller comprises:
a first B1-control switching device controlled by an external switching control signal and connected between the B1-carry output terminal and a B1-node;
a B1-scan output switching device controlled by a voltage at the B1-node and connected between a B1-clock transfer line, the B1-clock transfer line transferring the B1-clock pulse, and the first scan output terminal;
a first B2-control switching device controlled by the switching control signal and connected between the B2-carry output terminal and a B2-node; and
a B2-scan output switching device controlled by a voltage at the B2-node and connected between a B2-clock transfer line, the B2-clock transfer line transferring the B2-clock pulse, and the second scan output terminal.

35. The shift register according to claim 34, wherein the scan output controller further comprises:
a second B1-control switching device controlled by the voltage of one of the at least one B-reset node and connected between the B1-node and a first discharging voltage line, the first discharging voltage line transferring a first discharging voltage; and
a second B2-control switching device controlled by the voltage of another one of the least one B-reset node and connected between the B2-node and the first discharging voltage line.

36. The shift register according to claim 32, wherein the scan output controller comprises:
a first B1-control switching device controlled by the B1-carry pulse and connected between the B1-carry output terminal and a B1-node;
a B1-scan output switching device controlled by a voltage at the B1-node and connected between a B1-clock transfer line, the B1-clock transfer line transferring the B1-clock pulse, and the first scan output terminal;
a second B1-control switching device controlled by the voltage of one of the at least one B-reset node and connected between the B1-node and a third discharging voltage line, the third discharging voltage line transferring a third discharging voltage;
a first B2-control switching device controlled by the B2-carry pulse and connected between the B2-carry output terminal and a B2-node;
a B2-scan output switching device controlled by a voltage at the B2-node and connected between a B2-clock transfer line, the B2-clock transfer line transferring the B2-clock pulse, and the second scan output terminal; and
a second B2-control switching device controlled by the voltage of another one of the least one B-reset node and connected between the B2-node and the third discharging voltage line.

37. The shift register according to any one of claims 33, 34 and 36, wherein the scan output controller further comprises at least one of:
a third A11-control switching device controlled by any one of the B1-carry pulse, the BB-clock pulse, a voltage applied to a gate electrode of the B1-scan output switching device, the B1-clock pulse and a voltage at the first scan output terminal and connected between the A-reset node and a fifth discharging voltage line, the fifth discharging voltage line transferring a fifth discharging voltage; and
a third A22-control switching device controlled by any one of the B2-carry pulse, the BB-clock pulse, a voltage applied to a gate electrode of the B2-scan output switching device, the B2-clock pulse and a voltage at the second scan output terminal and connected between the A-reset node and the fifth discharging voltage line.

38. The shift register according to any one of claims 33, 34 and 36, wherein the scan output controller further comprises:
- an A1-scan output switching device directly or indirectly controlled by the voltage at the A-set node and connected between an A1-clock transfer line, the A1-clock transfer line transferring the A1-clock pulse, and the first scan output terminal;
- an A1-scan output switching device directly or indirectly controlled by the voltage at the A-set node and connected between an A2-clock transfer line, the A2-clock transfer line transferring the A2-clock pulse, and the second scan output terminal; and
- at least one of:
- a fourth A11-control switching device controlled by any one of the B1-carry pulse, the BB-clock pulse, a voltage applied to a gate electrode of the B1-scan output switching device and the B1-clock pulse and connected between a gate electrode of the A1-scan output switching device and a sixth discharging voltage line, the sixth discharging voltage line transferring a sixth discharging voltage; and
- a fourth A22-control switching device controlled by any one of the B2-carry pulse, the BB-clock pulse, a voltage applied to a gate electrode of the B2-scan output switching device and the B2-clock pulse and connected between a gate electrode of the A2-scan output switching device and the sixth discharging voltage line.

* * * * *